US006108238A

United States Patent [19]
Nakamura et al.

[11] Patent Number: 6,108,238
[45] Date of Patent: Aug. 22, 2000

[54] PROGRAMMABLE SEMICONDUCTOR MEMORY DEVICE HAVING PROGRAM VOLTAGES AND VERIFY VOLTAGES

[75] Inventors: Hiroshi Nakamura, Kawasaki; Kazushi Akita; Takeaki Sato, both of Yokohama, all of Japan

[73] Assignee: Kabushiki Kaisha Toshiba, Kawasaki, Japan

[21] Appl. No.: 09/152,069

[22] Filed: Sep. 11, 1998

[30] Foreign Application Priority Data

Sep. 11, 1997 [JP] Japan ................................. 9-246926
Sep. 26, 1997 [JP] Japan ................................. 9-262377

[51] Int. Cl.$^7$ ................................................ G11C 16/06
[52] U.S. Cl. ............................ 365/185.22; 365/185.17; 365/185.19; 365/185.29
[58] Field of Search .................. 365/185.22, 185.19, 365/185.28, 185.17, 185.01

[56] References Cited

U.S. PATENT DOCUMENTS 5,768,190  6/1998  Tanaka et al. ..................... 365/185.22
5,768,191  6/1998  Choi et al. ......................... 365/185.22
5,801,989  9/1998  Lee et al. ........................... 365/185.22

*Primary Examiner*—David Nelms
*Assistant Examiner*—Hoai V. Ho
*Attorney, Agent, or Firm*—Banner & Witcoff, Ltd.

[57] ABSTRACT

The nonvolatile semiconductor memory device comprises a memory cell array in which memory cell units having one or more reprogrammable nonvolatile memory cells are arranged in an array, a word line commonly connected to a same row of the one or more memory cells of the memory cell array, a data line commonly connected to a same column of the memory cell units of the memory cell array, sequence control section for controlling a sequence operation which reprograms data of the selected memory cell by a first operation for applying the voltage to reprogram data of the selected memory cell, and a second operation for verifying reprogrammed state of data to memory cell to which the voltage is applied, and voltage application section for applying to the first voltage higher than a power supply voltage to the word line corresponding to the memory cell to be data reprogrammed in the first period which is corresponds to at least partial period during a period of the first operation, in which in a second period corresponding to at least a part in periods which excludes the first period during the sequence operation, a setting voltage of the level of the first voltage is set to the voltage different from a setting voltage of a voltage level in the first period.

29 Claims, 51 Drawing Sheets

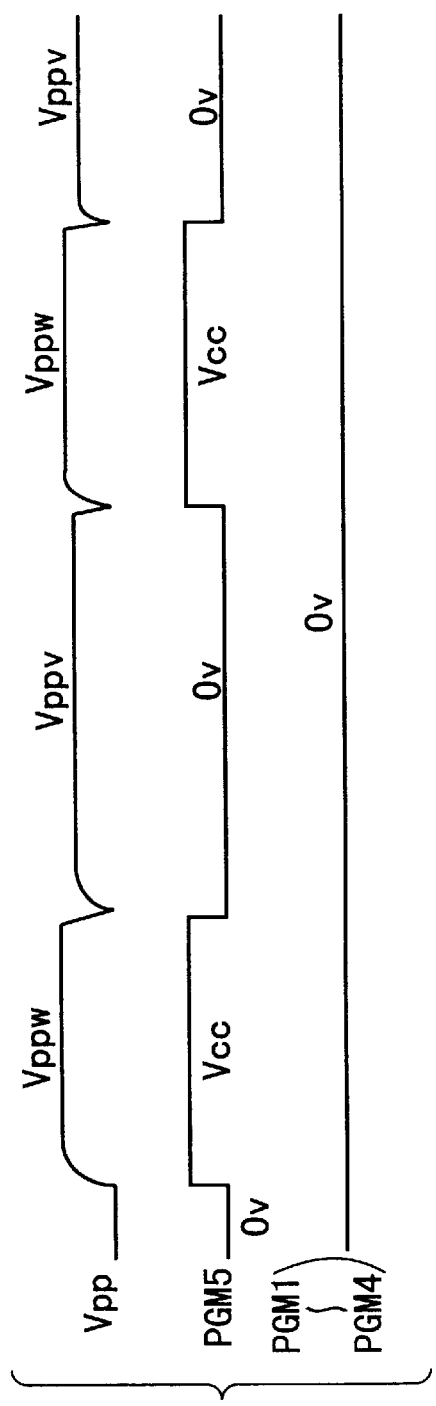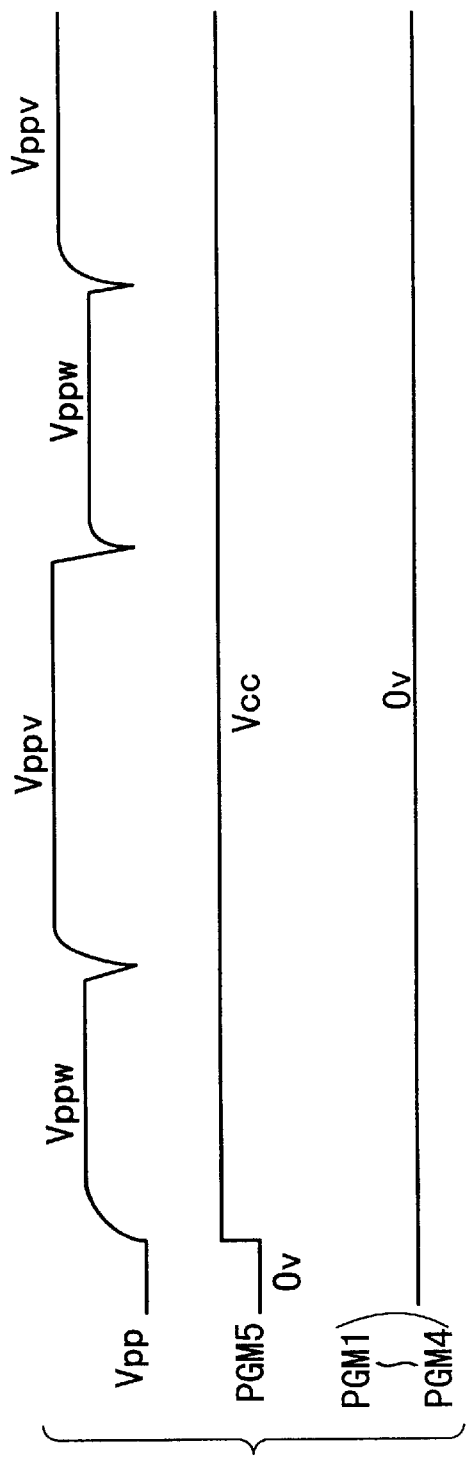
FIG. 17
FIG. 18 (PRIOR ART)

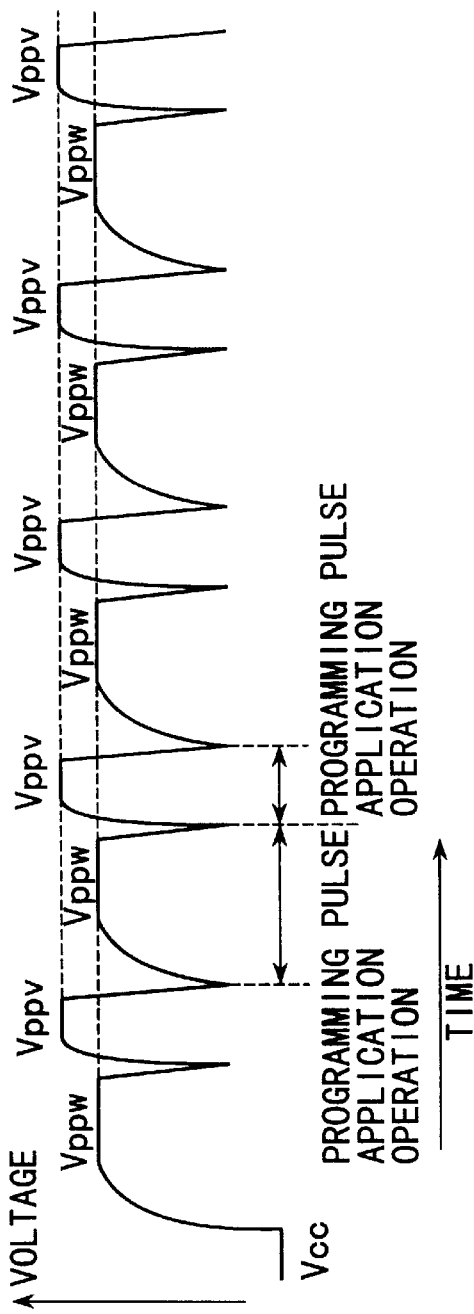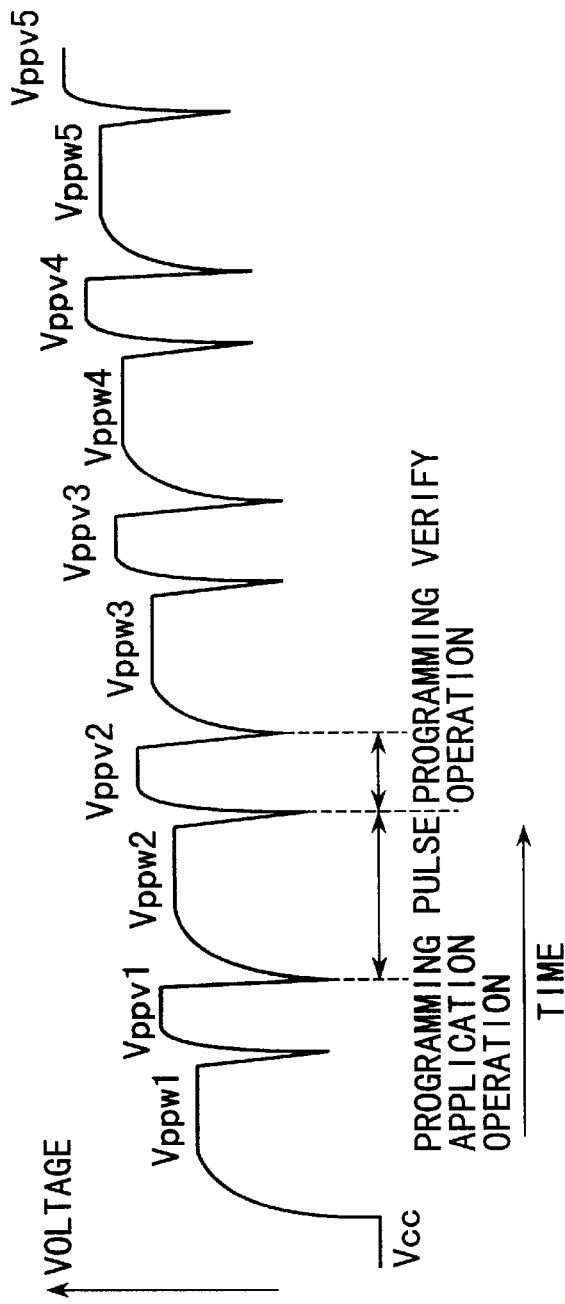
FIG. 20A
FIG. 20B

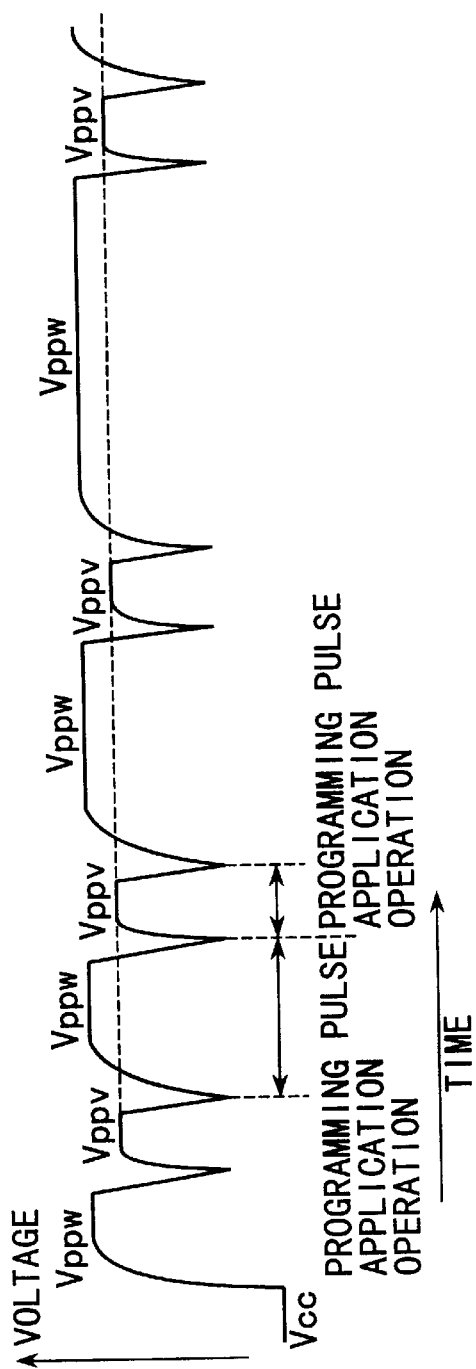
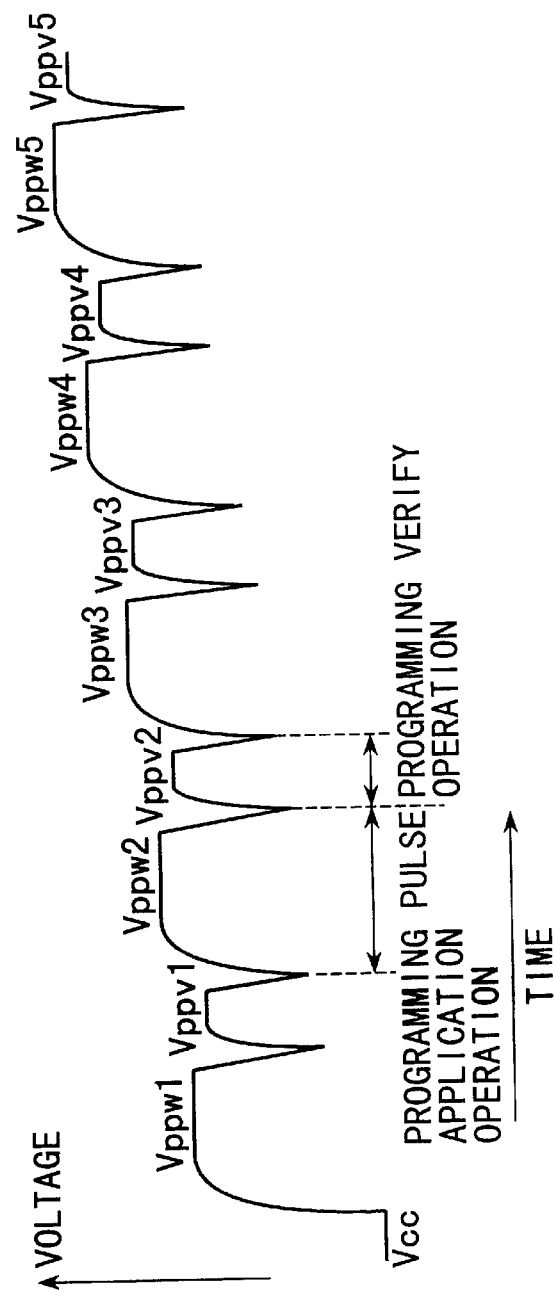
FIG. 21A
FIG. 21B

PROGRAMMABLE SEMICONDUCTOR MEMORY DEVICE HAVING PROGRAM VOLTAGES AND VERIFY VOLTAGES

BACKGROUND OF THE INVENTION

The present invention relates to a nonvolatile semiconductor memory device, especially, relates to a high voltage generating circuit used for data programming and erasure, e.g., a high voltage used for the nonvolatile semiconductor memory, such as NAND-cell, AND cell, DINOR cell-type EEPROM. The present invention also relates to a nonvolatile semiconductor memory device especially improving the data reprogramming.

Conventionally, an electrically reprogrammable EEPROM is known as one of the semiconductor memory devices, and an EEPROM of the NAND-cell type which employs an array of cell blocks (NAND-cells) in which a plurality of memory cells are connected in series as high integrated ones is remarkable.

In NAND-cell type EEPROM, one memory cell has a FETMOS structure in which a floating gate (charge storage layer) and a control gate are layered through an insulation film on a semiconductor substrate in which a source-drain region is formed.

A NAND-cell is constituted by connecting adjacent ones of a plurality of memory cells in series and sharing the source and drain by adjacent ones. A drain at the one end side of the NAND-cell is connected to a bitline through a select gate transistor and a source at another end side thereof is connected to a common source line through a select gate transistor like the drain.

A cell array of the EEPROM is constituted by arranging a plurality of such NAND-cells in a matrix form. In this case, each bitline is arranged in the column direction, and the control gate of each memory cell transistor is continuously arranged in a row direction and becomes a control gate line (word line), and the gate of each select gate transistor is continuously arranged in a row direction and becomes a select gate line.

Usually, the memory cell array is provided in the p-well on an n-type silicon substrate or in a p-well in the n-well on the p-type silicon substrate. Each NAND-cell in the memory cell array is formed in a region surrounded with the element isolation insulation film. Also, a peripheral circuit is provided in the other p-well from the memory cell array.

The cell transistors have threshold voltages according to the data held by respective cell transistors. In case of the NAND-type flash memory, usually, it defines an erased state is a state that the cell transistor is an enhancement type (E-type), a programmed state is a state that the cell transistor is a depletion type (D-type).

To shift the threshold voltage of the cell transistor of the erased state to the positive direction is called as "programming operation", to shift the threshold voltage of the cell transistor of the programmed state to the negative direction is called as "erase operation".

Next, an example of the conventional data programming, erase, and data read operation to such NAND-cell will be explained.

The data programming to the NAND-cell is performed in order from the cell transistor which is far from the connection portion of the bitline and the select transistor (i.e., bitline contact portion). A case the cell transistor is, for example, an n-channel will be explained. A reference voltage of 0V or the programming unselected voltage (e.g., power supply voltage Vcc) is applied to the bitline according to the data programming (shifting the threshold voltage of the cell transistor) or the unprogramming (not shifting the threshold voltage of the cell transistor).

The programming voltage Vppw (about 20V) which is boosted capable of obtaining the necessary electric field to shift the threshold voltage of the cell is applied to the control gate of the selected cell transistor. The necessary intermediate voltage VmW (substantially intermediate voltage between programming voltage Vpp and the ground voltage, about 10V) to transfer the bitline voltage to the selected cell transistor without shifting the threshold voltage of the cell is applied to the control gate of the unselected cell transistor and the gate of selected gate transistor arranged at bitline contact side from the selected cell transistor.

Thereby, in the selected cell transistor, since the applied voltage to the bitline is transferred to the drain and electrons are injected into the floating gate when the applied voltage of the bitline is 0V, the threshold voltage moves to the positive direction. On the other hand, when the applied voltage of the bitline is Vcc, the threshold voltage does not change and is maintained at negative state since electrons are not injected into the floating gate.

In this example, a former state in which the threshold voltage is positive is called "1" data, and a latter state in which the threshold voltage is negative is called "0" data.

The erasure of the data to the NAND-cell is performed at the same time to all cell transistors in the selected NAND-cell block. That is, the voltage 0V is applied to the control gates of all cell transistors in the selected NAND-cell, and the boosted erase voltage (e.g., the same voltage as the programming voltage Vppw) which is necessary to erase cell data, is applied to the p-well (or p-type substrate), and the control gates of all cell transistors in the unselected NAND-cells.

At this time, the erase voltage which is the same voltage as the p-well, is applied to the bitline (or, the bitline is in an open state). The voltage (for example, the erase voltage being the same voltage as the p-well voltage) without destroying the gate of the select gate transistor is applied to all select gate lines. The erase voltage which is the same voltage as the p-well is applied to the common source line (or, the common source line is in an open state).

Electrons in the floating gate are discharged to the p-well through the gate insulation film in all cell transistors in the selected NAND-cell and the threshold voltage moves to the negative direction.

The data read of the NAND-cell is performed as follows. The voltage 0V is applied to the control gate of the selected cell transistor and, for example, the power supply voltage Vcc or higher voltage Vh is applied to the control gates of other cell transistors and the gate of select transistor, then whether the current flows through the selected cell transistor or not, i.e., whether the potential of the precharged bitline changes or not, is detected by the sense amplifier.

In this case, when all transistors (containing a unselected cell transistor) except the selected cell transistor turn on and the selected cell transistor is in the programmed state, since this selected cell transistor becomes a non-conductive state, the voltage of the bitline does not change. When the selected cell transistor is in the erased state, since the selected cell transistor becomes a conductive state and then the bitline is discharged and the bitline voltage lowers.

In EEPROM, to obtain high-speed operation and high reliability, since it is necessary the distribution of the threshold voltage is controlled narrower ones after programming, programmed data is read for every programming (programming verify read) and is compared with data to be programmed, then programming is continued if the programming is insufficient.

The programming completes by checking if the programmed data coincides with data to be programmed.

As apparent from above explanation, in NAND-cell-type EEPROM, the unselected memory cell functions as the transfer gate in case of the programming operation and the read operation. A limitation is added to the threshold voltage of the programmed memory cell from this viewpoint. For example, the preferred range of the threshold voltage of the memory cell which "1" data is programmed becomes about 0.5 to 3.0V when the higher voltage Vh than the power supply voltage Vcc (e.g., 3.3V) is, e.g., 4.5V.

Furthermore, to consider a variation with time after data programming, a dispersion of the manufacturing parameter of the memory cell, a dispersion of the power supply voltage, and so on, it is required that the distribution of the threshold voltage of the memory cell after data programming is within the range which is narrower than 0.5–3.0V of the above ranges.

By the way, when fixing the programming voltage and the programming time of the data on the above NAND-cell type EEPROM and programming to all memory cells in the identical condition, it is difficult to make the threshold voltage of the memory cell which "1" data is programmed in a premissible range. The reason is why, for example, since the difference of the characteristic among the memory cells occurs by the dispersion of the manufacturing process, the memory cell which is easy to be programmed and the memory cell which is hard to be programmed are mixed.

A method of programming while adjusting programming time in the process of verifying (verify) programming operation (intelligent program method) to program for making the threshold voltage of each memory cell being within the desired range is proposed (Japanese Patent Application Publication No. 5-144277).

An algorithm of above programming method with verifying by controlling the programming time performed by repeating a programming pulse application operation and a programming verify operation alternately in a data programming.

FIG. 1 shows a timing chart of the programming pulse application operation and the programming verify operation in the conventional NAND-type EEPROM according to above-mentioned programming method.

In FIG. 1, a CG (selected) indicates a selected gate line in the eight control gate lines in the selected block, a CG (unselected) indicates seven control gate lines except the selected control gate line in the selected block. An SG1 indicates a select gate line connected to the gate of the select gate transistor in the selected block at the bitline contact side, and an SG2 indicates the select gate line connected to the gate of the select gate transistor at the source line side.

A Cell-p-well indicates a p-well in which a memory cell array is constituted, a Cell-Source is a source line in the memory cell array, a BL ("1" programming) is a bitline to which a voltage corresponding to "1" data programming is applied, and a BL ("0" programming) is a bitline to which a voltage corresponding to "0" data programming is applied.

A Vpp is an output node of the boosted voltage of the high-voltage generating circuit for programming, a Vm is an output node of the boosted voltage of the intermediate voltage generating circuit for programming and a Vread is an output node of the boosted voltage of the high-voltage generating circuit for read.

As shown in FIG. 1, when the programming pulse application operation starts, SG1, Cell-Source, and the "0" data programming bitline are charged to the voltage of Vcc, and next, CG (unselected) in the selected block is charged to the programming intermediate voltage Vmw (about 10V). Thereafter, CG (selected) in the selected block is charged to the programming voltage Vppw (about 20V) and this state is kept for a while. During the operation, the "1" data programming is performed from the "1" data programming bitline to the "1" data programmed cell.

Thereafter, CG (selected), CG (unselected), SG1, Cell-Source, and the "0" data programming bitline are discharged to 0V. At this time, the voltage of the Vpp node is recharged after temporarily lowering the voltage by capacitive coupling through the transistor and the PN-junction of CG (selected) and the Vpp node.

In the same way, the voltage of the Vm node is recharged after temporarily lowering the voltage by capacitive coupling through the transistor of CG (unselected) and the Vm node and the PN-junction.

Next, when the programming verify operation starts, after CG (unselected), SG1, SG2 are set to Vh (about 4.5V), and CG (selected) is set to 0.5V, the selected cell transistor is read. Thereafter, the bitline, CG (unselected), SG1, SG2 and CG (selected) are discharged to 0V and the programming verify operation is completed.

However, in the conventional operation described above, a capacitance of the Vpp node at programming high-voltage non-application to the memory cell is smaller than the capacitance of the Vpp node at programming high-voltage application to the memory cell. Therefore, limit voltages of the programming high-voltage at application or non-application are different from each other.

Accordingly, a programming high-voltage level Vppv at programming high-voltage non-application to the memory cell is higher than the programming high-voltage level Vppw at programming high-voltage application to the memory cell. Thereby, the voltage stress applied to the transistor at programming high-voltage non-application to the memory cell becomes high, and there is an disadvantage of lowering a reliability.

To remove the above voltage stress, by preventing generating the high-voltage at programming high-voltage application to the memory cell, a charging speed at programming high-voltage non-application to the memory cell is lowered, and as a result, data programming speed is lowered.

Since the numbers of the nodes to which the programming voltage is supplied from Vpp node at data programming operation is larger than at data programming verify read operation, such a disadvantage becomes important especially at data programming operation.

As is evident form above operation explanation, in NAND-cell type EEPROM, a voltage, e.g., about 10V, higher than Vcc is charged to the "0" programming bitline at data programming operation.

FIG. 2 and FIG. 3 show the operation timing of the data programming operation. FIG. 2 is a timing chart of the programming pulse application operation at a first loop and FIG. 3 is a timing chart of the programming pulse application operation of second loop or later (see the explanations in the embodiments for the detailed explanation of the operation of FIG. 2 and FIG. 3).

In the conventional data programming operation, the voltage of Cell-p-well of the p-type well rises to about 0.8V by the influence of charging the "0" data programming bitline and charging the source line during programming pulse application operation at the first loop, the charging speed of "0" data programming bitline voltage becomes slow and the charging level lowers (from 8V to [8V−ΔV]) by the leak current between the adjacent NAND-cells by an electron injection to the p-type well from the "1" data programming bitline contact section and the field inversion in the cell array. Therefore, the voltage which is higher than the original voltage (20V−8V=12V) is applied between the control gate and the drain of the memory cell to be programmed into "0" data and causes mis-programming during the programming pulse application operation at the first loop.

Where, FIG. 4A shows the state of the electron injection to the p-type well from the "1" data programming bitline contact section. FIG. 4B shows the state of the leak current between the adjacent NAND-cells by the field inversion in the cell array. In the figure, a numeral reference 11 indicates a p-type well, a numeral reference 12 indicates a element isolation oxide film, a numeral reference 14 indicates a floating gate, a numeral reference 16 indicates a control gate, a numeral reference 18 indicates a bitline and a numeral reference 19 indicates a n-type diffusion layer.

As described above, in the conventional EEPROM such as NAND-cell type, a high-voltage level Vppv for programming at high voltage non-application for programming to the memory cell becomes high more than necessary, a voltage stress to the transistor becomes large. As a result, the reliability lowers.

Since the Cell-p-well voltage rises during programming pulse application operation at a first loop in the conventional NAND-cell type EEPROM and the "0" data programming bitline voltage lowers, there is a disadvantage that the mis-programming occurs. Also, this disadvantage is not limited to EEPROM using NAND-cell, but is similar to the EEPROM using the NOR cell, the DINOR cell, and the AND cell which have nonvolatile memory cells respectively and so on.

BRIEF SUMMARY OF THE INVENTION

An object of the present invention is to provide a nonvolatile semiconductor memory device which can prevent lowering a high-voltage charging speed for programming, i.e., preventing lowering data programming operation speed, can largely reduce the voltage stress applied to the transistor at high voltage non-application for programming to the memory cell than the conventional one, and can largely improve the reliability of the device.

Another object of the present invention is to provide a nonvolatile semiconductor memory device which can realize data programming without mis-programming and can improve the reliability of the programming operation.

To solve above-mentioned subject matter, the present invention employs the following structures.

The first nonvolatile semiconductor memory device of the present invention comprises: a memory cell array in which memory cell units having one or more reprogrammable nonvolatile memory cells are arranged in an array; a word line commonly connected to a same row of the one or more memory cells of the memory cell array; a data line commonly connected to a same column of the memory cell units of the memory cell array; sequence control means for controlling a sequence operation which reprograms data of the selected memory cell by a first operation for applying the voltage to reprogram data of the selected memory cell, and a second operation for verifying reprogrammed state of data to memory cell to which the voltage is applied; and voltage application means for applying to the first voltage higher than a power supply voltage to the word line corresponding to the memory cell to be data reprogrammed in the first period which is corresponds to at least partial period during a period of the first operation, in which in a second period corresponding to at least a part in periods which excludes the first period during the sequence operation, a setting voltage of the level of the first voltage is set to the voltage different from a setting voltage of a voltage level in the first period.

As described above, according to the present invention, in a nonvolatile semiconductor memory device which repeatedly performs a programming pulse application operation and a programming verify operation during the data programming, voltage change setting means for setting the limiter voltage setting voltage at high voltage non-application for programming to the cell transistor to the voltage which is different from the limiter voltage setting voltage at high voltage application for programming to the cell transistor. Therefore, a set voltage of the high voltage at high voltage application for programming to the cell transistor is set to a lower than a set voltage of the high voltage at high voltage application to the cell transistor, then it is possible to set the high voltage level for programming at high voltage non-application to lower than the level thereof at high voltage application to without lowering charging speed of the high voltage for programming, i.e., without lowering data programming operation speed. Therefore, the voltage stress applied over the transistor and so on can be reduced than the conventional ones and the memory chip with high reliability can be realized.

A second nonvolatile semiconductor memory device according to the present invention comprises a memory cell array in which a plurality of nonvolatile memory cells or memory cell units in which the plurality of memory cells are connected are arranged in an array, and a word line select means for selecting a word line in the memory cell array, and reprograms data by repeatedly performing loops each having a first operation for applying a voltage for reprogrammed data to a selected memory cell connected the selected word line and a second operation for checking a reprogrammed state of the selected memory cell, and is characterized by employing the following (1) to (6) structures.

(1) The word line of the selected memory cell is maintained to the floating state only in the predetermined period during a first operation at a first loop in data reprogramming.

In the present invention, since only in the predetermined period during first operation at a first loop, the word line of the selected memory cell is maintained to the floating state, in the first operation at the first loop, it is possible to prevent applying the high voltage between the control gate and the drain of the selected memory cell to be "0" programmed, thereby mis-programming can be prevented.

(2) An application voltage to the word line of the selected memory cell is set to equal to or lower than a maximum voltage of the unselected memory cell during first operation at a first loop in data reprogramming.

Since an application voltage to the word line of the selected memory cell is set to equal to or lower than a maximum voltage of the unselected memory cell during a first operation at a first loop in data reprogramming, it is possible to prevent applying the high voltage between the control gate and the drain of the selected memory cell to be "0" programmed in the first operation at the first loop like the above.

(3) An application voltage to the word line of the selected memory cell is substantially constant during a first operation of a second loop or later in data reprogramming, and an application voltage to the word line of the selected memory cell during a first operation at a first loop is set to lower than an application voltage during first operation of second loop or later.

Since an application voltage to the word line of the selected memory cell is substantially constant during a first operation of second loop or later in data reprogramming, and an application voltage to the word line of the selected memory cell during the first operation at a first loop is set to lower than during the first operation of a second loop or later, it is possible to prevent applying the high voltage between the control gate and the drain of the selected memory cell to be "0" programmed in the first operation at the first loop like the above.

(4) An application voltage to the word line of the selected memory cell increases with an increase of the number of loops during the first operation in the data reprogramming operation, and an increment from first loop to a second loop is largest in the increments of the applied voltage for every loops.

Since an application voltage to the word line of the selected memory cell increases every time the number of loops increases, and an increment from first loop to second loop is largest in the increments of the applied voltage for every loops, it is possible to prevent applying the high voltage between the control gate and the drain of the selected memory cell to be "0" programmed in a first operation at a first loop like the above.

(5) A time for applying a high voltage to the word line of the selected memory cell is substantially constant during the first operation of a second loop or later in the data reprogramming operation, and a time for applying voltage to the word line of the selected memory cell during the first operation of a first loop is set to shorter than during the first operation of the second loop or later.

Since a time for applying voltage to the word line of the selected memory cell during a first operation at a first loop is set to shorter than during a first operation of a second loop or later, it is possible to prevent applying the high voltage between the control gate and the drain of the selected memory cell to be "0" programmed in a first operation at a first loop like the above.

(6) A charging speed of a high voltage to the word line of the selected memory cell is substantially constant during the first operation of a second loop or later in the data reprogramming operation, and a charging speed in the first loop is set to slower than in a second loop or later.

Since a charging speed of high voltage to the word line of the selected memory cell is substantially constant during a first operation of a second loop or later in data reprogramming, and a charging speed in a first loop is set to slower than in a second loop or later, it is possible to prevent applying the high voltage between the control gate and the drain of the selected memory cell to be "0" programmed in first operation at a first loop like the above.

As described above, according to the present invention, by preventing applying the high voltage between the control gate and the drain of the selected memory cell to be "0" programmed in a first operation of a first loop and preventing mis-programming, a reliability of data programming operation can be improved.

As described above, according to the present invention, in a first loop, a voltage stress applied to a selected word line voltage during programming pulse application operation in the data programming operation becomes smaller than in a second loop or later, thereby a data programming operation without mis-programming can be realized. Therefore, the nonvolatile semiconductor memory device which largely improves the reliability of the data programming operation and has the high reliability can be realized.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 17 a timing waveform showing signals PGM1 to PGM5 according to the first embodiment of the present invention comparing with a case that the conventional limit voltage setting voltage is constant during data programming operation, for explaining a method of setting a voltage setting voltage at non-application period lower than a limit voltage setting voltage during the high voltage application period to the cell transistor according to the first embodiment of the present inventions FIG. 18 is a waveform showing an example of the operation,when the conventional limit voltage setting voltage is constant during a programming operation comparing with the operation of the embodiment shown in FIG. 17;

FIGS. 20A and 20B are waveforms showing a voltage of the Vpp node at data programming operation to the cell transistor comparing with the operation of the embodiment shown in FIG. 16, when making the time width of the Vppw level long compared with the time width of the Vppv level in the conventional art;

FIGS. 21A and 21B are waveforms showing a voltage of the Vpp node at data programming operation to the cell transistor when the programming pulse width becomes wide with the increase of the number of loops as a fourth embodiment of the present invention, and when the voltage level setting voltage at non-application and at high voltage application becomes high for programming into the cell transistor and Vppwi>Vppvi is kept as the fifth embodiment;

DETAILED DESCRIPTION OF THE INVENTION

Hereinafter, embodiments of the present invention will be explained with reference to the drawings in detail.

Figure 5A:
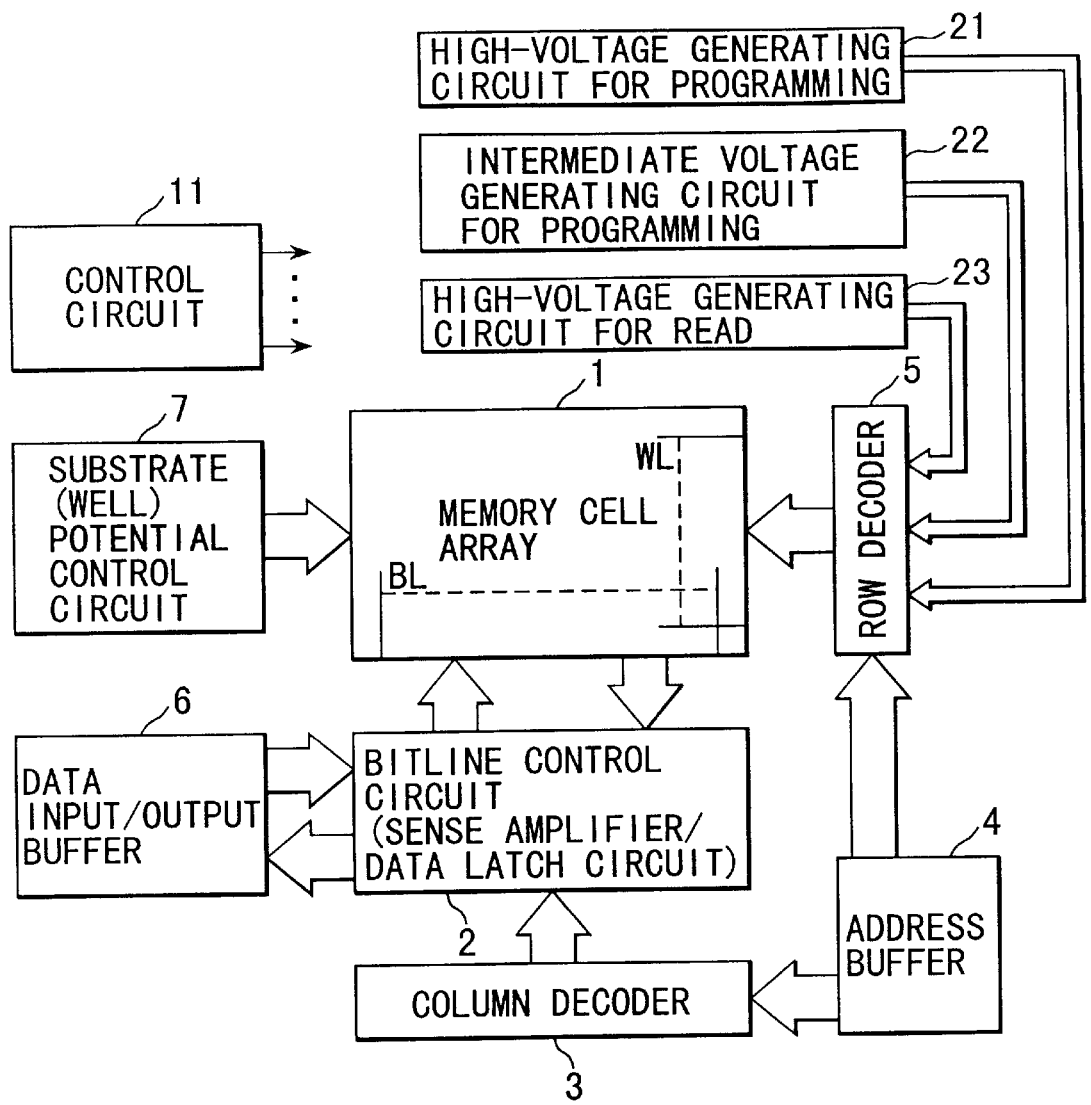
FIGS. 5A and 5B are block diagrams showing a schematic diagram of a whole structure of simultaneously erasable NAND-type EEPROM and a schematic diagram taking out the part thereof according to a first embodiment of the nonvolatile semiconductor memory device of the present invention.
Figure 5B:
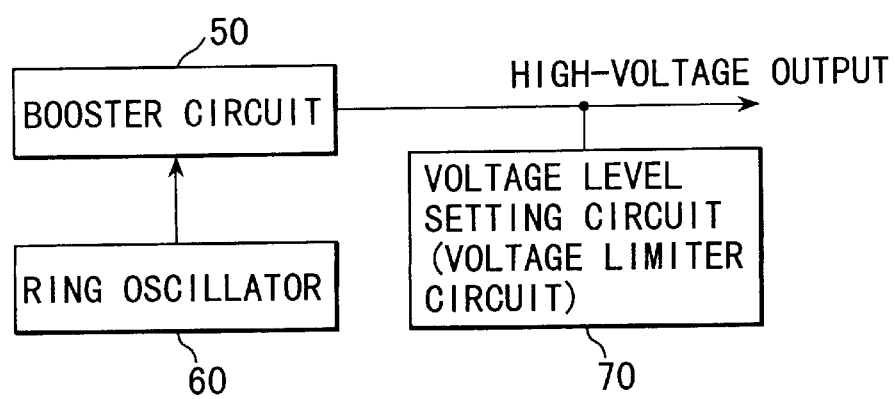

FIG. 5A is a block diagram showing a whole structure of an EEPROM of the NAND-cell type according to the first embodiment of the present invention. FIG. 5B is a schematic structure taking out the part of FIG. 5A.

In FIG. 5A, the NAND-cell unit in which select gates are connected in series with the both end sides of the NAND-cell respectively is arranged in a matrix as a whole to form a memory cell array 1.

In the memory cell array 1, a plurality of word lines WL are commonly connected to each control gate of the cell transistors on the same row for each word line, a select gate connected to a drain of one end side of each NAND cell is connected to a bitline BL as the data line, and the select gate connected to the source of one end side of each NAND cell is connected to the common source line.

A bitline control circuit 2 is composed of a column select switch for selecting a column to the memory cell array 1, a sense amplifier/programmed data latch circuit for performing a latch operation of the programmed data, a sense operation for reading a bitline voltage, a sense operation of the verify read after programming, and a latch operation of the reprogrammed data for the memory cell array 1, and a bitline driver for supplying each bitline with a required voltage respectively and so on, and is connected to a data input/output buffer 6.

A column decoder (column select circuit) 3 decodes a column address signal from the address buffer 4 and controls the column select switch by the decoded output.

A row decoder (row select circuit) 5 is composed of the decoder circuit for decoding a row address signal from the address buffer 4 and the word line driver for supplying a required predetermined voltage to the word line WL and the select gate line respectively according to the decoded output from this decoder circuit.

A high voltage for programming, an intermediate voltage for programming, and a high voltage for read are supplied from a high-voltage generating circuit described later in addition to the power supply voltage Vcc and the reference voltage (0V) to the word line driver of the row decoder 5. A power supply voltage Vcc and a reference voltage (0V) are supplied to the bitline driver of the bitline control circuit 2.

A substrate voltage control circuit 7 is provided for controlling the voltage of the p-type substrate (or p-well) in which the memory cell array 1 is formed.

Three high voltage generating circuit 8, 9 and 10 are provided inside the chip for generating a high voltage (about 20V) and an intermediate voltage (about 10V) for programming which are necessary for data programming to the memory cell, and a high voltage (about 4.5V) for read which is necessary for the programming verify and read, respectively.

The control circuit 11 is provided to control the internal operation of the chip and to perform an interface to an external device, and includes sequence control means (e.g., a programmable logic array) for controlling erase, erase verify, programming, programming verify and read operations for the NAND cell.

Each of the high-voltage generating circuits 8, 9 and 10 has substantially the same structure and is constructed by a booster circuit 50, a ring oscillator 60, a voltage level setting circuit (voltage limiter circuit) 70 and so on as shown in FIG. 5B.

Figures 6A, 6B:
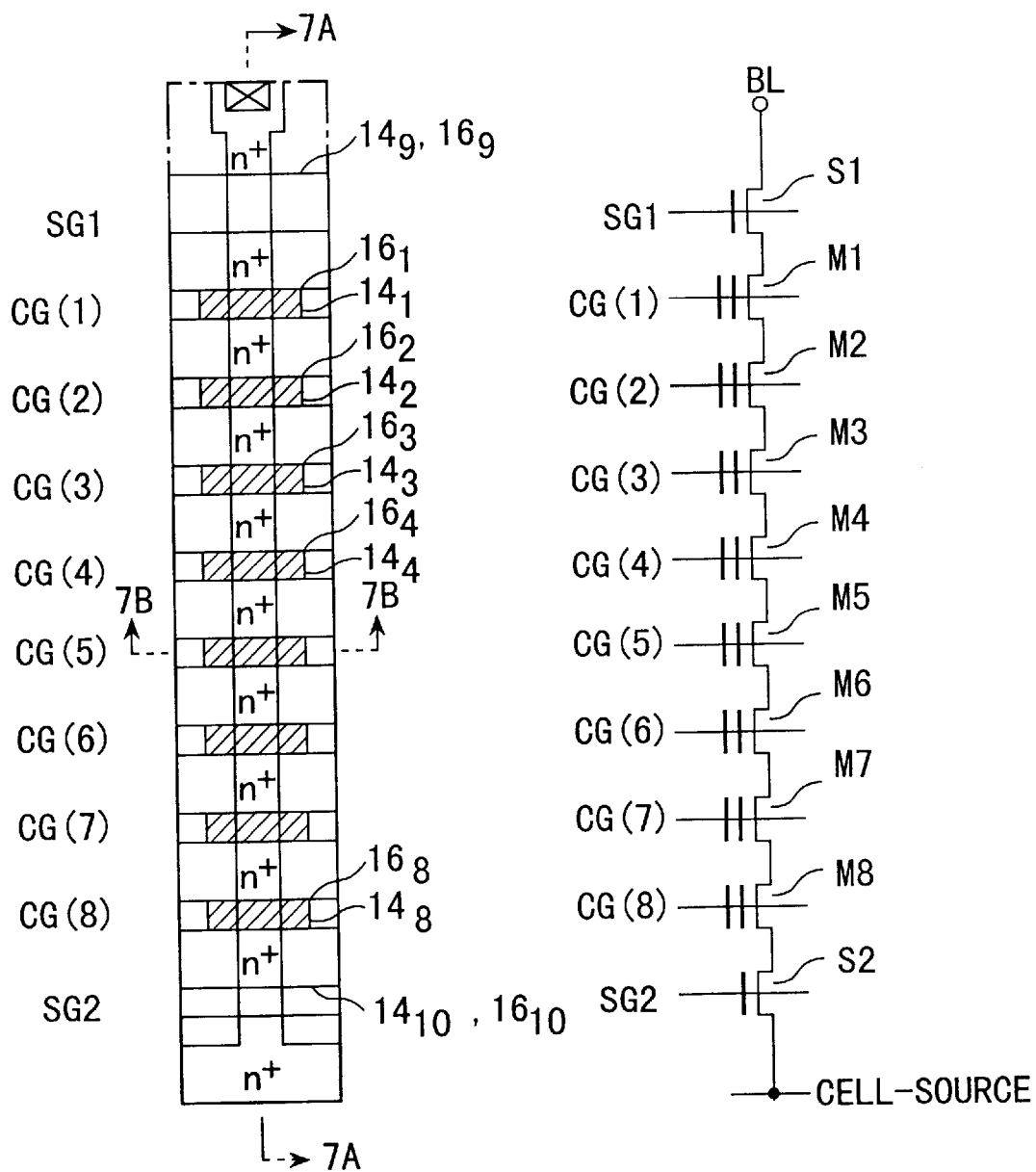
FIGS. 6A and 6B are a plan view and a equivalent circuit diagram showing by taking out one NAND-cell unit in the memory cell array in FIG. 5A.

FIGS. 6A and 6B are a plan view and an equivalent circuit diagram, respectively, showing by taking out one NAND-cell unit of the memory cell array.

Figure 7A:
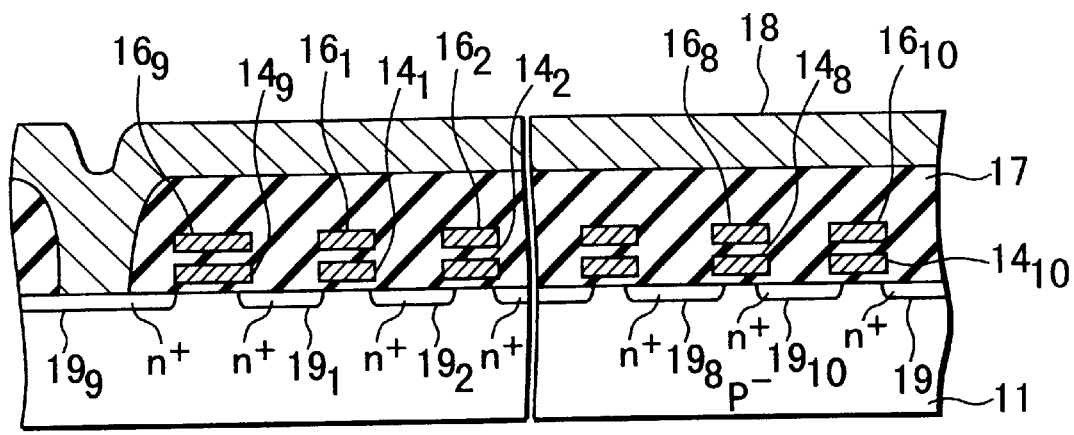
FIGS. 7A and 7B are sectional views showing an example with a structure taken along 7A—7A and 7B—7B in FIG. 6A.
Figure 7B:
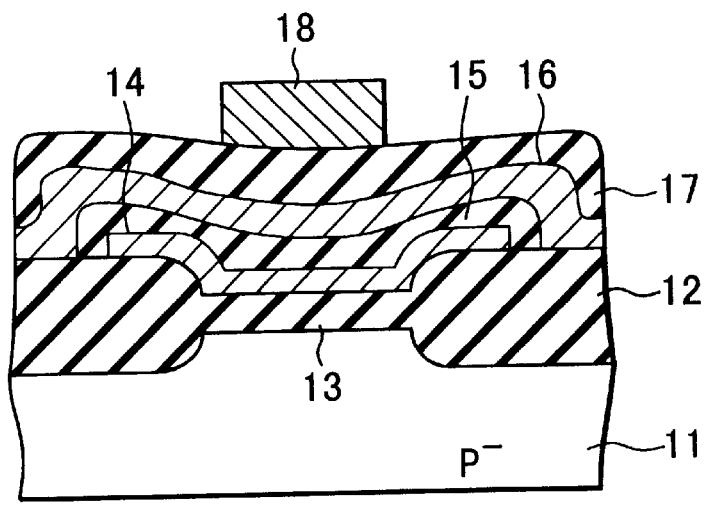

FIGS. 7A and 7B are sectional views showing an example with the structures taken along 7A—7A and 7B—7B in FIG. 6A, respectively.

Figure 8:
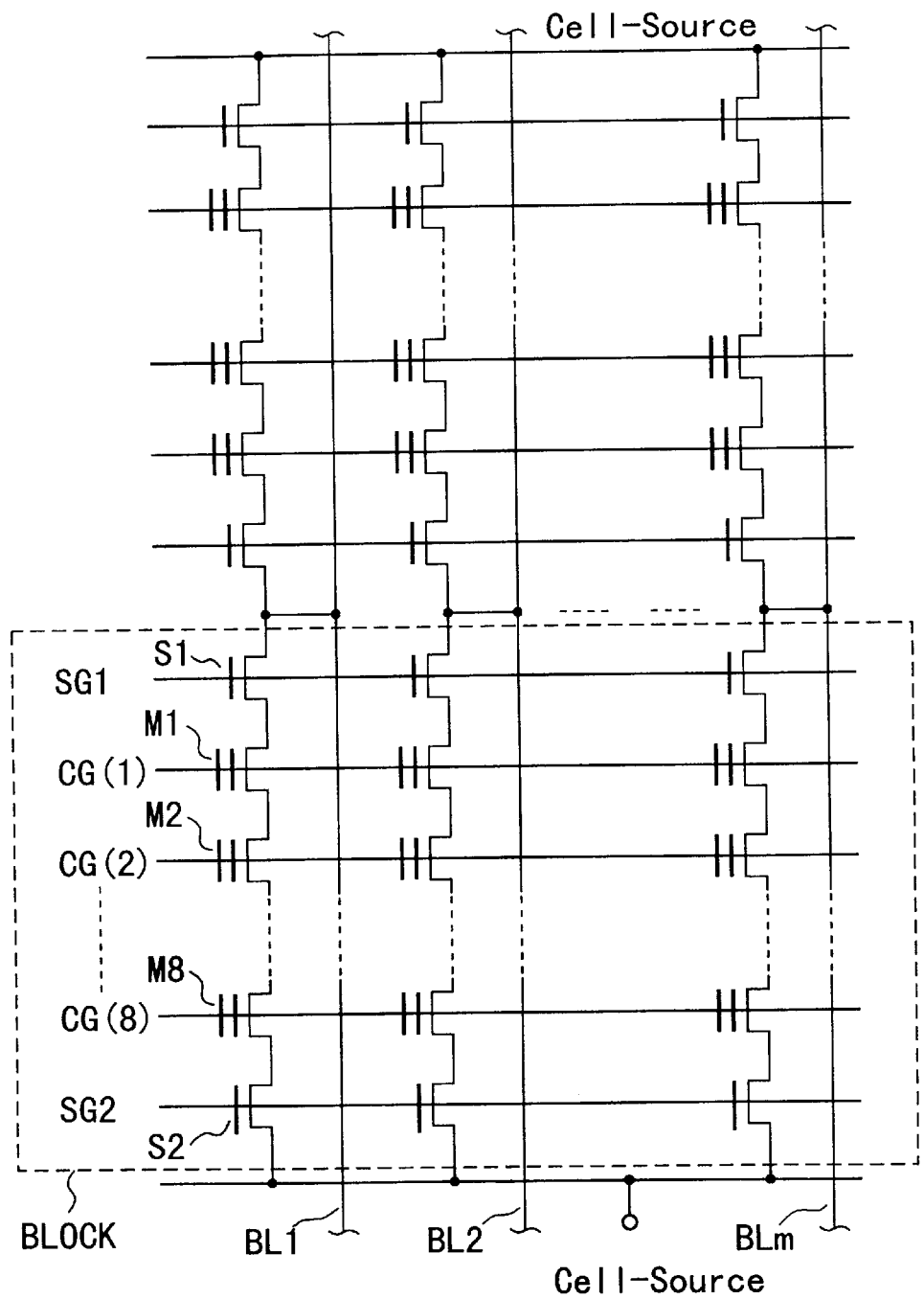
FIG. 8 is an equivalent circuit diagram showing by taking out the part (a plurality of NAND-cell units) in the memory cell array in FIG. 5A.

FIG. 8 is an equivalent circuit diagram showing by taking out the part (a plurality of NAND-cell unit) of the memory cell array.

In FIGS. 6A to 8, for example, a p-well 11 is provided on the n-type silicon substrate, and a memory cell array has a plurality of NAND cell units in a region surrounded with the element separation insulation film (e.g., field oxide film) 12 on the p-well 11.

When taking notice of one NAND cell unit, a plurality of cell transistors (eight cell transistors in this example) M1 to M8 which consist of N-channel MOSFETs each having a floating gate and a control gate respectively is connected in series, and two select gate transistors S1 and S2 are connected in series so as to sandwich the above cell transistor.

In other word, in the above NAND-cell unit, a plurality of memory cells which consist of the MOS transistors for storing information by taking threshold voltages in a first range and a second range are connected in series, and the select gate transistors S1 and S2 are connected in series corresponding to the both end thereof.

A peripheral circuit is provided on the p-well except for a region in which the NAND-cell unit is provided thereon. In stead of the n-type silicon substrate a p-type silicon substrate may be used, an n-well may be provided into this p-type silicon substrate, a p-well may be provided into this n-well and the NAND-cell unit is formed on this p-well.

Each cell transistor of the NAND cell has a first gate insulation film 13 which consists of the thermal oxide film formed on p-well 11, a floating gate 14i (i=1, 2, 3, . . . , 8) which consist of the first layer polycrystal silicon film formed on the first gate insulation film 13 and a part of the field oxide film 12, a third gate insulation film 15 which consists of the thermal oxide film formed on the floating gate 14i, a control gate 16i (i=1, 2, 3, ..., 8) which consists of layered film with the second layer polycrystal silicon film formed on the third gate insulation film 15, or the polycrystal silicon film and the silicide film, and a source/drain region 19i (i=1, 2, 3, ..., 9) which consists of the n-type diffusion layer formed to sandwich a channel region at surface of the p-well 11 under the floating gate 14i.

In this case, each source/drain region 19i of eight cell transistors M1 to M8 is arranged in a straight line, the source/drain region 19i is shared by adjacent cell transistors in this arrangement direction, thereby eight cell transistors M1 to M8 of the NAND-cell are connected in series. The control gate 16i is continuously arranged to the direction normal to the cell transistor arrangement direction and becomes a control gate line (word line) CG(i) (i=1, 2, 3, ..., 8).

Furthermore, the drain $19_1$ of the memory cell transistor M1 at one end side (bitline contact side) of the NAND cell is connected to the bitline 18 through the first select transistor S1 having the gate electrodes $14_9$ and $16_9$, the source $19_{10}$ of the memory cell transistor M8 at another end side (source line side) of the NAND cell is connected to the common source line through the second select transistor S2 having the gate electrodes $14_{10}$ and $16_{10}$.

Where, the gate electrodes $14_9$ and $16_9$ are connected through the conductive material (not shown) in a via hole and in the same way, the gate electrodes $14_{10}$ and $16_{10}$ are connected through the conductive material (not shown) in a via hole.

Then, the gate electrode $16_9$ connected to the gate of the select gate transistor S1 at the bitline contact side is continuously arranged along the word line and becomes the select gate line SG1. The gate electrode $16_{10}$ connected to the gate of the select gate transistor S2 at the source line side is continuously arranged along the word line and becomes select gate line SG2.

In FIG. 8, the NAND-cell group which shares an identical word line and a select gate line is called as a block and a region surrounded by the broken line in FIG. 8 corresponds to one block. Read and programming operations, etc., are usually performed by selecting one of a plurality of blocks (called as a selected block).

The above basic structures are not limited in the embodiment, but each embodiment described later has entirely the same structure.

Figure 9:
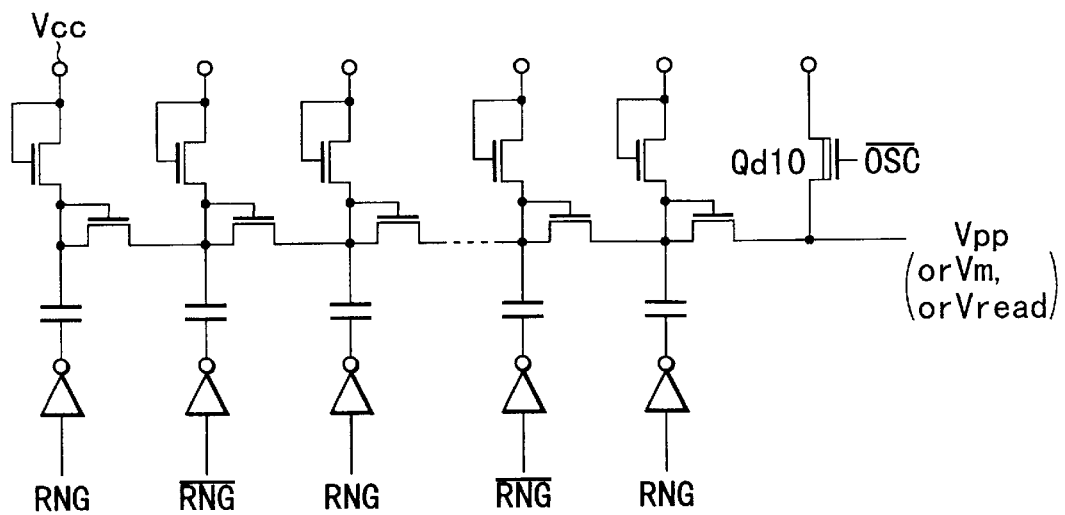
FIG. 9 is a circuit diagram showing a structural example of the booster circuit used for each high-voltage generating circuit in FIG. 5A.

FIG. 9 shows a structural example of the booster circuit 50 used for each of high-voltage generating circuits 8, 9 and 10 in FIG. 5A respectively.

For example, this booster circuit is constructed by, e.g., using the charge pump circuit and obtains high voltage by boosting the power supply voltage Vcc. That is, when not generating high voltage, the control signal /OSC is in "H" level (Vcc) and Vcc is output to the output node (Vpp, Vm, Vread) of the booster circuit through depletion-type (D-type) NMOS transistor Qd10. When the high voltage is generated, a high voltage for programming, an intermediate voltage the programming, a high voltage for read are output to output nodes (Vpp, Vm, Vread) by making the signal/OSC "L" level and making the transistor Qd10 a non-conductive state and inputting driving signals RING, /RING.

Figure 10A:
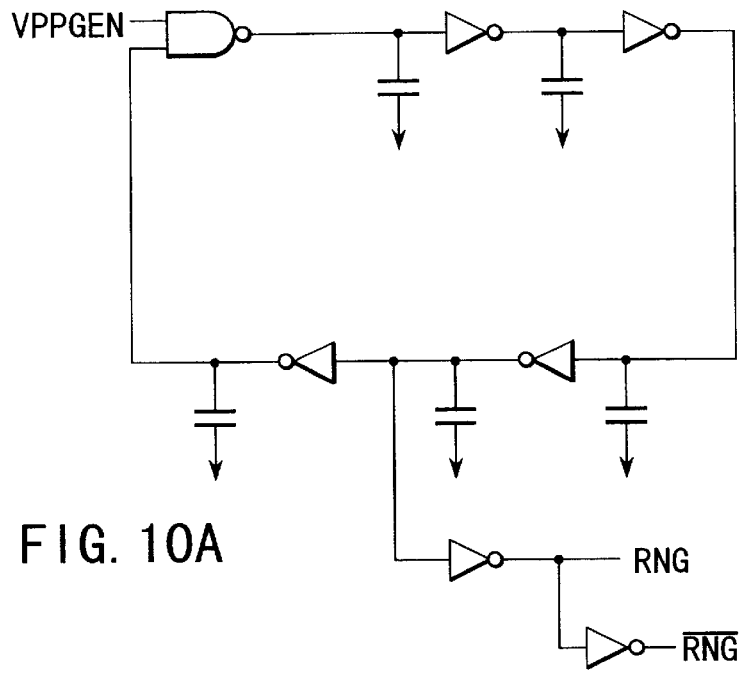
FIGS. 10A and 10B are a circuit diagram and an operation waveform showing an example of the ring oscillator for supplying a booster circuit with driving signals RING and /RING in FIG. 9.
Figure 10B:
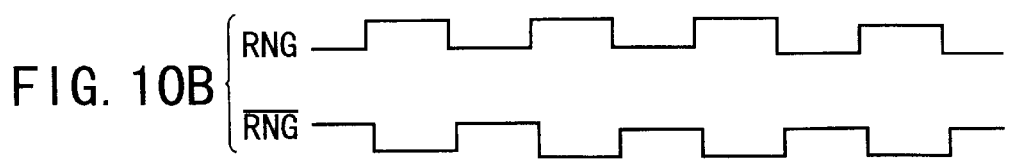

FIGS. 10A and 10B show a structural example of the ring oscillator 60 used for each of high-voltage generating circuits 8, 9 and 10 in FIG. 5A and a waveform example of the driving signal.

This ring oscillator is oscillated at a predetermined period and supplies the tow-phase driving signals RNG and /RNG to the booster circuit.

Figure 11:
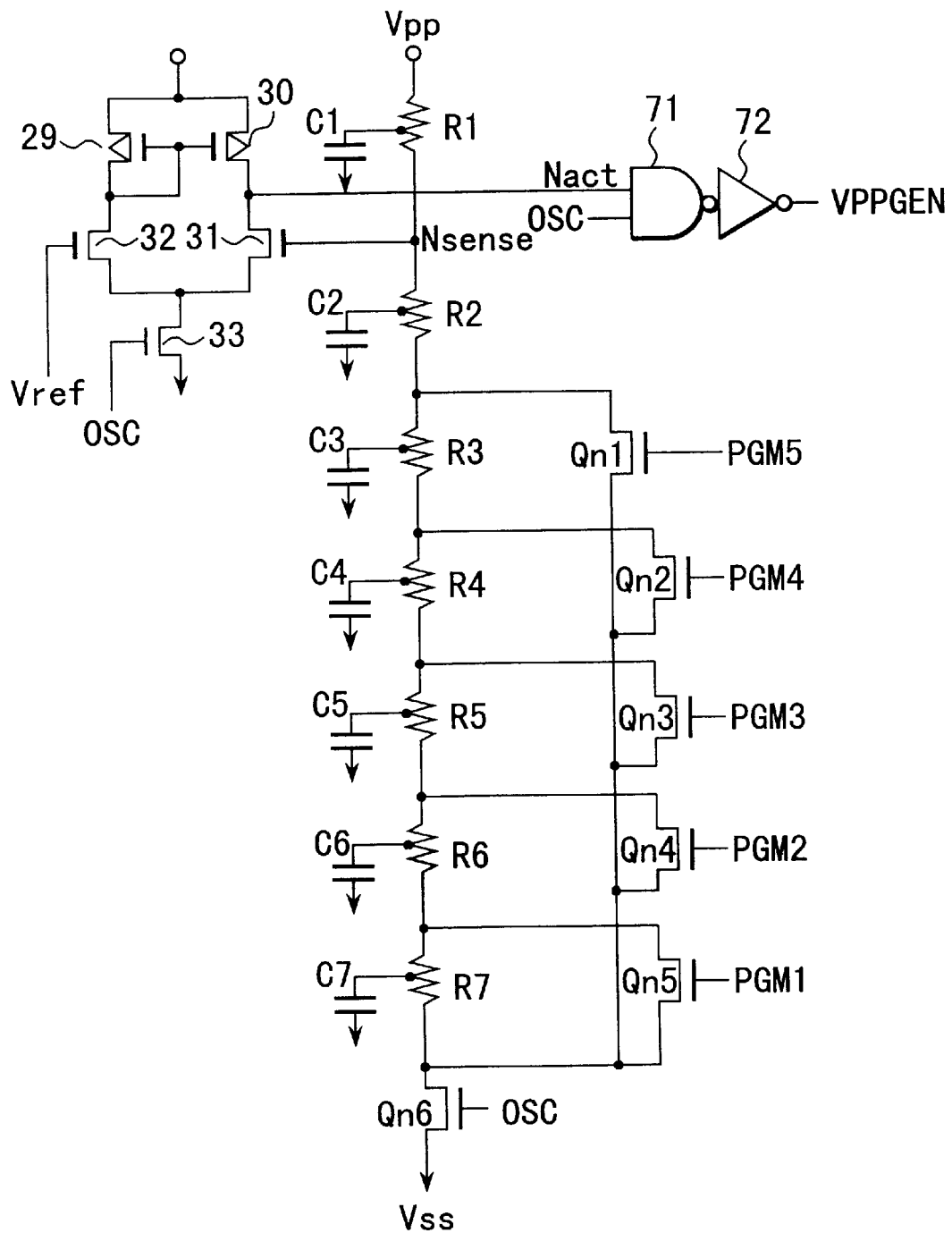
FIG. 11 is a circuit diagram showing a structural example of the Vpp level setting circuit (Vpp limiter circuit) in representatively as an example of the voltage level setting circuit (voltage limiter circuit) connected to the output node of the booster circuit in FIG. 9.

FIG. 11 shows a structural example of the voltage level setting circuit (voltage limiter circuit) 70 used for each of high-voltage generating circuits 8, 9 and 10 in FIG. 5A, respectively. Here, a Vpp level setting circuit (Vpp limiter circuit) is representatively shown.

This voltage level setting circuit is controlled by, for example, the sequence control means in a control circuit 11 of FIG. 5A to limit the high voltage obtained by the booster circuit to a desired optional constant voltage, and the detailed explanation will be described later.

Figure 12:
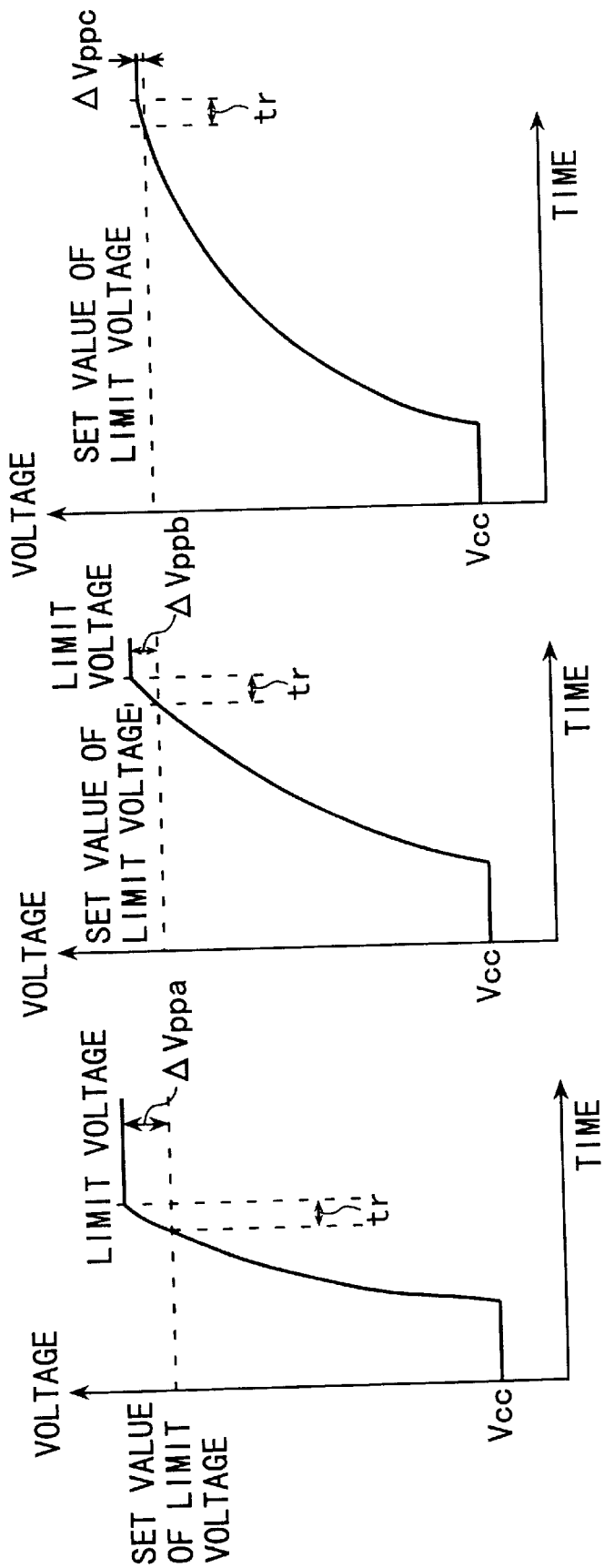
FIGS. 12A to 12C are characteristics showing a limit voltage setting voltage of the high voltage for programming in the circuit in FIG. 11, and relation between the limit voltage and the charging speed.

FIGS. 12A to 12C show a charging speed dependence of the limit voltage at the Vpp level setting circuit of FIG. 11.

Figure 13:
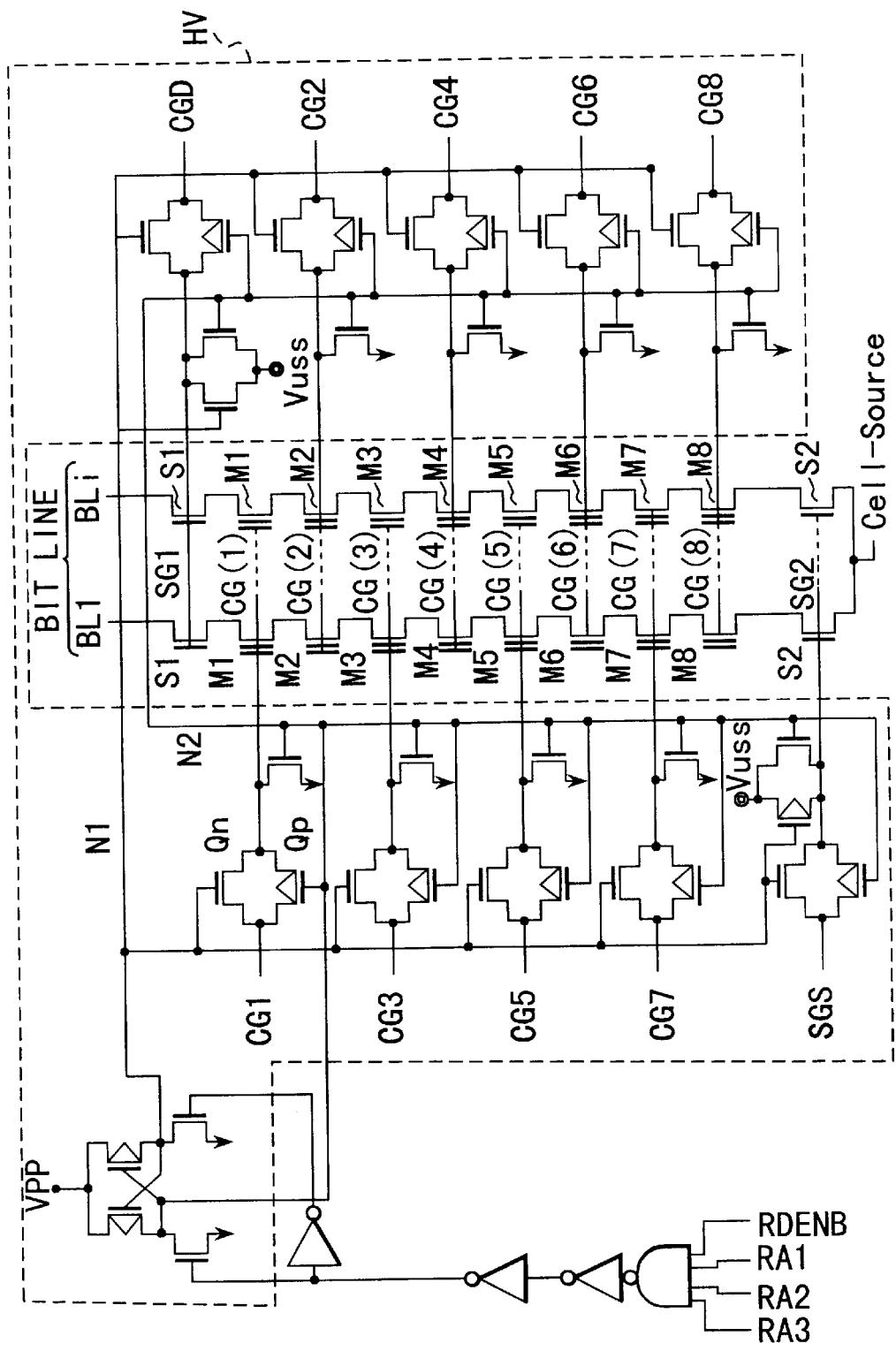
FIG. 13 is a circuit diagram showing an example of the connection relation between the row decoder and the memory cell array in FIG. 5A.

FIG. 13 shows an example of the connection of the row decoder 5 and the memory cell array 1 in FIG. 5A.

In FIG. 13, a signal RDENB is a block select starting signal, all three signals RA1, RA2 and RA3 are "H" level in the selected block and at least one thereof is "L" level in the unselected block. CMOS transfer gates are inserted, respectively, between the signal input node CGi (i=1, 2, 3, ..., 8) and the control gate line CG(i) (i=1, 2, 3, ..., 8), between the signal input node SGD and the select gate line SG1, and between the signal input node SGS and the select gate line SG2. Complementary control signals are supplied to the PMOS transistor Qp and the NMOS transistor Qn of this CMOS transfer gate from the nodes N1 and N2.

In the programming operation, since the nodes N1 and N2 are respectively the same voltage as Vpp node and 0V in the selected block in accordance with the node voltage, a voltages of the select gates SG1, the control gate CG(I) and the select gate SG2 are transferred to the select gate transistor S1, the cell transistors M1 to M8 and the select gate transistor S2 in accordance with the node voltage and the programming operation to the selected cell is performed.

In the programming operation, since the voltage of the node Vuss is 0V, the nodes N1 and N2 are 0V and are the same voltage as Vpp node in accordance with the node voltage in the unselected block, then all of SG1, CGi and SG2 are 0V and the cell transistor is not programmed.

All P-channel transistors in HV region shown by the broken line are formed in the n-well set at the voltage of the Vpp node and one of the nodes N1 and N2 is always the same voltage as the Vpp node.

Figure 14A:
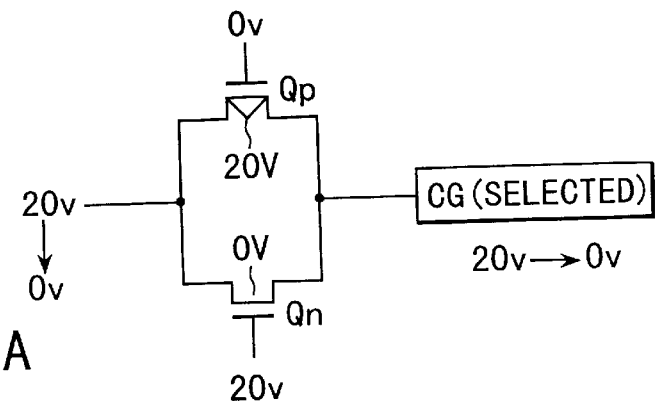
FIGS. 14A to 14D are circuit diagrams for explaining a discharge path during the discharge operation of the control gate line in FIG. 13 and the voltage application state of the transistor in the discharge path.

FIG. 14A shows an example in the charge and discharge path of the transistor in the row decoder connected to CG (selected) which is a selected control gate line in FIG. 13.

Figure 14B:
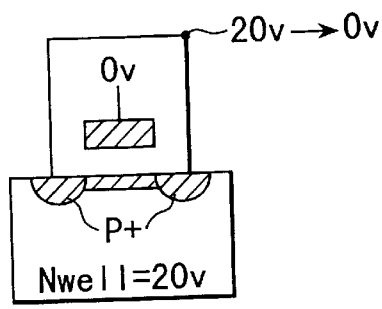

FIG. 14B shows a capacitive coupling of the p-channel transistor when discharging from 20V to 0V by CG (selected) in FIG. 14A.

Figure 14C:
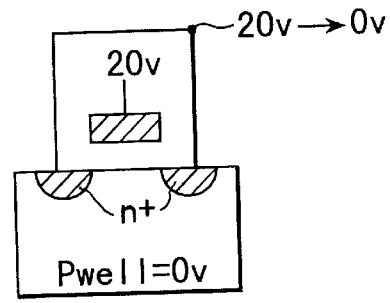

FIG. 14C shows a capacitive coupling of the n-channel transistor when discharging the CG (selected) from 20V to 0V in FIG. 14A.

Figure 14D:
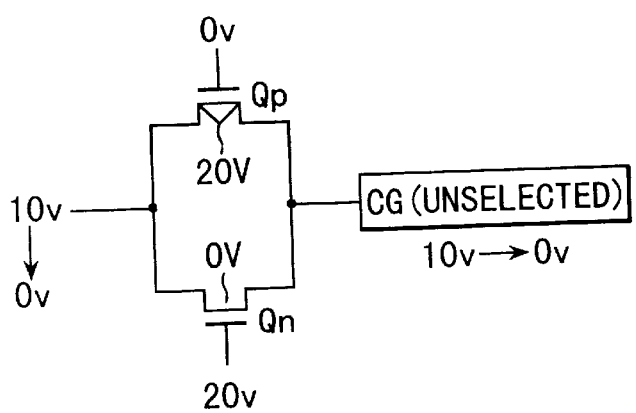

FIG. 14D shows an example in the charge and discharge path of the transistor in the row decoder connected to CG (unselected) which is the unselected control gate line in FIG. 13.

These capacitive couplings will be explained later in detail.

Next, data programming operation of NAND-type EEPROM in FIG. 5A will be explained with reference to FIG. 15 and FIG. 16.

Figure 15:
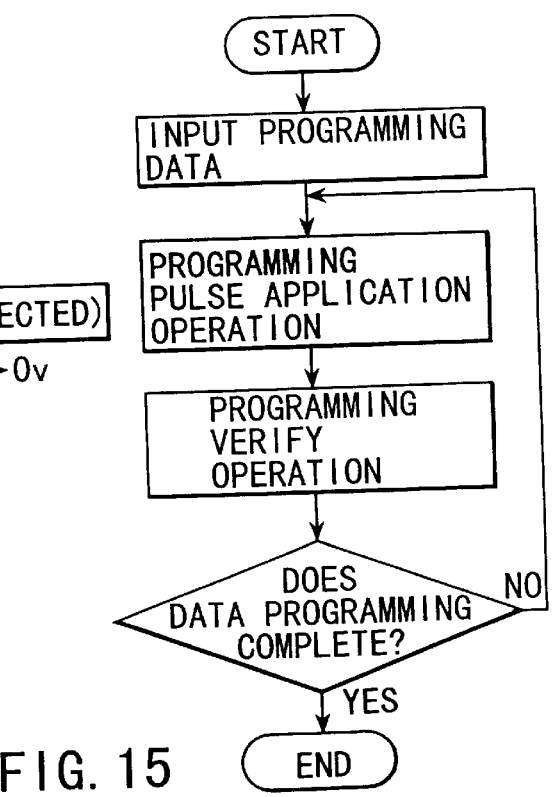
FIG. 15 is a flowchart showing an example of an operation algorithm when programmed data into the memory cell with performing verify by controlling programming time in the NAND-type EEPROM of FIG. 5A.

FIG. 15 shows an example of an algorithm of the operation when programmed data into the memory cell in the NAND-type EEPROM of FIG. 5A.

When the data programming operation starts, first, the data to be newly programmed from outside the chip is input to the internal the chip and a programming pulse application operation is started. Subsequently, a programming verify operation is performed and whether or not the data programming is completed based on the data read by the programming verify operation is judged.

When the data programming is completed, the data programming operation is terminated and when data programming operation is not completed, the programming pulse application operation or later is repeated until the programming is completed. The number of repeating this programming pulse application operation and programming verify operation is called as the programming number of loops or merely the number of loops in the following explanation.

Figure 16:
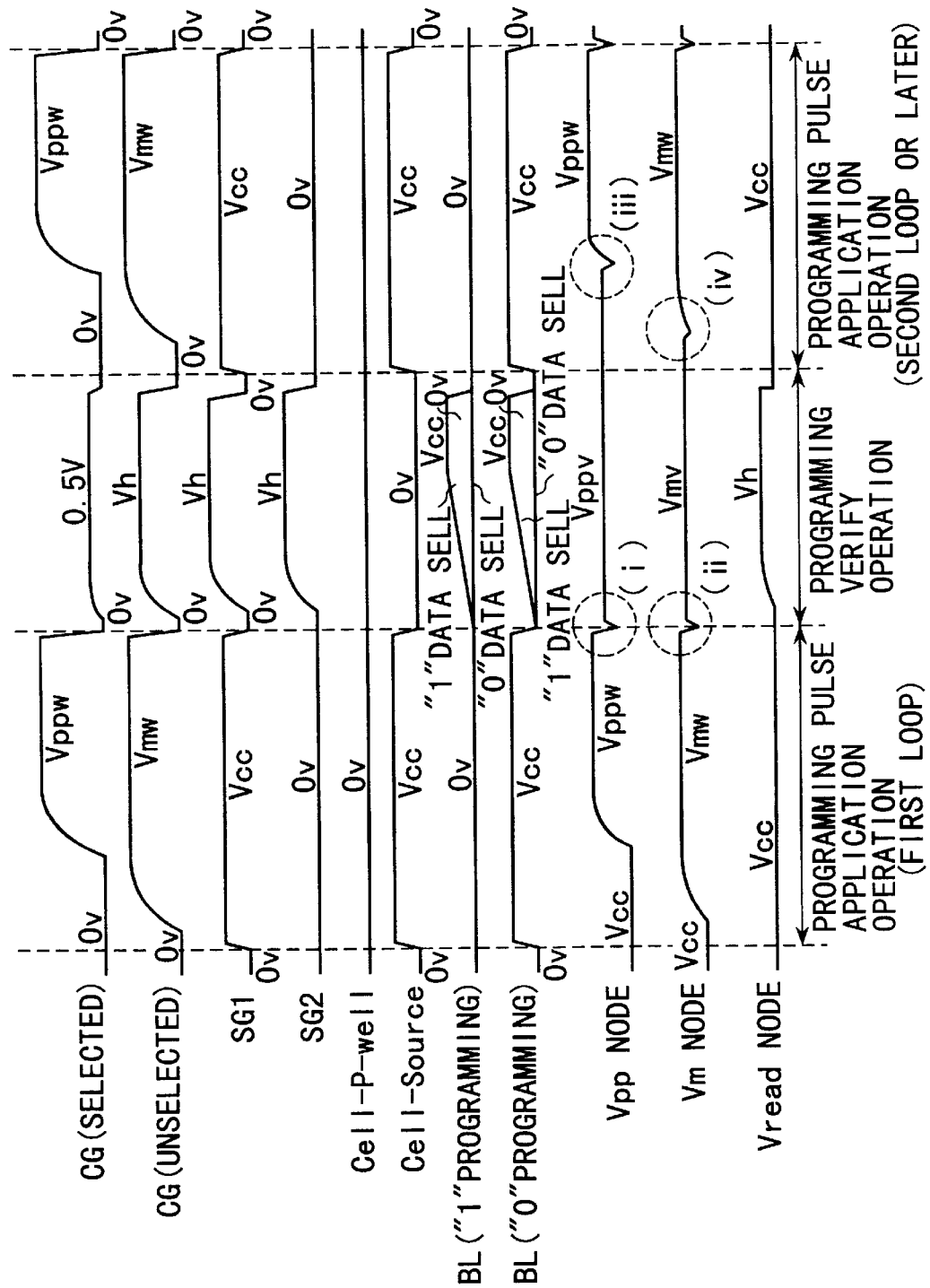
FIG. 16 is a timing waveform showing an example of the programming pulse application operation and the programming verify operation according to the embodiment of the present invention by the programming method shown in FIG. 15.

FIG. 16 shows an example of the timing chart of the programming pulse application operation and the programming verify operation according to the embodiment of the present invention using a programming method shown in FIG. 15.

In FIG. 16, CG (selected) indicates a selected one of eight control gates in the selected block, and CG (unselected) indicate a operation timing of seven control gates except for selected control gate in the selected block. SG1 indicates a select gate line at the bitline contact side in the selected block and SG2 indicates an operation timing of the select gate line at the source line side in the selected block.

Cell-p-well indicates a p-well in which the memory cell array is constituted, Cell-Source indicates a source line in the memory cell array, BL ("1" programming) indicates a bitline corresponding to the "1" data programming and BL ("0" programming) indicates a bitline corresponding to the "0" data programming.

The Vpp node indicates the boosted output node of the high-voltage generating circuit 8 for programming, the Vm node indicates the boosted output node of the intermediate voltage generating circuit 9 for programming and the Vread node indicates the boosted output node of the high-voltage generating circuit 10 for read.

As shown in FIG. 16, the voltages of Vpp node and the Vm node are Vcc, together, at immediately after inputting programmed data, that is, immediately before the programming pulse application operation at the first loop. When the programming pulse application operation at the first loop starts, the select gate line SG1, Cell-Source and BL ("0" programming) become from 0V to Vcc.

Next, the intermediate voltage generating circuit 9 for programming starts the generation and supply of the intermediate voltage Vmw for programming and the charging to the intermediate voltage Vmw for programming to the Vm node starts. At the same time, the charging the intermediate voltage Vmw of CG (unselected) in the selected block for programming starts, too.

The charging the intermediate voltage Vmw for programming to the Vm node and CG (unselected) is completed, the high-voltage generating circuit 8 for programming starts the generation and supply of the high voltage Vppw for programming, and the charging to CG (selected) in the selected block and the Vpp node to the high voltage Vppw for programming starts.

After the charging of CG (selected) and the Vpp node to the high voltage Vppw for programming is completed, this state is kept in the constant time and data is programmed into the memory cell. At this time, in the memory cell in which data "1" is programmed, the high voltage Vppw (about 20V) for programming is applied to the gate electrode (selected control gate line) of the memory cell and 0V is applied to the source/drain channel section. Since there is a large voltage difference of about 20V between the gate and the source and between the gate and the drain, electrons are injected to the floating gate of the memory cell from the source/drain channel region of the memory cell by the tunnel current. As a result, data "1" is stored by changing the threshold voltage of the memory cell from the negative to the positive.

In the memory cell in which data "0" is programmed, the high voltage Vppw (about 20V) for programming is applied to the gate electrode (selected control gate line) of the memory cell. The tunnel current does not flow since the voltage difference exists only about 10V between the gate and the source and between the gate and the drain since the voltage of the source/drain channel section is boosted and becomes about 10V. Therefore, the threshold voltage of the memory cell is kept negative and data "0" is maintained. As for the reason why the source/drain channel section becomes about 10V at the memory cell which programs data "0" will be described later.

CG (selected), CG (unselected), SG1, Cell-Source and BL ("0" programming) are discharged to 0V after the constant time is elapsed and the programming pulse application operation at the first loop is completed.

With this time, the output and the supply of the intermediate voltage and the high voltage for programming to the Vpp node and the Vm node are continued, but the voltage level of the Vpp node and the Vm node lower with discharging the node of CG (selected) charged to the high voltage for programming and CG (unselected) charged to the intermediate voltage for programming (see parts of (i) and (ii) in FIG. 16).

This phenomenon will be explained with reference to FIGS. 14A to 14D in detail. As shown in FIG. 14A, when the CG (selected) is discharged from 20V to 0V, the source/drain channel section of the p-channel transistor Qp of the CMOS transfer gate connected to the CG (selected) also becomes from 20V to 0V as shown in FIG. 14B, then an n-well voltage temporarily lowers by the capacitive coupling (capacitive coupling through PN-junction constructed by p+ and n-well) to the source/drain channel section of the p-channel transistor Qp.

At this time, the source/drain channel section of the n-channel transistor Qn of the CMOS transfer gate connected to the CG (selected) also becomes from 20V to 0V as shown in FIG. 14C, then a voltage of the gate electrode of the p-channel transistor Qp temporarily lowers by the capacitive coupling (capacitive coupling through gate insulation film) to the source/drain channel section.

As described above, since the gate electrode of n-well which is in the high voltage of 20V for programming and the n-channel transistor Qn temporarily lowers by the capacitive coupling, the high voltage for programming also undergoes this influence and temporarily lowers.

Usually, since more transistors allocated between the discharge path of CG (selected), the phenomenon of the temporary lower of the high-voltage level for programming by the above capacitive coupling can not be ignored. In other words, the voltage drop is not small and the phenomenon of the voltage drop and recharge appear at the waveform of the high voltage for programming (see (i) in FIG. 16).

The intermediate voltage for programming also temporarily lowers through the transistor connected to CG (unselected) as shown in FIG. 14D like the above when discharging CG (unselected) (see (ii) of the waveform of the Vm node in FIG. 16).

Above explanation is an explanation about the operation timing of the programming pulse application operation, but hereinafter the timing of the programming verify operation will be explained with reference to FIG. 16.

When the programming verify operation starts, first, the Vpp node and the Vm node which lower the voltage level is recharged. Subsequently, CG (selected) in the selected block becomes from 0V to 0.5V, CG (unselected) in the selected block and SG1 and SG2 become from 0V to Vh (voltage level higher than Vcc).

The high voltage Vh which is generated by the high-voltage generating circuit 10 for read is supplied to the Vread node and Vread node is connected to CG (unselected), SG1 and SG2, thereby charging operation to Vh is performed. At the same time, charge supply to the bitline is started to judge the data of the selected cell transistor.

When the cell current Icell which flows through the NAND-cell is larger than the current (reference current Iref) by this charge supply (when the memory cell data is "0"), the voltage of the bitline is kept at the "L" level (e.g., about 0V).

Contrary to the above description, when cell current Icell is smaller than the reference current Iref (when the memory cell data is "1"), the voltage of the bitline is charged to "H" level (for example, voltage of about Vcc).

Next, the voltage level of the bitline is judged to "H" or "L", and the data of the memory cell is read.

Next, after CG (selected), CG (unselected), SG1, SG2 in the selected block and all bitline are set to 0V and Vread node is set to Vcc, the programming verify operation is completed.

Next, whether or not the data programming is completed based on the data read by the programming verify operation is judged. In other words, whether or not "1" data is programmed in all memory cells in which "1" data should be programmed is judged (waveform display about this operation is omitted in FIG. 16). As a result of the judgment, when the data programming is not completed, continuously, programming pulse application operation is performed (see FIG. 15).

The programming pulse application operation when the number of loops is second loop or later differs only in the waveform of the Vpp node and the Vm node than the programming pulse application operation at the first loop. When the number of loops is the second loop or later, this is since the high-voltage generating circuit 8 for programming and the intermediate voltage generating circuit 9 for programming output the voltage which is higher than Vcc before the programming pulse application operation.

In programming pulse application operation in second loop or later, when starting the charging operation from 0V of CG (unselected) to the Vm node, since the Vm node with the voltage which is in Vmv immediately before starting charging and seven CGs (unselected) which are in the 0V voltage immediately before starting are connected, the voltage level of the Vm node temporarily lowers (corresponding to (iv) in FIG. 16).

When the operation of charging CG (selected) to Vpp from 0V starts, since Vpp node with the voltage which is Vppv immediately before starting charging and one CG (selected) whose voltage is 0V immediately before starting are connected, the voltage level of the Vpp node temporarily lowers (corresponding to (iii) in FIG. 16).

Since the programming pulse application operation in the second loop or later is the same operation timing as the programming pulse application operation at the first loop except for the operation timing of the Vpp node and the Vm node, an explanation thereof will be omitted.

The reason why the source/drain channel section becomes about 10V with the memory cell which programs "0" data as described above will be explained.

When the programming pulse application operation starts as shown in the FIG. 16, first, SG1, Cell-Source and BL ("0" programming) become from 0V to Vcc. At this time, the diffusion layer $19_9$ is Vcc and the diffusion layer $19_1$ is (Vcc–Vthsg) in FIG. 7A (where, Vthsg is the threshold voltage of the select gate transistor (corresponding to S1 in FIG. 6B) having the gate electrode $14_9$), and therefore, since the voltage of the diffusion layer $19_1$ is high, the select gate transistor is in an off state.

At this time, since the diffusion layers $19_1$ to $19_8$, and $19_{10}$ are in the floating state since the gate voltage of the select transistor S2 is 0V and the select transistor S2 is in the off state.

Subsequently, when CG (selected) becomes from 0V to Vppw (about 20V) and CG (unselected) becomes from 0V to Vmw (about 10V), the voltage of the above diffusion layers $19_1$ to $19_8$, and $19_{10}$ and the channel section voltage of cell transistors M1 to M8 which are in the floating state rise to about 10V by the capacitive coupling with CG (unselected) and CG (selected) (about 10V since seven CGs become from 0V to Vmw out of eight CGs).

At this time, since the channel section of the above diffusion layers $19_1$ to $19_8$, and $19_{10}$ risen in about 10V and the cell transistor M1 to M8 is in the floating state, the lower of the voltage has occurred easily even if the slight leak current exists. During programming pulse application operation, the method which Cell-Source voltage is set to Vcc is used not to entirely flow a leak current through select gate transistor S2.

By charging CG (unselected) before CG (selected) charges during programming pulse application operation as shown in FIG. 16, a danger as explained below is avoided.

When, that is, charging CG (selected) before the charging CG (unselected), in the cell transistor in which the programmed data is "0", about 20V is applied to the gate electrode before the source/drain channel section rises to about 10V by the capacitive coupling with the CG lines (especially, seven CGs (unselected)). Therefore, the electric field applied between the floating gate and the source/drain channel section of the cell transistor becomes high and the danger (in other words, the danger which "1" data is programmed in mistake at this cell transistor) that electrons are injected to the floating gate of this cell transistor becomes high.

When charging CG (selected) and charging CG (unselected) at the same time, a case CG (selected) is charged at higher speed can be considered by the influences such as the difference of the current supply ability of high-voltage generating circuit 8 for programming and intermediate voltage generating circuit 9 for programming and the difference of the subtle operation timing. In this case, the danger that wrong data is programmed in the cell transistor like the case to charge CG (selected) before the charging CG (unselected) becomes high.

Next, an excellent point of the operation of the programming pulse application operation and the programming verify operation by the embodiment shown in FIG. 16 will be explained with comparing with the programming pulse application operation and the programming verify operation of the conventional art shown in FIG. 1.

Figure 1:
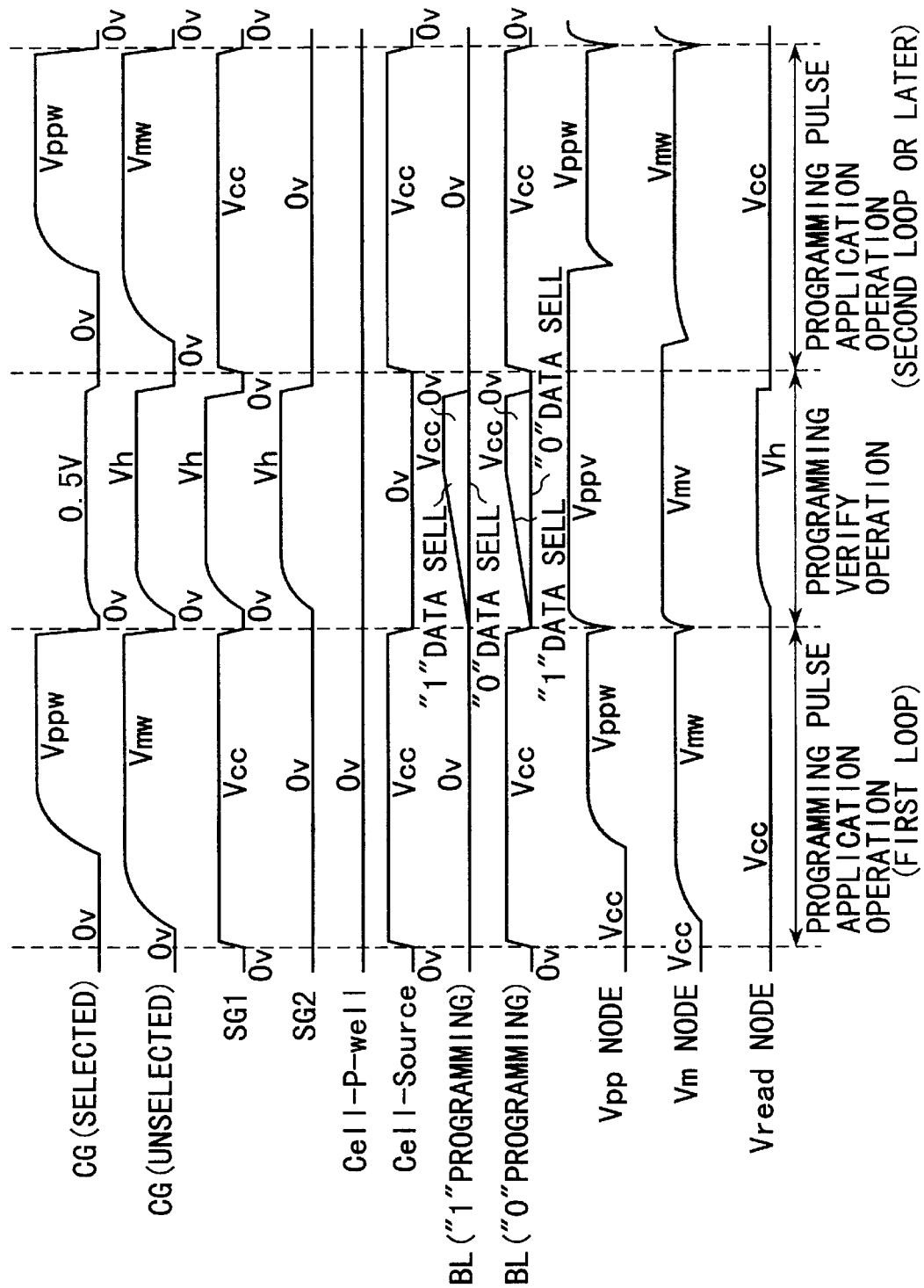
FIG. 1 is a timing waveform showing an example of the programming pulse application operation and the programming verify operation in the conventional NAND-type EEPROM according to the programming method shown in FIG. 15.

The different part of the waveform in the embodiment shown in FIG. 16 is two waveforms of the Vm nodes of the Vpp node comparing with the operation of the conventional art shown in FIG. 1. That is, the voltage level Vppv of the Vpp node and the voltage level Vmv of Vm node from starting the programming verify read operation to a start of next programming pulse application operation is Vppw>Vppv>Vmv in FIG. 16, but Vppw<Vppv and Vmw<Vmv in FIG. 1.

The higher the voltage is, the larger the voltage stress (voltage stress applied to the transistor connected to the above nodes) of the Vpp node and the Vm node becomes. In FIG. 16, the voltage stress of the Vpp node becomes maximum when the voltage level of the Vpp node during the programming pulse application operation is Vppw, and the voltage stress of the Vm node becomes maximum when the voltage level of the Vm node during the programming pulse application operation is Vmw. On the other hand, in FIG. 1, the voltage stress of the Vpp node becomes maximum when the voltage level of the Vpp node during the programming verify operation is Vppv, and the voltage stress of the Vm node becomes maximum when the voltage level of the Vm node during the programming verify operation is Vmv.

When the speed (tunnel current from the channel section of the "1" data programmed cell to the floating gate) to program data into the cell transistor is the same as conventional ones, Vppw (FIG. 16)=Vppw (FIG. 1), Vmw (FIG. 16)=Vmw (FIG. 1). Therefore, when comparing the operation of the embodiment shown in FIG. 16 with the operation of the conventional art shown in FIG. 1, since Vppw<Vppv, Vmw<Vmv in FIG. 1 and Vppv<Vppw, Vmv<Vmw in FIG. 16, the voltage stress applied to the Vpp node and the Vm node in FIG. 16 is much smaller than the voltage stress applied thereto in FIG. 1.

Hereinafter, the method of setting and controlling the voltage level of the Vppv node and the Vmv node in case of operation of the embodiment shown in FIG. 16 to be different from in case of operation of the conventional art shown in FIG. 1 will be explained in detail.

The Vpp level setting circuit (Vpp limiter circuit) shown in FIG. 11 is constructed by a voltage generating circuit section, a voltage comparing circuit section, a voltage generating circuit section (not shown) for the reference and so on.

That is, the voltage generating circuit section is constructed by a plurality of resistors Ri (R1 to R7 in this example) for voltage division connected in series between the Vpp node and the reference voltage of 0V and one NMOS transistor Qn6, and a plurality of NMOS switching transistors Qni (in this example, Qn1 to Qn5) in which each one end is connected to one end sides of the partial resistors (R3 to R7 in this example) and another end is commonly connected to.

The resistance of the resistors R1 to R7 is set to sufficiently larger than the resistance when the gate voltage of NMOS transistors Qn1 to Qn6 is Vcc. Usually, since the resistance of R1 to R7 is composed by the polysilicon wiring and the diffusion layer ($n^+$ and $p^+$ and so on), the resistor has capacitance. The capacitance which resistors R1 to R7 have is indicated by C1 to C7.

The control signal PGMi (PGM5 to PGM1 in this example) is supplied to the corresponding gate of the NMOS switching transistors Qn1 to Qn5, respectively. The control signal OSC is supplied to the gate of the NMOS transistor Qn6.

The voltage comparing circuit section is a differential type operational amplifier circuit comprised of P-channel MOSFETs 29 and 30 and the N-channel MOSFET 31, 32 and 33, and the voltage of the node Nsence of the voltage generating circuit is supplied to the gate of the N-channel MOSFET 31 which is one of the MOSFETs for driving. Then, the voltage Vref for the reference generated by the voltage generating circuit for reference is supplied to the gate of another N-channel MOSFET 32 of the MOSFETs for driving and the voltage of the node Nsence and the voltage Vref for reference are compared by the voltage comparing circuit.

When the control signal OSC is supplied to the gate of the N-channel MOSFET 33 in the voltage comparing circuit section, then this signal OSC becomes "H" level to conduct the MOSFET 33, the comparative operation of the voltage comparing circuit is performed. The logic level of this signal OSC is set based on the data programming and read control signal R/W in the EEPROM. For example, the voltage Vref for reference is generated by dividing the power supply voltage Vcc.

Moreover, the signal of output node Nact of the voltage comparing circuit section and the control signal OSC are input to a 2-input NAND circuit 71. The output of this NAND circuit is inverted by an inverter circuit 72 and becomes an output signal VPPGEN.

According to the Vpp level setting circuit of FIG. 11, a voltage difference between the voltage of the Vpp node and the reference voltage Vss is divided into a plurality of voltages by the resistors R1 to R7, one of the divided plurality of voltage is selected, by controlling one NMOS switching transistor of NMOS switching transistors Qn1 to Qn5 in the conducting according to control signals PGM5 to PGM1.

Therefore, the control of the limit voltage setting voltage by the setting change of control signals PGM1 to PGM5 becomes adjustable. In this case, a setting voltage of the limit voltage is changed by the level of setting voltage control signals PGM1 to PGM5. For example, when the signal PGM5 Vcc, a limit voltage setting voltage=Vref×(R1+R2)/R2. When the signal PGM5=0V and PGM4=Vcc, a limit voltage setting voltage=Vref×(R1+R2+R3)/(R2+R3).

In FIG. 11, the control signal OSC is the inversion signal of the control signal /OSC shown in the booster circuit of FIG. 9. The control signal OSC becomes "H" level (Vcc), during output operation for outputting a higher voltage than Vcc from the booster circuit, but becomes "L" level when not outputting (set to the Vcc voltage) the voltage higher than Vcc from the booster circuit.

The voltage of the Vpp node in FIG. 11 is Vcc which is output from the booster circuit of FIG. 9 before generating the higher voltage than Vcc with the booster circuit of FIG. 9, and the control signal OSC is 0V. Therefore, an output signal VPPGEN is in 0V. At this time, the driving signals RNG and /RNG are fixed to Vcc and 0V respectively. Therefore, the booster circuit of FIG. 9 does not operate and the Vpp node and the Vcc power supply are connected through D-type NMOS transistor Qd10.

On the other hand, since the voltage of the node Nsense becomes "L" level when the control signal OSC becomes from 0V to Vcc, the output signal VPPGEN becomes Vcc and the driving signals RNG and /RNG have the waveform which reciprocates between the "H" level and the "L" level. Therefore, the booster circuit of FIG. 9 starts operation and generates the voltage higher than Vcc.

When the voltage level of the Vpp node becomes high, the level of the node Nsense in the voltage generating circuit section also becomes high and the output node Nact in the voltage comparing circuit section becomes "L" level when becoming the voltage>Vref of the node Nsense with this.

The output signal VPPGEN is fixed to 0V, the driving signals RNG and /RNG are fixed to Vcc and 0V, respectively. At this time, the output of the high voltage from the booster circuit suspends and at the Vpp node, the voltage (limit voltage) at this point is kept.

Thereafter, as the factor which causes the lower f the voltage level of the Vpp node, the leak current which flows from the Vpp node to 0V through the resistors R1 to R7 and the NMOS transistors Qn1 to Qn6 is considered. However, usually, since the leak current can be set very small, this leak current can be ignored. In addition, the leak current through the other path can be set smaller. Therefore, the voltage level of the Vpp node after high voltage output suspend from the booster circuit and the gate electrode of the selected cell transistor becomes constant without changing hardly from the limit voltage of the Vpp node (see FIG. 16).

That is, the Vpp level setting circuit shown in FIG. 11 can control the voltage level (in other words, a level of the voltage applied to the gate electrode of the selected cell transistor at the programming pulse application operation) of the high voltage for programming by the operation method as described above.

When using each circuit shown in FIG. 9, FIGS. 10A and 11, the generation of the high voltage output from the booster circuit suspends the voltage of the node Nsense becomes in the moment, when the voltage generating circuit section in FIG. 11>Vref. However, since the resistor R1 and the capacitance C1 thereof exist between the Vpp node and the node Nsense, some response time for the Vpp node is required to change the voltage of the node Nsense. In other words, after the elapse of some response time from the moment when the Vpp node reached a limit voltage setting voltage, the voltage of the node Nsense becomes larger than Vref and the output of the high voltage is suspended.

Therefore, the limit voltage changes with the charging speed of the high voltage output as shown in FIGS. 12A to 12C, i.e., the limit voltage changes only the difference of the high voltage rise quantity ΔVpp (corresponding to ΔVppa, ΔVppb, ΔVppc in from FIGS. 12A to 12C) in the period of the response time tr.

That is, the higher the charging speed is, the larger high voltage rise quantity ΔVpp becomes (corresponding to the characteristic of ΔVppa>ΔVppb>ΔVppc). The charging speed and ΔVpp are inversely proportional to the load capacitance (Vpp node capacitance) if the ability (current supply ability) of the high-voltage generating circuit is constant.

Usually, since the capacitance of the Vpp node during the high voltage application period to the cell transistor is larger than the capacitance of the Vpp node during the high voltage non-application period to the cell transistor (because a high voltage is applied to many nodes), the charging speed to the Vpp node during the high voltage non-application period to the cell transistor becomes higher than the charging speed to the Vpp node during the high voltage application period to the cell transistor.

When summarizing the above explanation, in the operation of the conventional art shown in FIG. 1, the limit voltage setting voltage is the same through the programming pulse application operation to the programming verify operation, and the level is higher in limit voltage Vppv during the high voltage non-application period to the cell transistor compared with the limit voltage Vppw during the high voltage application period to the cell transistor.

On the other hand, in the operation of the embodiment shown in FIG. 16, by setting a limit voltage setting voltage during the high voltage non-application period to the cell transistor lower than a limit voltage setting voltage during the high voltage application period to the cell transistor, the limit voltage Vppv during the high voltage non-application period to the cell transistor can be set to the low level compared with the limit voltage Vppw during the high voltage application period to the cell transistor.

An example of an operation waveform of the method of setting the limit voltage setting voltage during the high voltage application period to the cell transistor lower than during the high voltage non-application period in the embodiment of the present invention is shown in FIG. 17. For the reference, an example of an operation waveform in case that the limit voltage setting voltage of the conventional art is the same is shown in FIG. 18.

That is, in the embodiment of the present invention, the limit voltage setting voltage is set to Vref×(R1+R2)/R2 during the high voltage application period to the cell transistor, the limit voltage setting voltage is set to Vref× (R1+R2+R3+R4+R5+R6+R7)/(R2+R3+R4+R5+R6+R7) (<Vref×(R1+R2)/R2) during the high voltage non-application period to the cell transistor. In this case, when the difference between the limit voltage setting voltage during high voltage application to the cell transistor and during the non-application period is larger than ΔVpp, Vppw>Vppv can be realized.

As the meaning of keeping the Vpp node at the voltage higher than Vcc during the high voltage non-application period to the cell transistor, a speed up of charging the high voltage for programming at starting applying the high voltage to the cell transistor during programming pulse application operation is attempted. For example, in case that the capacitance of the Vpp node during the high voltage non-application period to the cell transistor is small compared with the capacitance of the Vpp node during the high voltage application period, when charging the high voltage for programming before the high voltage application starting to the cell transistor, the charging speed of the high voltage for programming in case of starting the high voltage application is faster than the case not to charge.

Therefore, by applying the present invention to a case of charging Vpp node to the level (in other words, a level below Vppw) having no problem on the voltage stress during the high voltage application period to the cell transistor, a long charging time of the high voltage for programming is not required (without lowering data programming operation speed) and a device (that is, a device with high reliability) of the small voltage stress can be realized.

Hereinbefore, regarding to the high voltage for programming, an explanation about the reason for Vppw<Vppv in the operation of the embodiment and Vppw>Vppv in the operation of the conventional art is described. By the same method regarding to the intermediate voltage for programming, it is possible to make Vmw<Vmv in this embodiment but Vmw>Vmv in the operation of the conventional art.

According to the above embodiment, the case for realizing Vppw>Vppv by making a difference between the limit voltage setting voltage during high voltage application to the cell transistor and the non-application period larger than ΔVpp is shown, but the present invention is not limited to the above embodiment and is advantageous when the method of making a limit voltage setting voltage during the high voltage non-application period to the cell transistor lower than a setting voltage during the application period can be used.

For example, when realizing Vppw=Vppv by setting a difference between the limit voltage setting voltage during the high voltage application to the cell transistor and during the non-application period thereto to the same as ΔVpp, and when, for example, make a difference between the limit voltage setting voltage during the high voltage application to the cell transistor and the non-application period thereto smaller than ΔVpp to be Vppw<Vppv, the voltage of Vppv–Vppw can be made smaller than the conventional method. Accordingly, the present invention is advantageous when the voltage stress during the high voltage non-application period to the cell transistor can be decreased, and so on.

Hereinbefore, a method of reducing the voltage stress during the high voltage non-application period to the cell transistor is reduced without lowering the data programming operation speed by setting a limit voltage setting voltage during the high voltage non-application period to the cell transistor lower than a limit voltage setting voltage during the application period to realize a device with high reliability is explained.

By the above embodiment, in one programming pulse application operation, a case that the time which applies high voltage for programming to the gate electrode of the selected cell transistor (programming pulse width) is constant not to depend on the number of loops and the high-voltage level for programming is also constant not to depend on the number of loops is explained as an example. The present invention is not limited to the above embodiment and is possible to change.

Figure 19A:
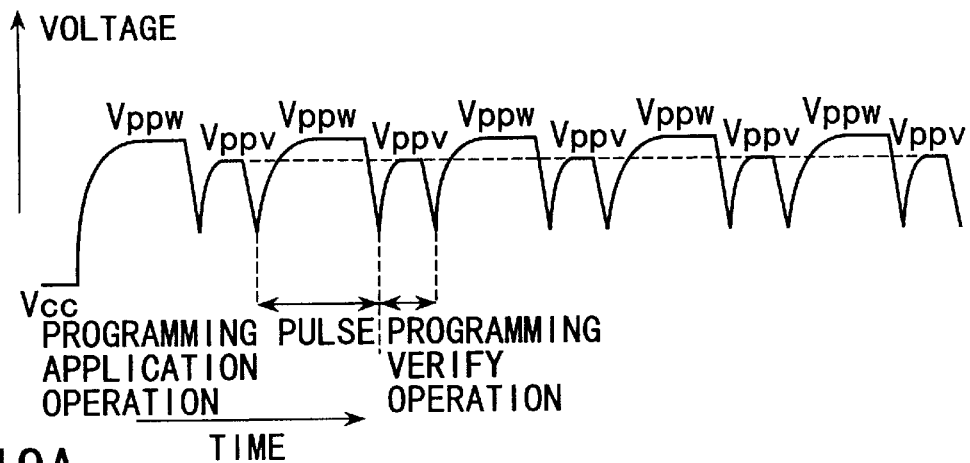
FIGS. 19A to 19C are waveforms showing a voltage of a Vpp node at data programming operation to the cell transistor as the second and the third embodiments of the present invention, when making the time width of the Vppw level long compared with the time width of the Vppv level at the actual device.
Figure 19B:
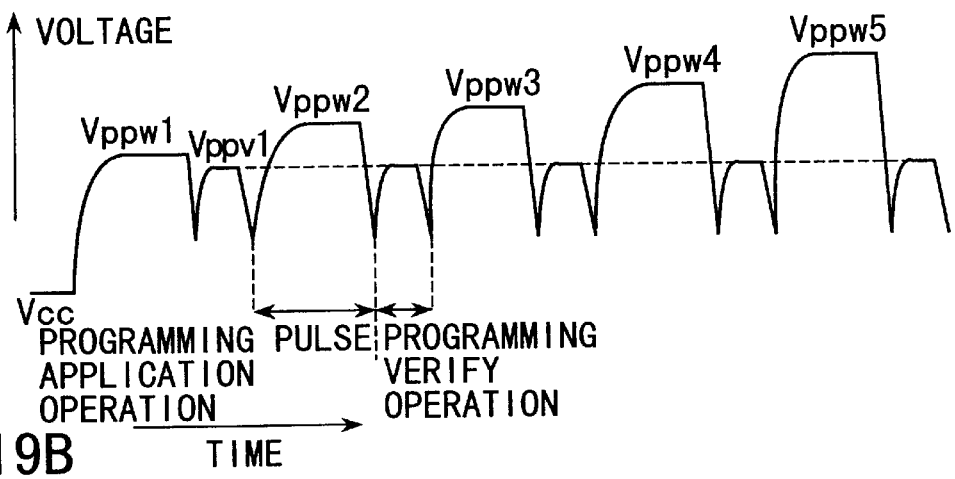
Figure 19C:
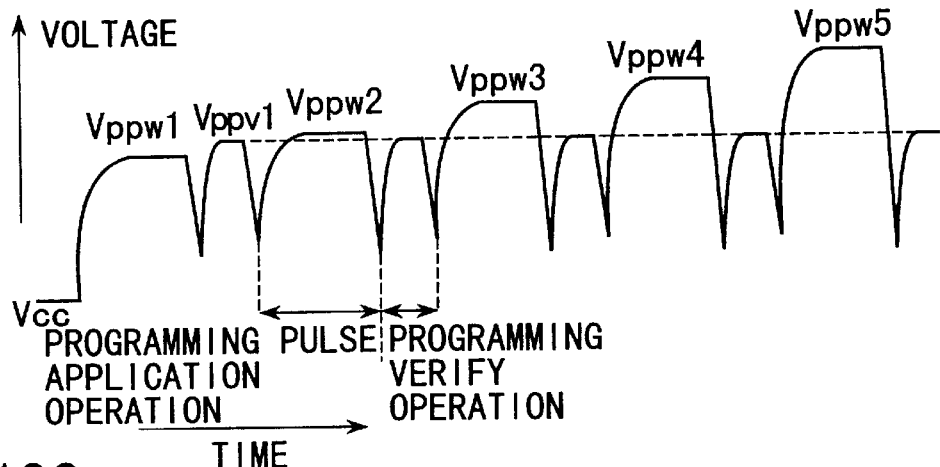

FIGS. 19A to 19C show the waveforms of the Vpp node in case of making the time width of the Vppw level longer than the time width of the Vppv level in an actual device during data programming operation to the cell transistor.

That is, FIG. 19A shows a case where a high-voltage level for programming and programming pulse width are kept constant and does not depend on the number of loops as the second embodiment.

FIGS. 19B and 19C show a step up method in which the high-voltage level for programming applied to the cell transistor becomes high with increasing the number of loops, a case that the high-voltage level for programming during the high voltage non-application to the cell transistor is constant not to depend on the number of loops (Vppv=Vppv1), and a case of using the method to increase the setting voltage of the high-voltage level for programming during the high voltage application to the cell transistor every time the number of loops increases, as the third embodiment The difference of FIGS. 19B and 19C is as follows. In FIG. 19B, the voltage level (Vppw1) of Vppw at the first loop is lager than the voltage level (Vppv1) of Vppv at the first loop, and in FIG. 19C, Vppw1 is smaller than Vppv1.

That is, in FIG. 19C, Vppw1 is smaller than Vppv1 since the limit voltage setting voltage is the same at non-application of the high voltage for programming to the cell transistor as at application thereof only at the first loop. In this case, Since Vppwi (i=2, 3, 4, . . . ) becomes larger than Vppv1 at second loop or later, the voltage stress in the high voltage non-application for programming to the cell transistor can be ignored.

By the reference, FIG. 20A shows a waveform of the Vpp node at data programming operation to the cell transistor when making the time width of the Vppw level longer than the time width of the Vppv level in the conventional art to contrast with the operation shown in FIG. 19A.

FIG. 20B shows a waveform of the Vpp node at data programming operation to the cell transistor when making the time width of the Vppw level longer than the time width of the Vppv level in the conventional art to contrast with FIGS. 19B and 19C.

FIG. 21A shows a waveform of the Vpp node at data programming operation to the cell transistor when the programming pulse width becomes wide with an increase of the number of loops as the fourth embodiment.

FIG. 21B shows a step up method in which the voltage level setting voltage becomes high with an increase of the number of loops at the high voltage application and non-application for programming to the cell transistor, and a waveform of the Vpp node at data programming operation to the cell transistor when Vppwi>Vppvi (i=1, 2, 3, . . . ) is kept as the fifth embodiment.

As shown in FIGS. 19B, 19C and 21B described above, a method of increasing the high-voltage level for programming with an increase of the number of loops can be easily realized by using the Vpp level setting circuit shown in FIG. 11.

Figure 22:
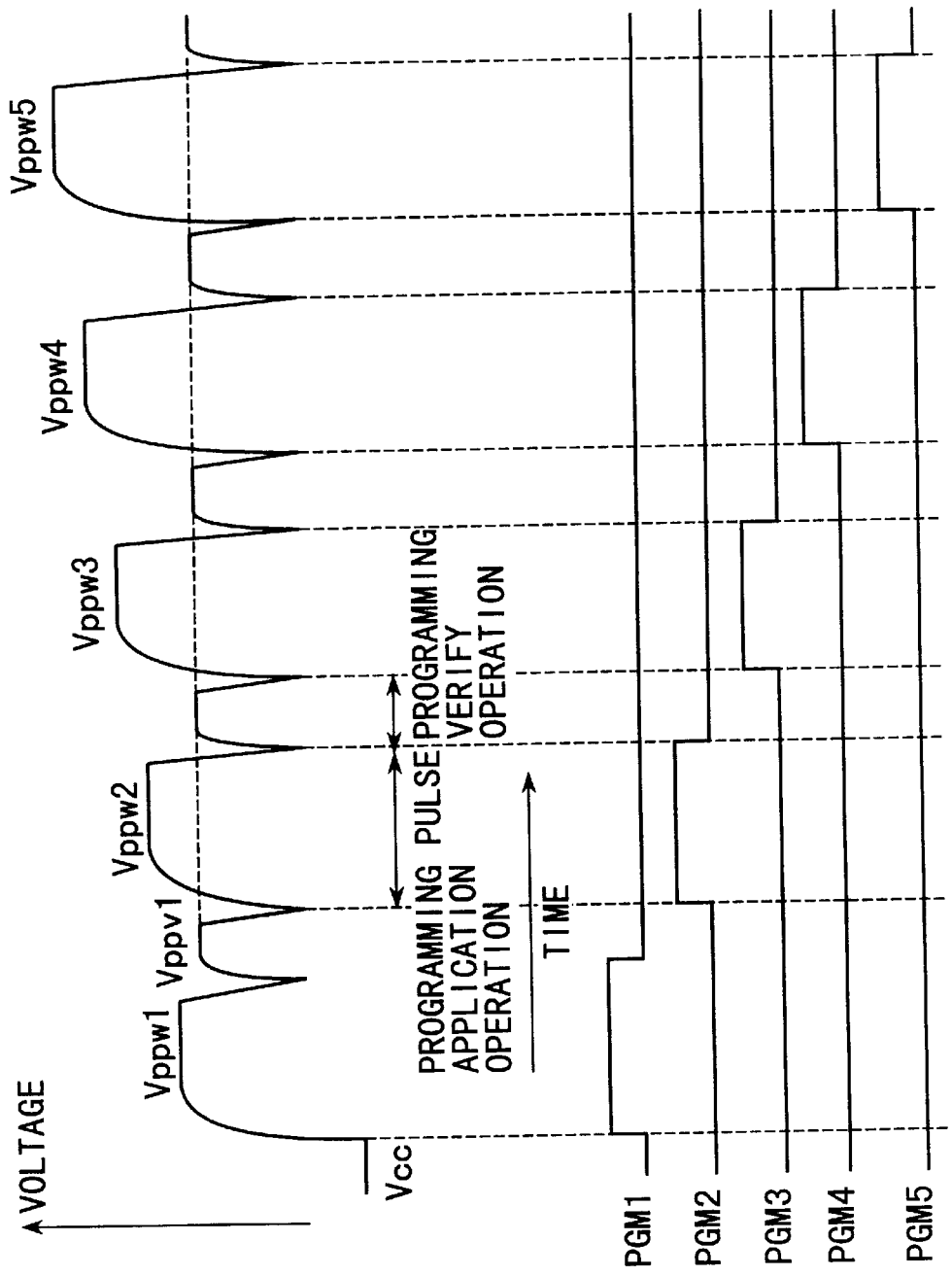
FIG. 22 is a timing waveform showing the control signals PGM1 to PGM5 to realize a programming method of FIG. 19B.
Figure 23:
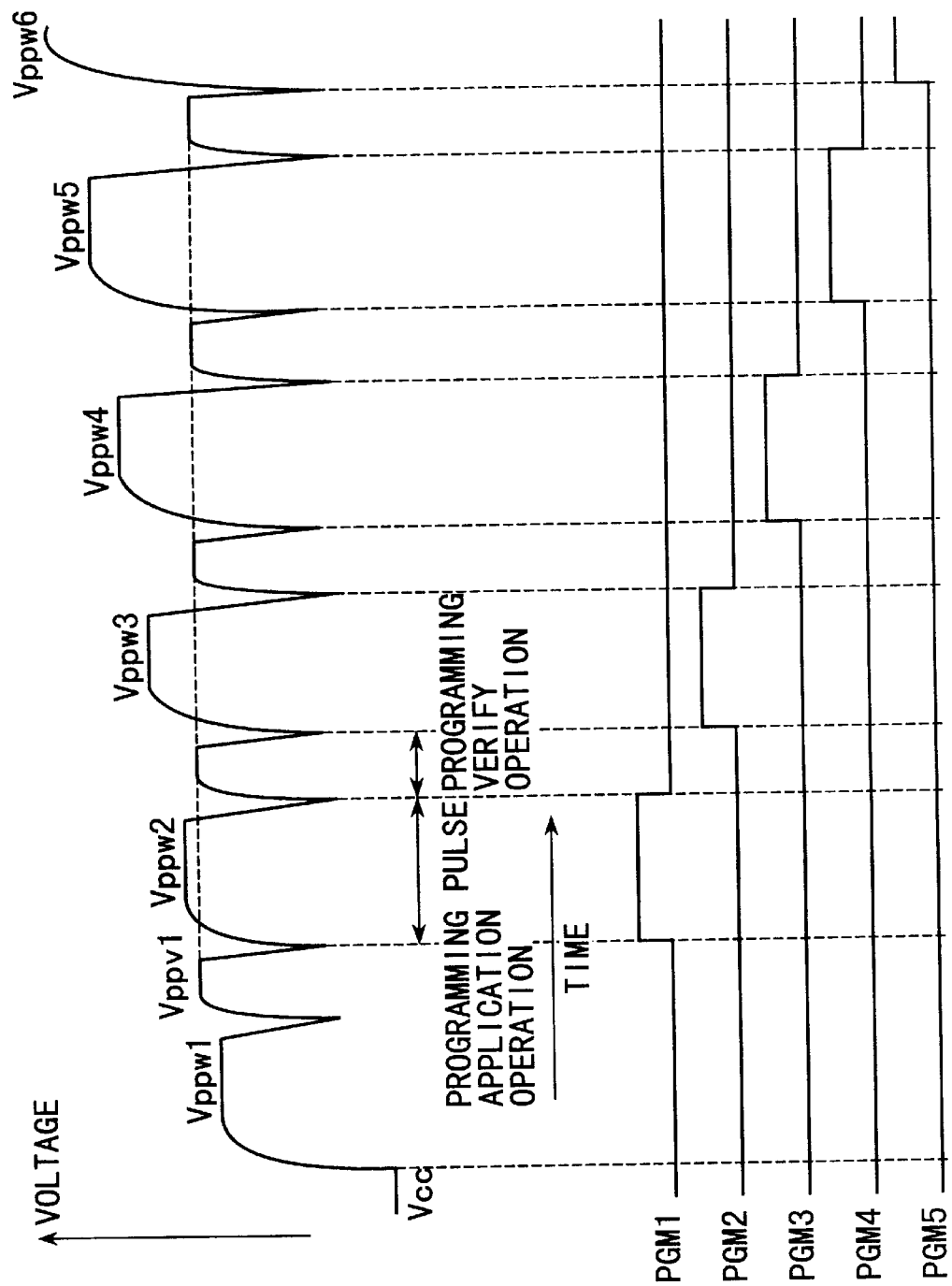
FIG. 23 is a timing waveform showing the control signals PGM1 to PGM5 to realize a programming method of FIG. 19C.
Figure 24:
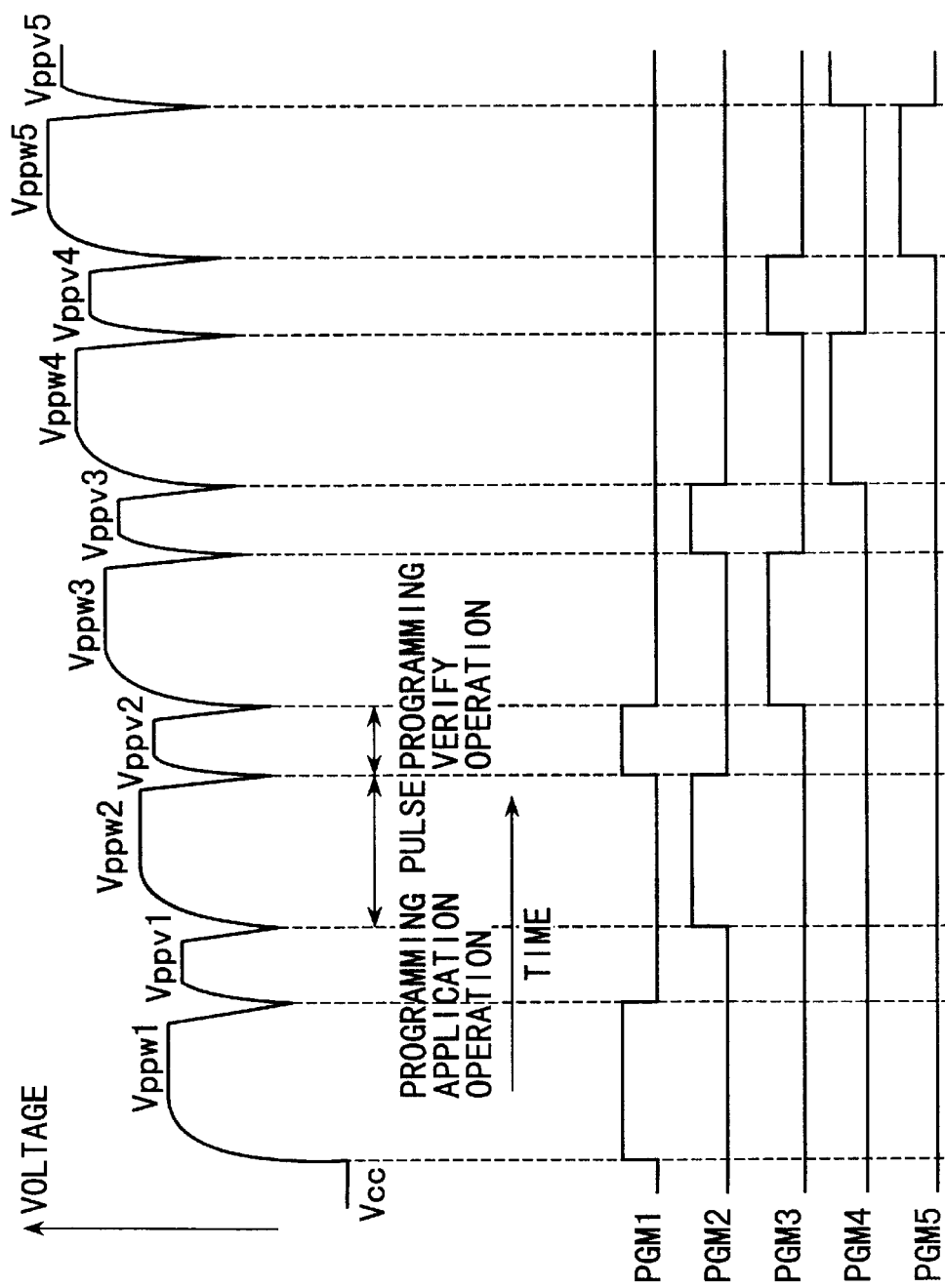
FIG. 24 is a timing waveform showing the control signals PGM1 to PGM5 to realize a programming method of FIG. 21B.

FIGS. 22, 23 and 24 show the operation timing of the control signals PGM1 to PGM5 to realize the corresponding methods of FIGS. 19B, 19C, and 21B, respectively.

According to the operation timing of the control signals PGM1 to PGM5 shown in FIG. 22, five kinds of high voltages (increase of the programming voltage with four times) for programming can be realized by using the Vpp level setting circuit shown in FIG. 11. In this case, the minimum voltage which can be set the limit voltage as the setting voltage of the Vppv level and the voltage level which is higher than the above minimum voltage as the setting voltage of the Vppw level are used.

According to the operation timing of the control signals PGM1 to PGM5 shown in FIG. 23, six kinds of high voltages (increase of the programming voltage with five times) for programming can be realized by using the Vpp level setting circuit shown in FIG. 11. In this case, the minimum voltage which can be set the limit voltage is used as the setting voltage of the Vppv level and is also used as the setting voltage of the Vppw level at the first loop.

According to the operation timing of the control signals PGM1 to PGM5 shown in FIG. 24, five kinds of high voltages (increase of the programming voltage with four times) for programming can be realized by using the Vpp level setting circuit shown in FIG. 11. In this case, the setting voltage of the Vppv level for each loop to the setting voltage is set to one step lower voltage than the setting voltage of the Vppw level.

Since Vppv is smaller than Vppw at the first loop when using the methods of FIGS. 22 and 24 described above, there is an advantage that the voltage stress by Vppv at the first loop can be heavily reduced compared with the method of FIG. 23. On the other hand, when using a method of FIG. 23, even if using the Vpp level setting circuit which is the same as the method of FIGS. 22, 24, there is an advantage that the range of the high voltage for programming which applies to the cell transistor is wide (a large number of increase times of programming voltage) compared with the case of FIGS. 22 and 24.

Moreover, especially, in the method of FIG. 24, the setting voltage of the Vppv level is always set to only one step lower for the setting voltage of Vppw in each loop. Therefore, since the Vpp level at high voltage application to the cell transistor is higher than the method of FIGS. 22 and 23, even when the high voltage for programming is set to a settable highest voltage of the Vpp level setting circuit or is set to a Vppw level which is near voltage thereto, there is an advantage that the Vpp node can be promptly charged at starting the high voltage application to the cell transistor than the method of FIGS. 22 and 23. Therefore, in the methods of FIGS. 22, 23 and 24, which method becomes the optimal changes from each advantage according to the use.

The level setting of the intermediate voltage for programming can be performed according to each of the above embodiments as the case of the high voltage for programming described above.

In each of the above embodiments, an example of a case that the operation of lowering the voltage of the Vpp node and the Vm node at both the programming pulse application operation and the programming verify operation is twice (timings of (i) and (iii), and timings of (ii) and (iv) in FIG. 16) is explained. The present invention is advantageous when an operation of lowering the voltage of the Vpp node and the Vm node is three times or more.

Figure 25:
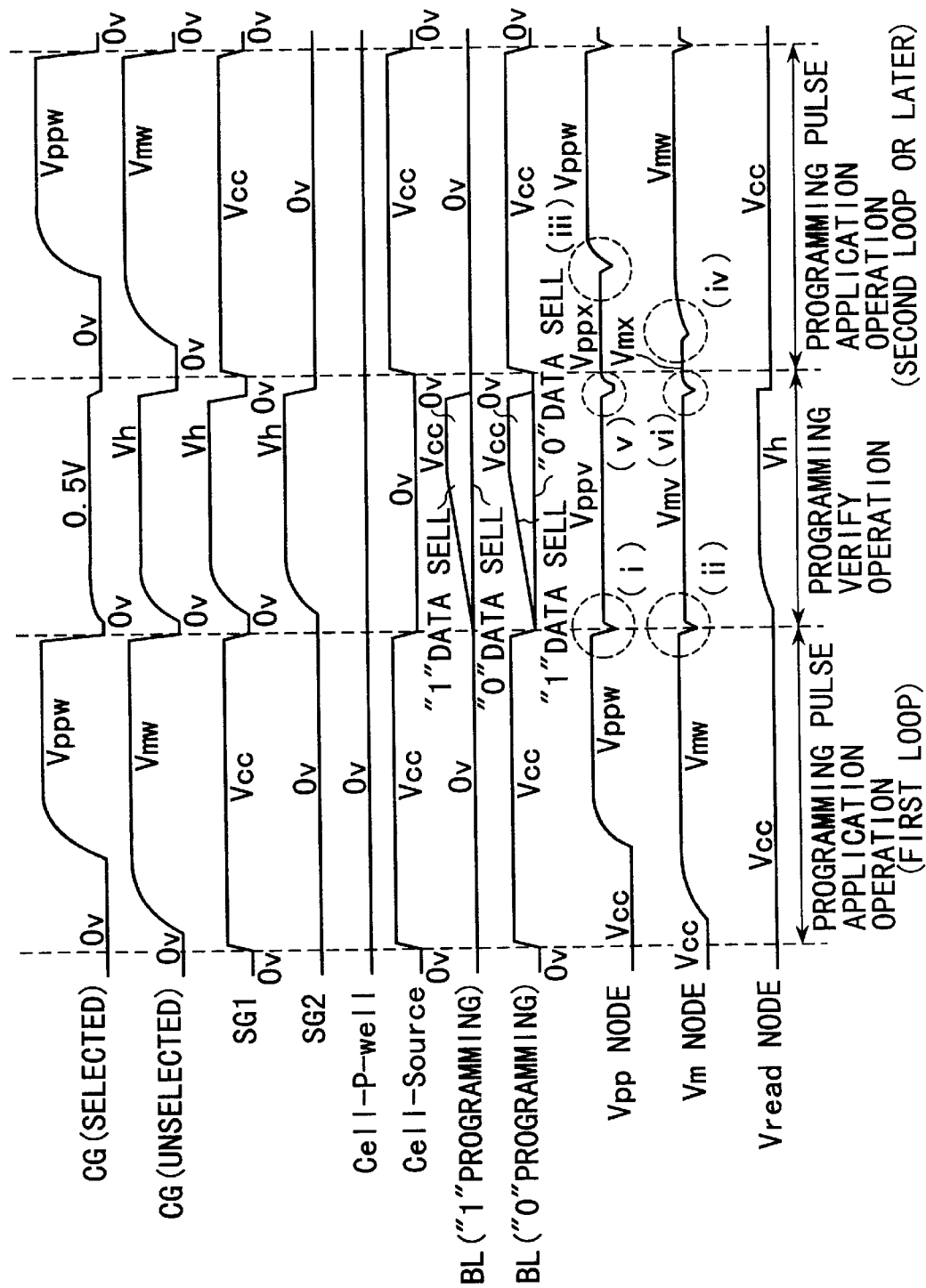
FIG. 25 is a waveform showing a timing chart of the programmihg pulse application operation and the programming verify operation when the operation with the voltage of the Vpp node and the Vm node lowering at three times as a sixth embodiment of the present invention.

FIG. 25 shows an operation waveform when an operation of lowering the voltage of the Vpp node and the Vm node is three times as the sixth embodiment.

In addition to the timings (i) and (iii) in the operation waveform shown in FIG. 16, a case of occurring the voltage drop of the Vpp node and Vm node at the timing (v) (in other words, when making CG (selected), SG1 and SG2 from Vh to 0V) by the same reason as described above with reference to FIG. 14D is shown and the present invention is also advantageous in this case.

FIG. 25 shows a method of lowering a setting voltage of the high-voltage limit voltage for programming in the periods of (i) to (iii) compared with the period when the voltage of the Vpp node is Vppw, and lowering a setting voltage of the intermediate voltage limit voltage for programming in the period (ii) to (iv) compared with the period when the voltage of the Vm node is Vmw.

This method is especially advantageous that the capacitance of the Vpp node in the periods of (i) to (iii) in the operation waveform shown in FIG. 16 is especially small compared with the capacitance of the Vpp node in the period when the voltage of the Vpp node is Vppw, and the capacitance of the Vm node in the periods of (ii) to (iv) is especially small compared with the capacitance of the Vm node in the period when the voltage of the Vm node is Vmw.

Figure 26:
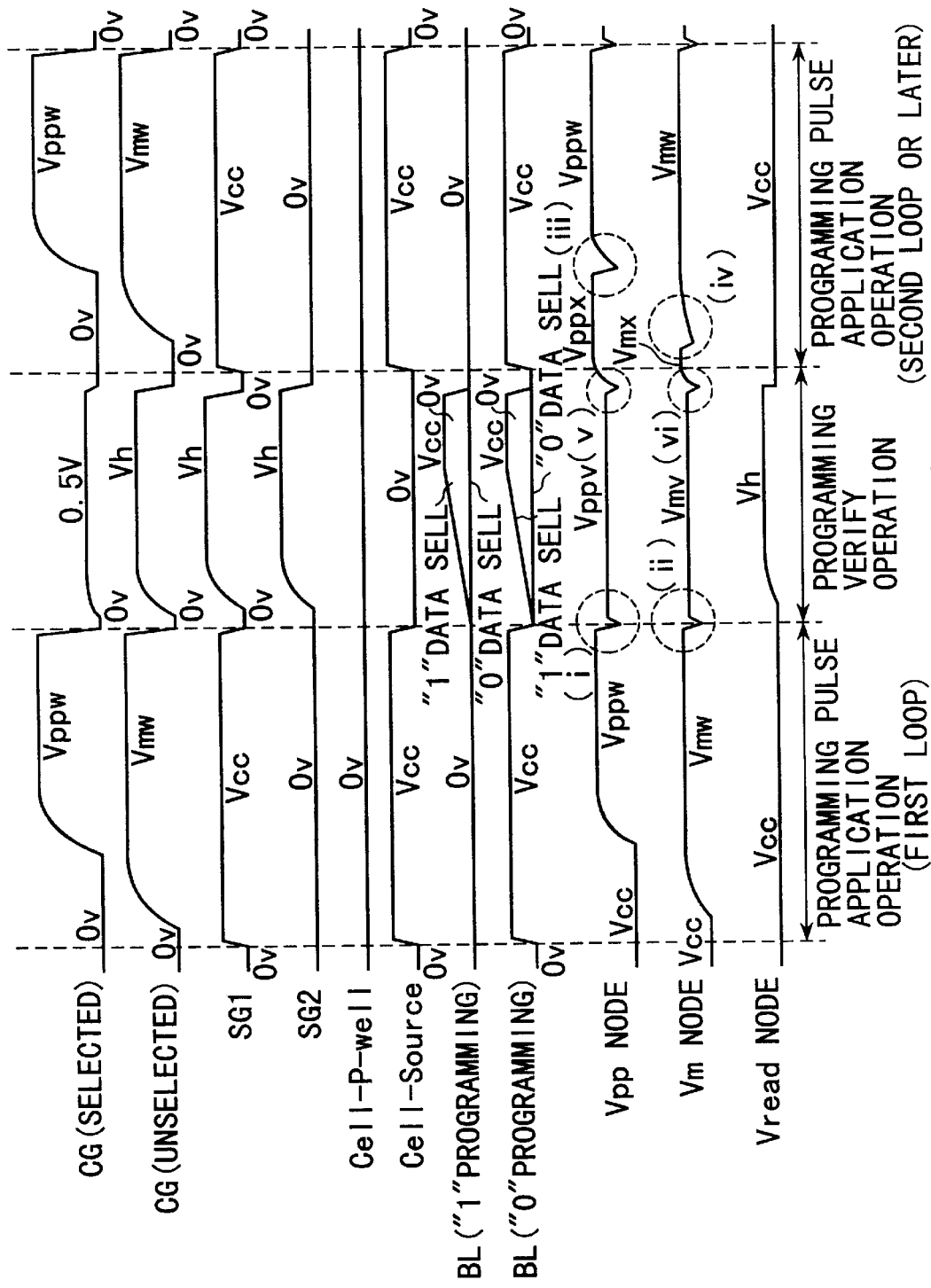
FIG. 26 is a waveform showing a timing of the programming pulse application operation and the programming verify operation when using the method which makes the limit voltage setting voltage of high voltage for programming and the intermediate voltage low compared with the other periods in the periods (i) to (v) and (ii) to (vi) in FIG. 26 as the seventh embodiment of the present invention.

On the other hand, FIG. 26 shows a method of lowering the limit voltage setting voltage of the high voltage and the intermediate voltage for programming compared with the other period in the periods of (i) to (v) and the periods of (ii) to (vi) in the operation waveform and as a seventh embodiment.

This method is advantageous in a case the capacitance of the Vpp node in the periods of (i) to (v) is especially small compared with in the other period in the operation waveform shown in FIG. 16, and the capacitance of the Vpp node is substantially the same in the other period, and in a case the capacitance of the Vm node is especially small in the periods of (ii) to (vi) compared with in the other period, and the capacitance of the Vm node is substantially the same in the other period.

Figure 27:
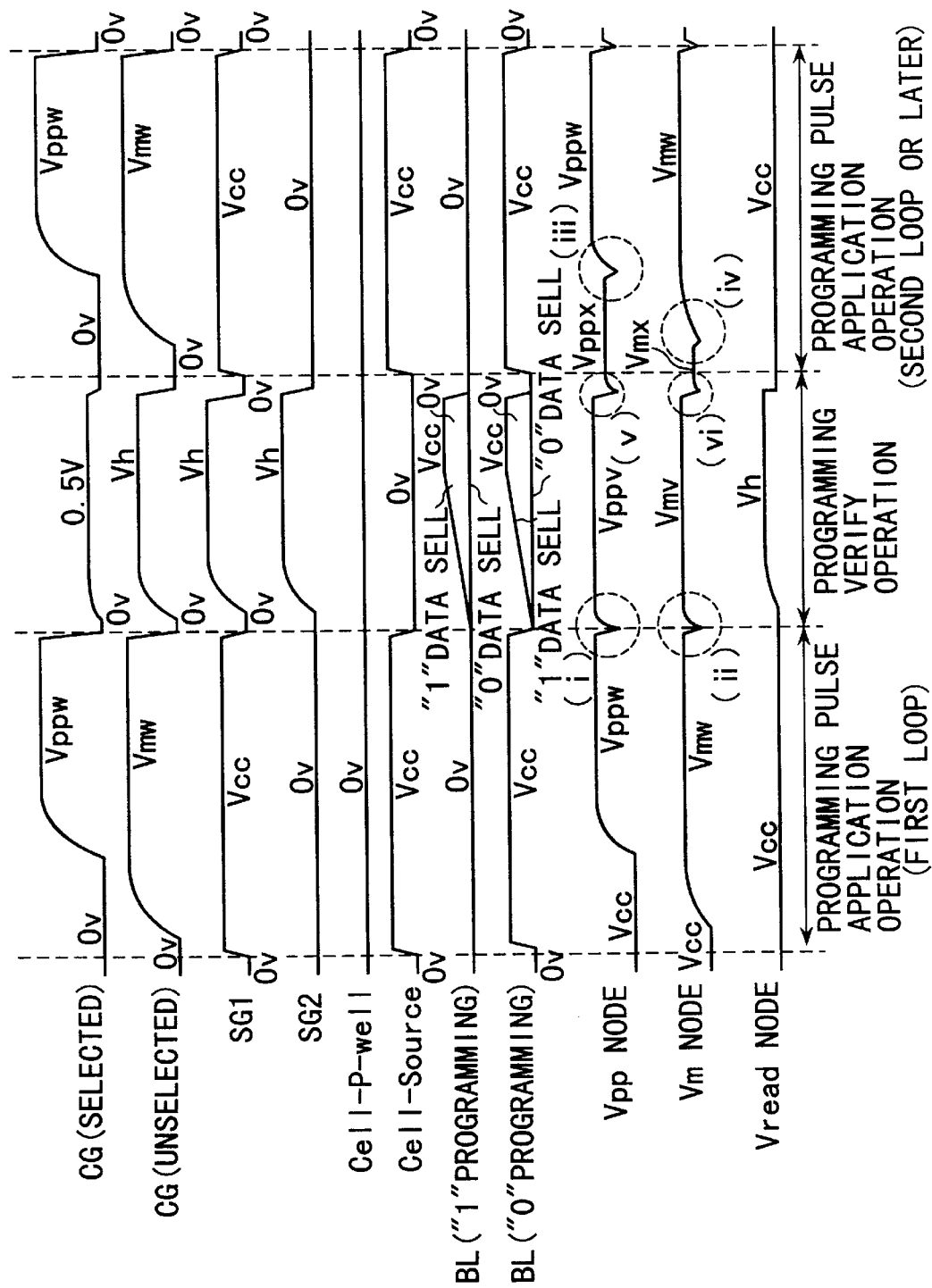
FIG. 27 is a waveform showing a timing of the programming pulse application operation and the programming verify operation when using the method which makes high voltage for programming and the limit voltage setting voltage of the intermediate voltage low compared with the other periods in the period (v) to (iii) and (vi) to (iv) in FIG. 27 as the eighth embodiment of the present invention.

Moreover, FIG. 27 shows a method of lowering the limit voltage setting voltage of the high voltage and the intermediate voltage for programming in the periods of (v) to (iii) and in the periods of (vi) to (iv) in the operation waveform compared with the other period as an eighth embodiment.

This method is advantageous in a case the capacitance of the Vpp node in the periods of (v) to (iii) is especially small compared with in the other period in the operation waveform shown in FIG. 16, and the capacitance of the Vpp node is substantially the same in the other period, and in a case the capacitance of the Vm node is especially small in the periods of (vi) to (iv) compared with in the other period, and the capacitance of the Vm node is substantially the same in the other period.

As described above, the present is also advantageous in a case the high-voltage limit voltage setting voltage for programming is set to low over the part of the period at the high voltage non-application for programming to the cell transistor, in addition to the case the high-voltage limit voltage setting voltage for programming is set to low over whole periods of the high voltage non-application for programming to the cell transistor to the high-voltage limit voltage setting voltage for programming at the high voltage application for programming to the cell transistor.

By using the present invention, the Vpp level is lowered only in the part of the period at non-application compared with at the high voltage application to the cell transistor. The present invention is advantageous since the voltage stress reduction to the transistor can be realized even when the Vpp level is a high level like the conventional method in the other period.

That is, since the EEPROM of the NAND cell type of the above embodiment comprises the high-voltage limit voltage setting voltage for programming in the part or whole periods at high voltage non-application for programming to the cell transistor or all periods, and means for setting to be different from the high-voltage limit voltage setting voltage for programming at high voltage application for programming to the cell transistor, the high-voltage limit voltage setting voltage for programming can be set lower than the high-voltage limit voltage setting voltage for programming at high voltage application for programming.

Therefore, without lowering of the high-voltage charging speed for programming at data programming operation, i.e., without lowering data programming operation speed, the voltage stress applied over the transistor at high voltage non-application for programming to the cell transistor can be more largely reduced than the conventional ones, and the reliability of the device can be largely improved.

In the above embodiment, a case that the number of the cell transistors connected in series in one NAND cell is eight is explained, but the number of the cell transistors connected in series in addition to eight can also apply the present invention according to the above embodiment in case of 2, 4, 16, 32, 64 and so on.

The present invention can be applied to other EEPROM (NOR-type EEPROM, DINOR type EEPROM, AND-type EEPROM, and so on) in addition to NAND-type EEPROM like the above embodiment according to the above embodiment.

Figure 28:
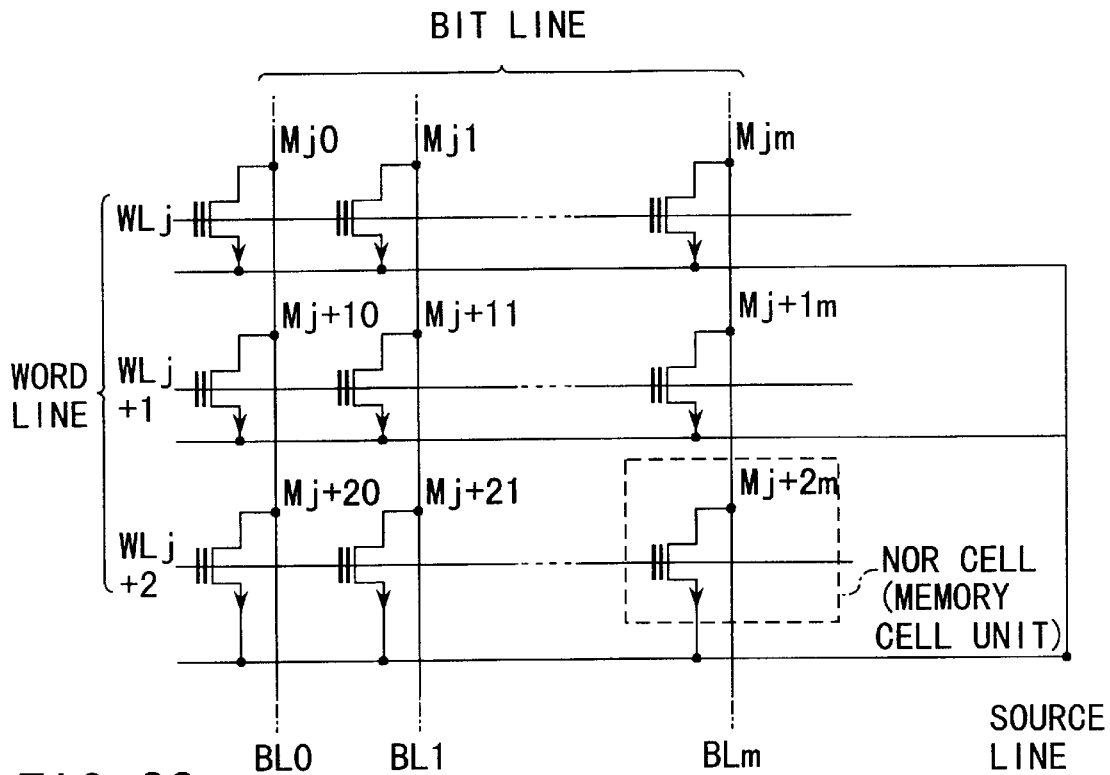
FIG. 28 is a circuit diagram showing a part of the memory cell array of the NOR type EEPROM having no select transistor.

FIG. 28 is an equivalent circuit diagram showing a part of the memory cell array of the NOR type EEPROM which does not have a select transistor.

In the memory cell array, one cell transistor which is controlled by word line WLi is connected between bitline BLi and the source line normal thereto.

Figure 29:
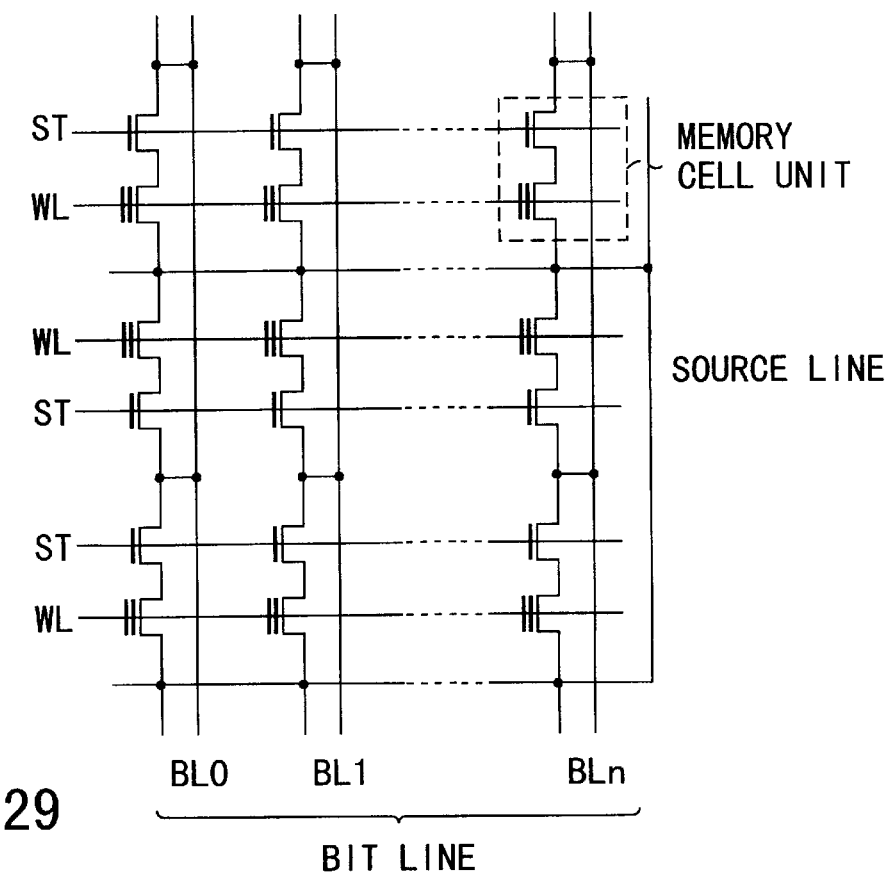
FIG. 29 is a circuit diagram showing a part of the memory cell array of NOR type EEPROM with the select transistor.

FIG. 29 is an equivalent circuit diagram showing a part of the memory cell array of a NOR type EEPROM with the select transistor.

In the memory cell array, one cell transistor controlled by the word line WL and one select gate transistor controlled by select gate line ST are connected in series between bitline BLi and the source line normal thereto.

Figure 30:
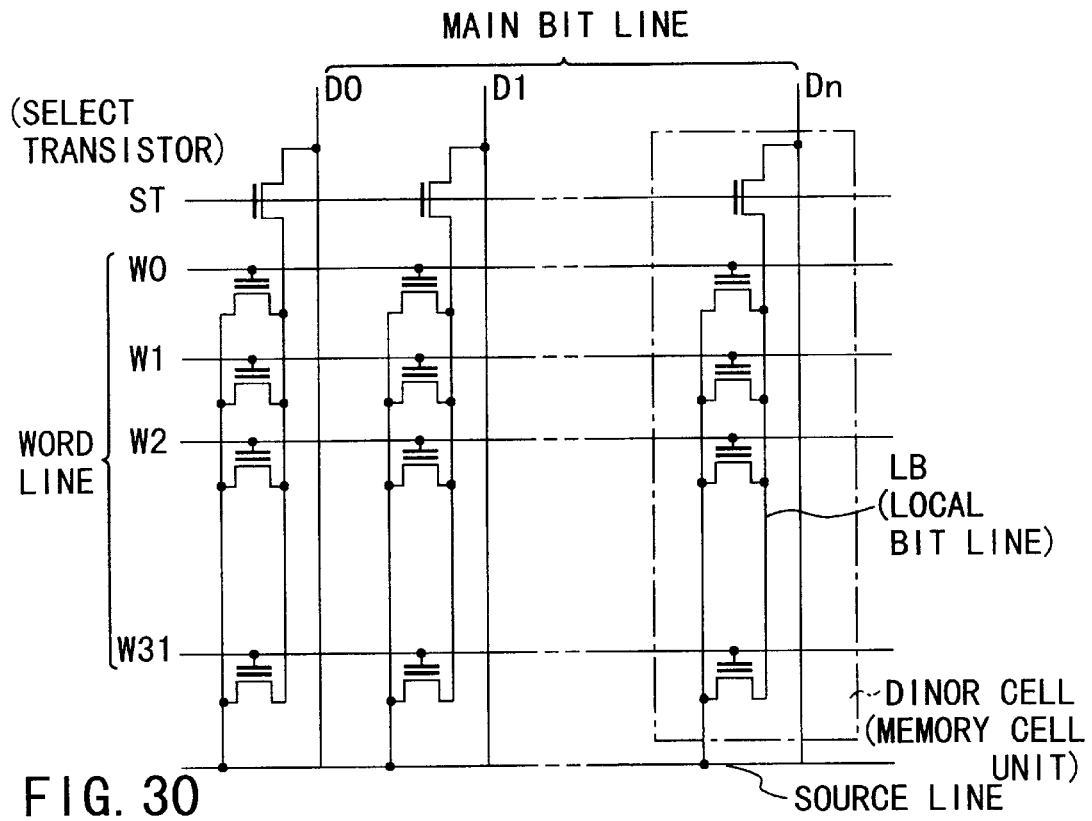
FIG. 30 is a circuit diagram showing a part of the memory cell array of DINOR type EEPROM.

FIG. 30 is an equivalent circuit diagram showing a part of the memory cell array of DINOR type EEPROM.

In the memory cell array, one cell transistor which is controlled by the word line Wi is connected to one local bitline (sub bitline) LB and the source line in parallel, and the local bitline LB is connected to bitline BLi through the bitline side select gate transistor which is controlled by select gate line ST. The DINOR-type EEPROM is disclosed in, for example "H.Onoda et al., IEDM Tech Digest, 1992, pp. 599–602", in detail.

Figure 31:
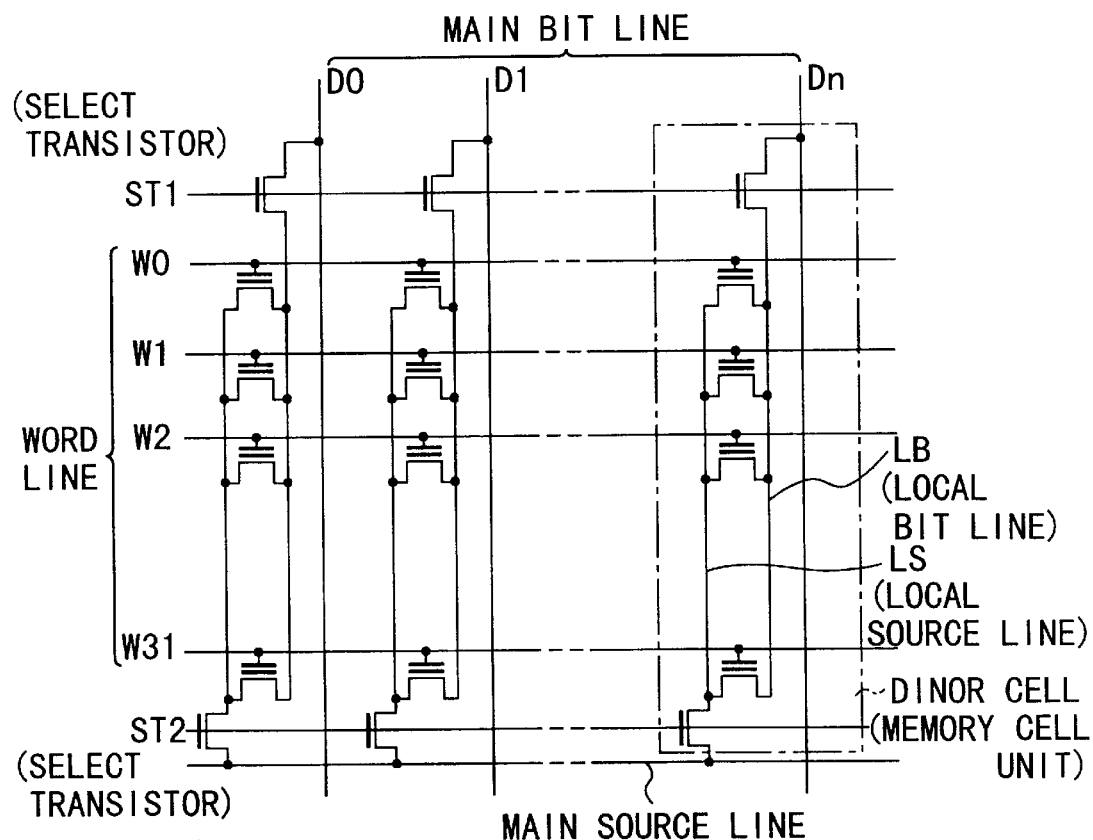
FIG. 31 is a circuit diagram showing a part of the memory cell array of AND-type EEPROM.

FIG. 31 is an equivalent circuit diagram showing a part of the memory cell array of AND-type EEPROM.

In the memory cell array, between bitline BLi and the source line, a bitline side select gate transistor which is controlled by first select gate line ST1, a plurality of cell transistors connected to each other in parallel which are controlled by the word line Wi, and a source line side select gate transistor which is controlled by second select gate line ST2 are connected in series. The AND-type EEPROM is disclosed in, for example "H.Kume et al., Elucidated to IEDM Tech Digest, 1992, pp. 991–993", in detail.

Figure 32:
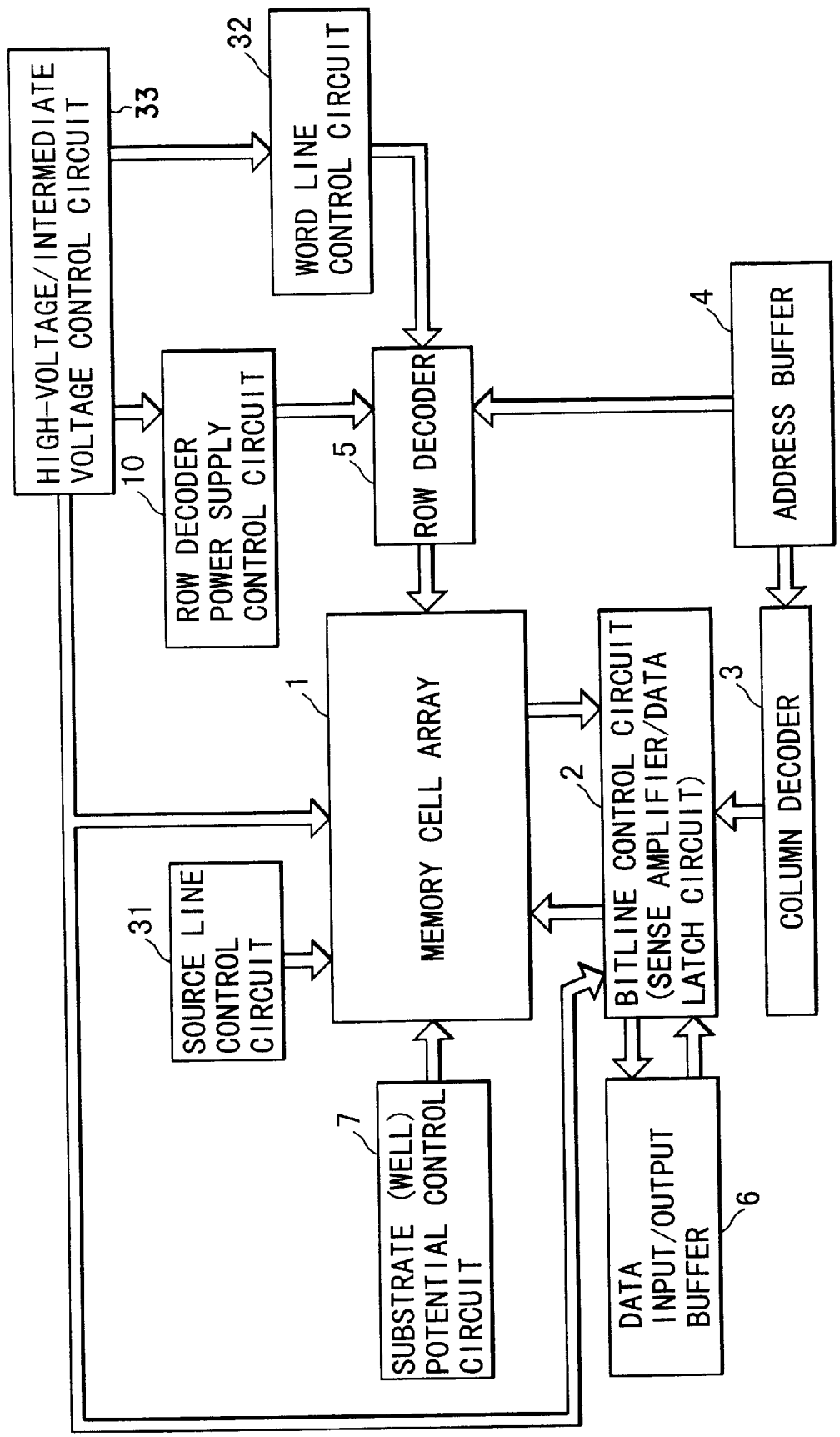
FIG. 32 is a block diagram showing a schematic structure of the NAND-cell type EEPROM according to a ninth embodiment.

FIG. 32 is a block diagram showing a structure of the NAND-cell type EEPROM according to the ninth embodiment of the present invention. The same reference numerals are denoted the same elements as FIG. 5A.

The bitline control circuit 2 is provided to perform data read for data programming, reprogramming, programming verify read and erase verify read for memory cell array 1. The bitline control circuit 2 is connected to the data input/output buffer 6 and receives the output of the column decoder 3 which receives an address signal from address buffer 4 as the input. Also, the row decoder circuit (word line selecting means) 5 is provided to control a control gate and a select gate to memory cell array 1 and the well voltage control circuit 7 for memory cell array 1 to control the voltage Cell-p-well of the formed p-type well is provided. The source line control circuit 8 is provided to control the source line voltage Cell-Source in the cell array.

Figure 33:
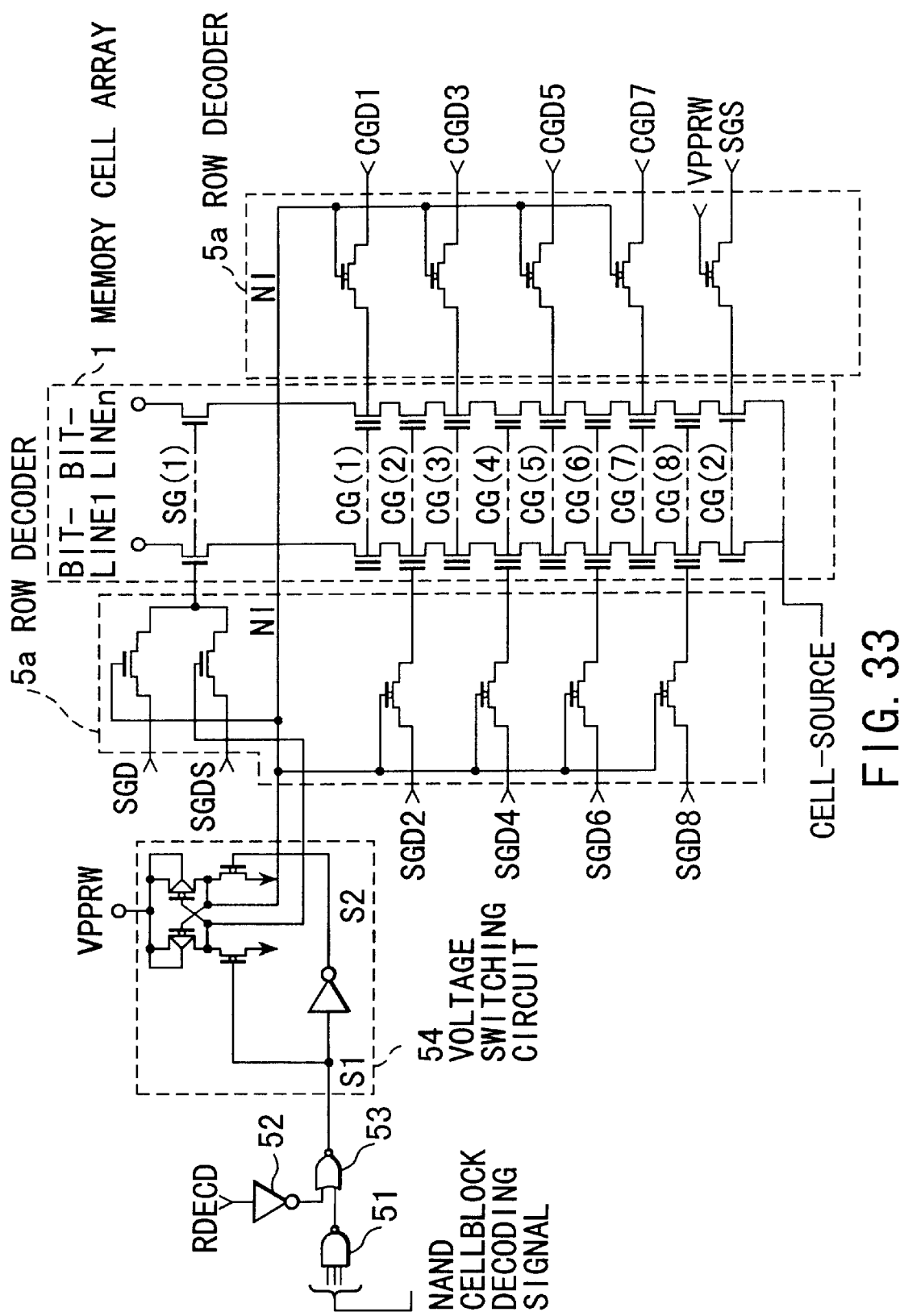
FIG. 33 shows the row decoder circuit and the part of the memory cell array according to the ninth embodiment.

The word line control circuit 9 is provided to control the voltage of the word line (control gate line) in the selected block and the row decoder power supply control circuit 10 is provided to control the voltage of the row decoder power supply (corresponding to FIG. 33 VPPRW). Moreover, to generate and supply the high voltage and the intermediate voltage for programming and the high voltage for erase to the power supply of the p-type well during the erase operation and the word line, the bitline and the row decoder which are in the programming operation, the high voltage and intermediate voltage generating circuit 33 is provided.

The bitline control circuit 2 consists of a CMOS flip-flop mainly, and performs a sense operation to latch data for programming and read the voltage the bitline, a sense operation for the verify read after programming, and the latch of the reprogrammed data.

Figure 34:
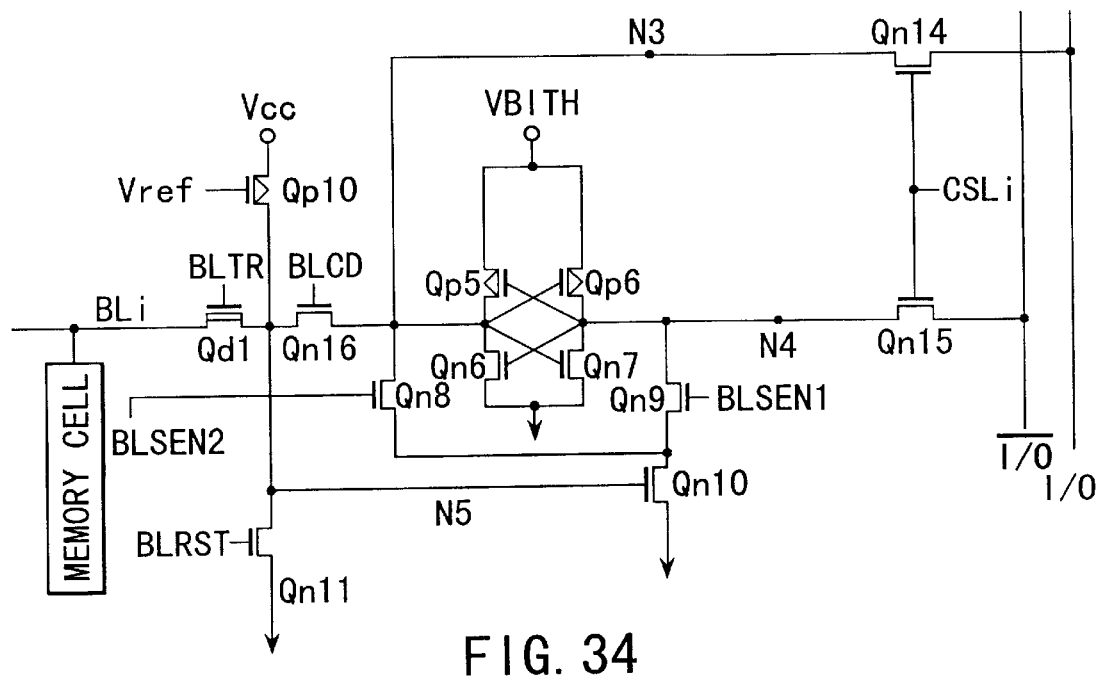
FIG. 34 shows the part of the bitline control circuit according to the ninth embodiment.
Figure 36:
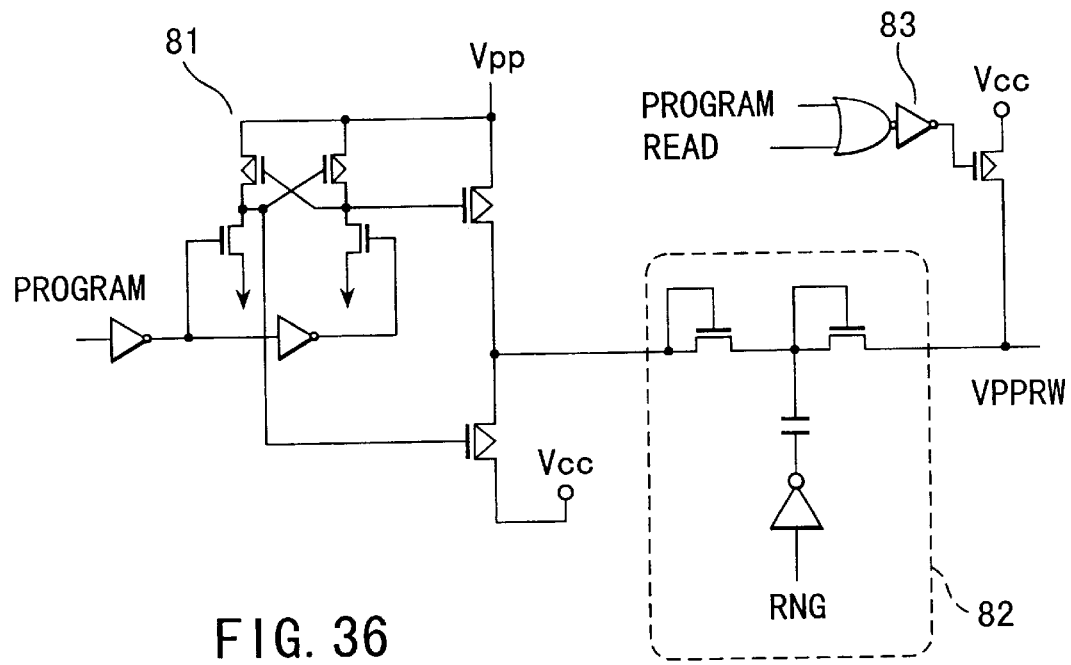
FIG. 36 shows the structural example of the booster circuit in the row decoder power supply control circuit according to the ninth embodiment.
Figure 35A:
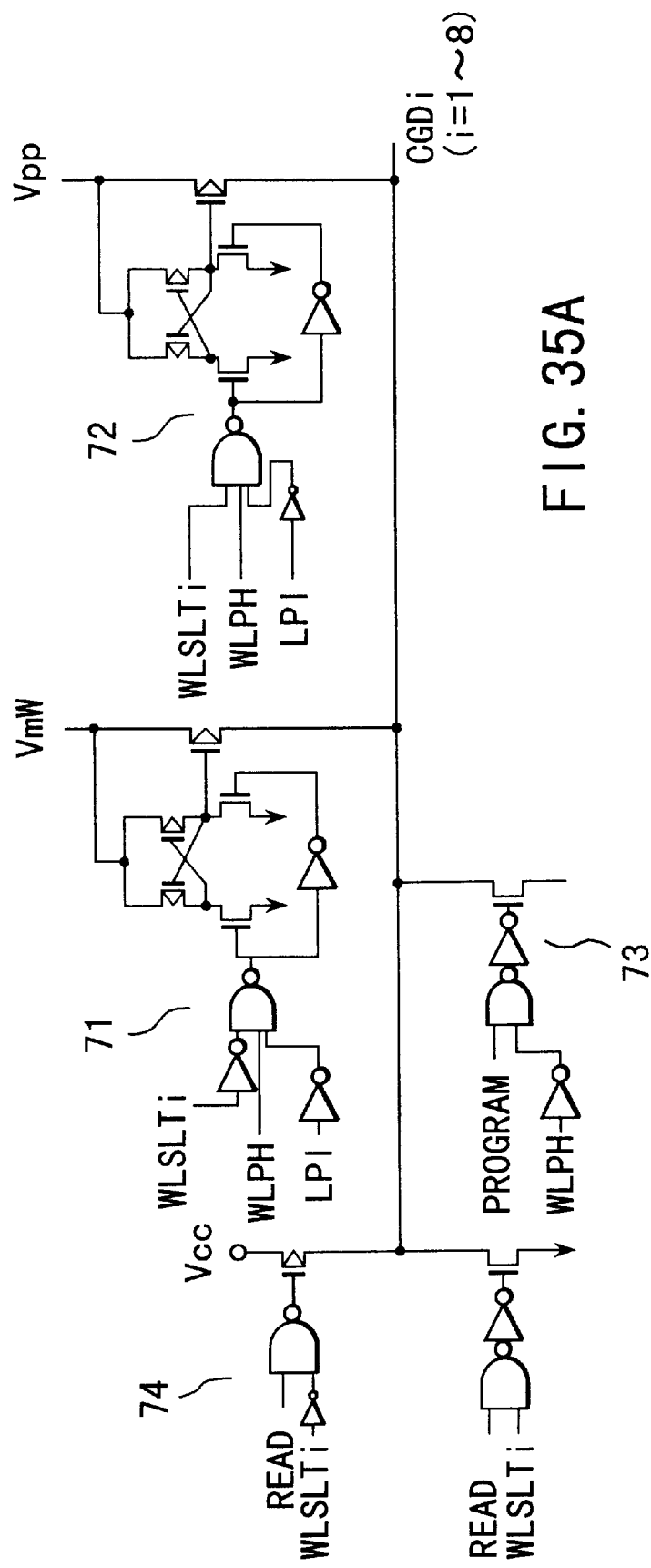
FIGS. 35A and 35B show the word line control circuit according to the ninth embodiment.
Figure 35B:
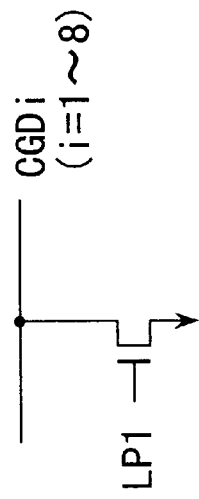
Figure 37:
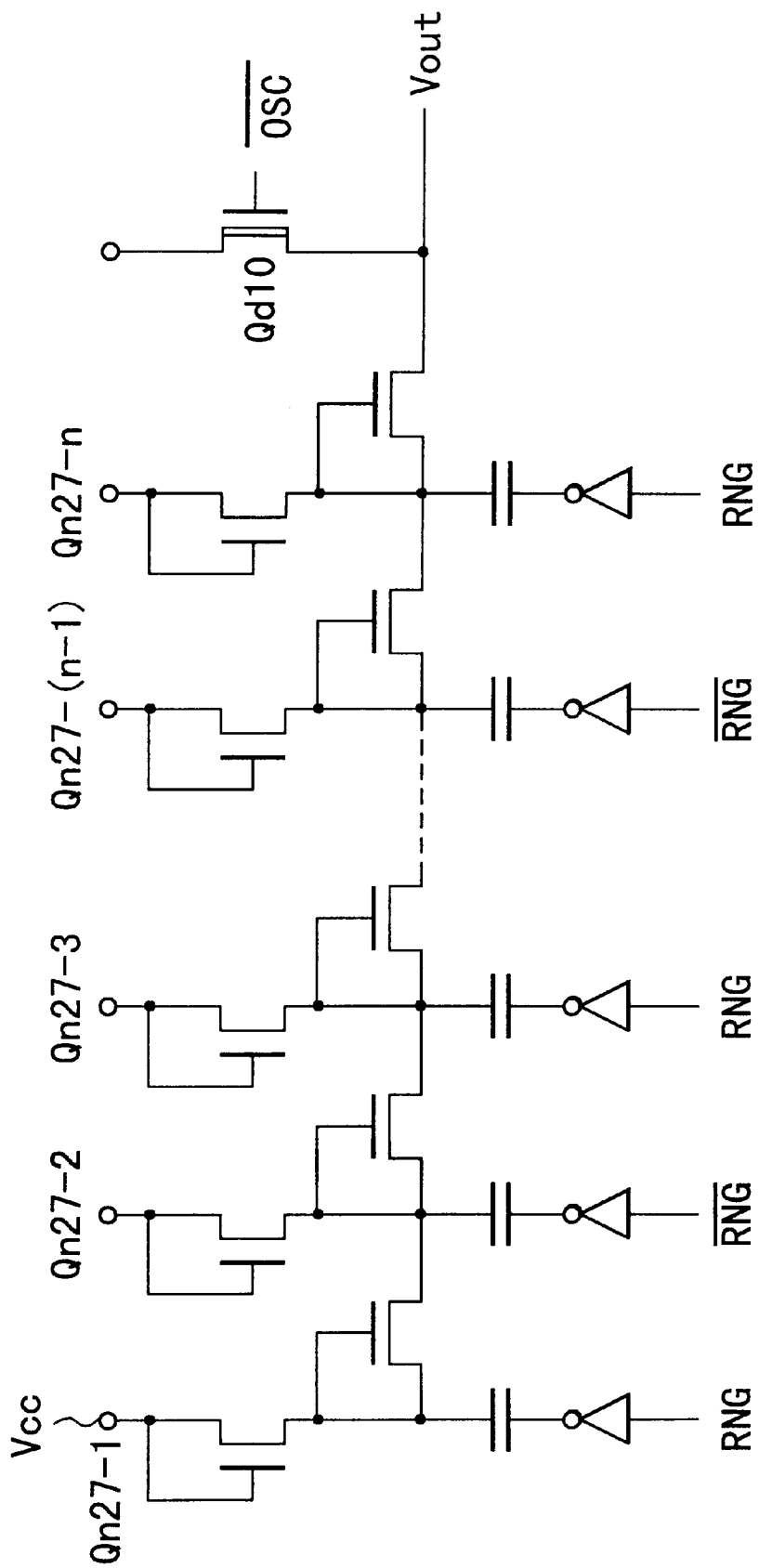
FIG. 37 shows the high voltage and the intermediate voltage generating circuit according to the ninth embodiment.
Figure 38:
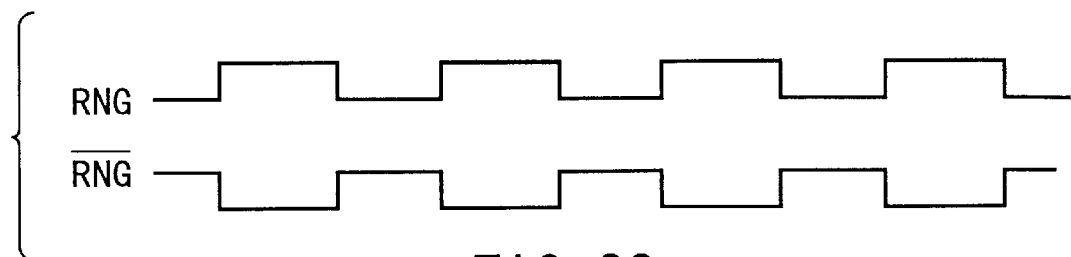
FIG. 38 shows the driving signal waveform of the high voltage and the intermediate voltage generating circuit according to the ninth embodiment.
Figure 39:
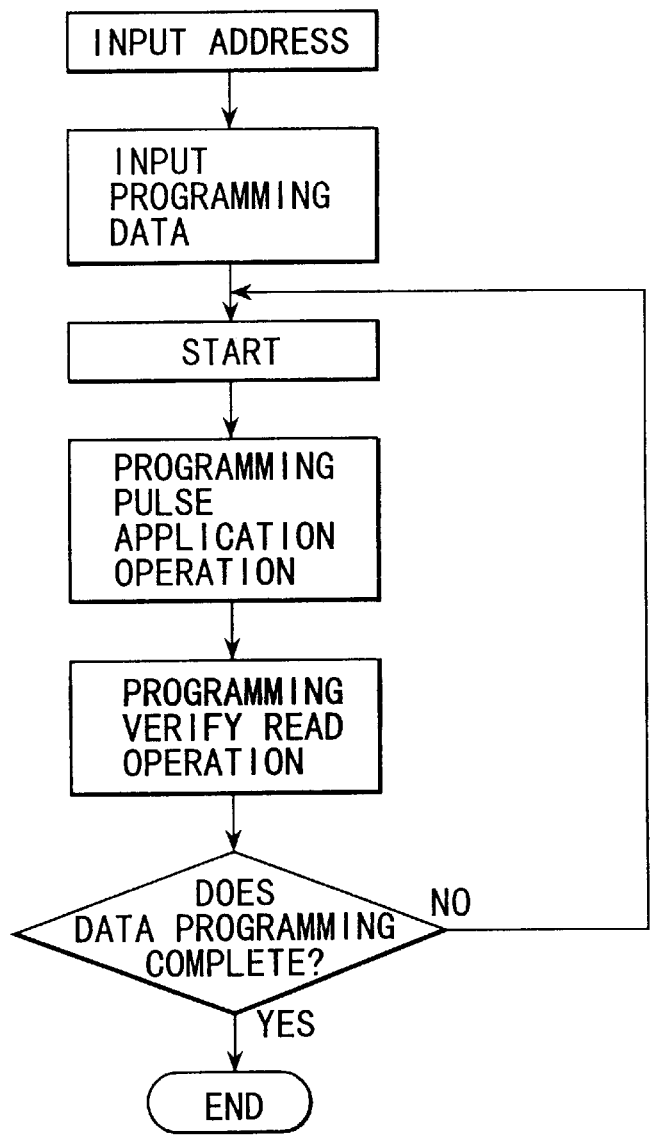
FIG. 39 shows the algorithm of the data programming operation according to the ninth embodiment.

FIG. 33 shows a part of the row decoder circuit 5 according to this embodiment and the memory cell array 1, FIG. 34 shows a part of the bitline control circuit 2, FIGS. 35A and 35B show the word line control circuit 9 and FIG. 36 shows the row decoder power supply control circuit 10. FIG. 37 shows a structural example of the booster circuit contained in the high voltage and intermediate voltage generating circuit 33. At least three kinds for Vpp, Vmw, Vmb are contained in the high voltage and intermediate voltage generating circuit 33 as booster circuit shown in the FIG. 37. FIG. 38 shows the input signal waveform of the booster circuit (high voltage and intermediate voltage generating circuit 33, booster circuit section 82 at row decoder power supply control circuit 10 and so on) and FIG. 39 shows an algorithm when data programming operation.

In FIG. 33, the NAND-cell block decoding signal and row decoder starting signal RDECD are inputted from NAND gate 51 and NOT gate 52 through NOR gate 53 for every block and the voltage is switched by the voltage switching circuit 54. The above signal is supplied from the voltage switching circuit 54 to the row decoders 5a and 5b via the node N1 and to the memory cell array 1 which is composed of a plurality of memory cells.

In FIG. 34, the CMOS flip-flop which constructs a sense amplifier circuit is provided for a predetermined number of bitlines Bli, a CMOS inverter with a signal synchronous method composed by an E-type p-channel MOS transistor Qp5 and an E-type n-channel MOS transistor Qn6, and constructed by the CMOS inverter with a signal synchronous method composed by an E-type p-channel MOS transistor Qp6 and an E-type n-channel MOS transistor Qn7. The output node N3 of this CMOS flip-flop connected to the bitline BLi through the E-type n-channel MOS transistor Qn16 controlled by the signal BLCD and the D-type n-channel MOS transistor Qd1 controlled by the signal BLTR.

Transistors Qn8 and Qn10 are allocated between the CMOS flip-flop output node N3 and the ground voltage. Transistors Qn9 and Qn10 are allocated between the CMOS flip-flop output node N4 and the ground voltage. The transistors Qn8, Qn9 and Qn10 are used when resetting a flip-flop data in case of read operation and programming and erase verify operations and sensing the bitline voltage.

A transistor Qn11 is allocated between the node N5 which is the connection point of Qn16 and Qd1 and the ground voltage, and the Qn11 is used in the bitline when discharging to 0V. Moreover, the transistor Qp10 is allocated between the node N5 and Vcc. Then, the threshold voltage of the selected memory cell in the NAND-cell is judged by the ratio of the ability to charge the bitline through transistor Qp10 and the ability to discharge the bitline through the NAND-cell. Also, two nodes N3 and N4 of the CMOS flip-flop are connected to the input/output line I/O, /I/O respectively through the transistors Qnl4, Qnl5 which are the transfer gate controlled by the column selection signal CSLi.

The word line control circuit of FIGS. 35A and 35B comprises a circuit 71 which gives Vmw to CGDi (i=1 to 8) by the signals WLSLTi, WLPH, LP1, a circuit 72 which gives Vpp to CGDi by the signals WLSLTi, WLPH, LP1, a circuit 73 which gives ground voltage to CGDi by the signals PROGRAM, WLPH, and a circuit 74 which gives Vcc or ground voltage to CGDi by the signals READ, WLSLTi.

The row decoder power supply control circuit of FIG. 36 is composed of a circuit 81 which outputs Vpp or Vcc by signal PROGRAM, a booster circuit section 82 to make row decoder power supply VPPRW higher than Vpp and a circuit 83 which gives Vcc to VPPRW by the signals PROGRAM, READ.

FIG. 37 shows the booster circuit structure example contained in the high voltage and intermediate voltage generating circuit 33. Usually, this circuit is called an n-number of stages booster circuit or the booster circuit with n-stages since a plurality of transistors, capacitors and the n nodes to which capacitors are connected in series. Then, the voltage higher than Vcc is generated and applied by controlling the timing of the input signals RNG and /RNG.

In the data programming operation according to the embodiment, first, the address input to program data and the programmed data input are performed. Immediately after data input, N3 and N4 in FIG. 34 is set to Vcc and 0V, respectively, of in the bitline control circuit corresponding to the "0" data programming, and in the bitline control circuit which corresponds to the "1" data programming, N3 and N4 are set to 0V and Vcc, respectively. Next, data programming operation is started.

Whether the data programming in the selected memory cell is completed by verifying the read data when programming verify read operation after programming pulse application operation and read operation. When complete, data programming operation terminates. When not complete, programming pulse application operation and a programming verify read operation until completing the operation is preformed repeatedly. This repeating operation is called a programming loop in a later explanation, and a set of a programming pulse application operation and read operation are called as once of loops.

The case where CG(3) is selected among eight word lines in the NAND-cell will be explained for the example in this embodiment, but the same can be preformed when the other seven word lines are selected.

Figure 40:
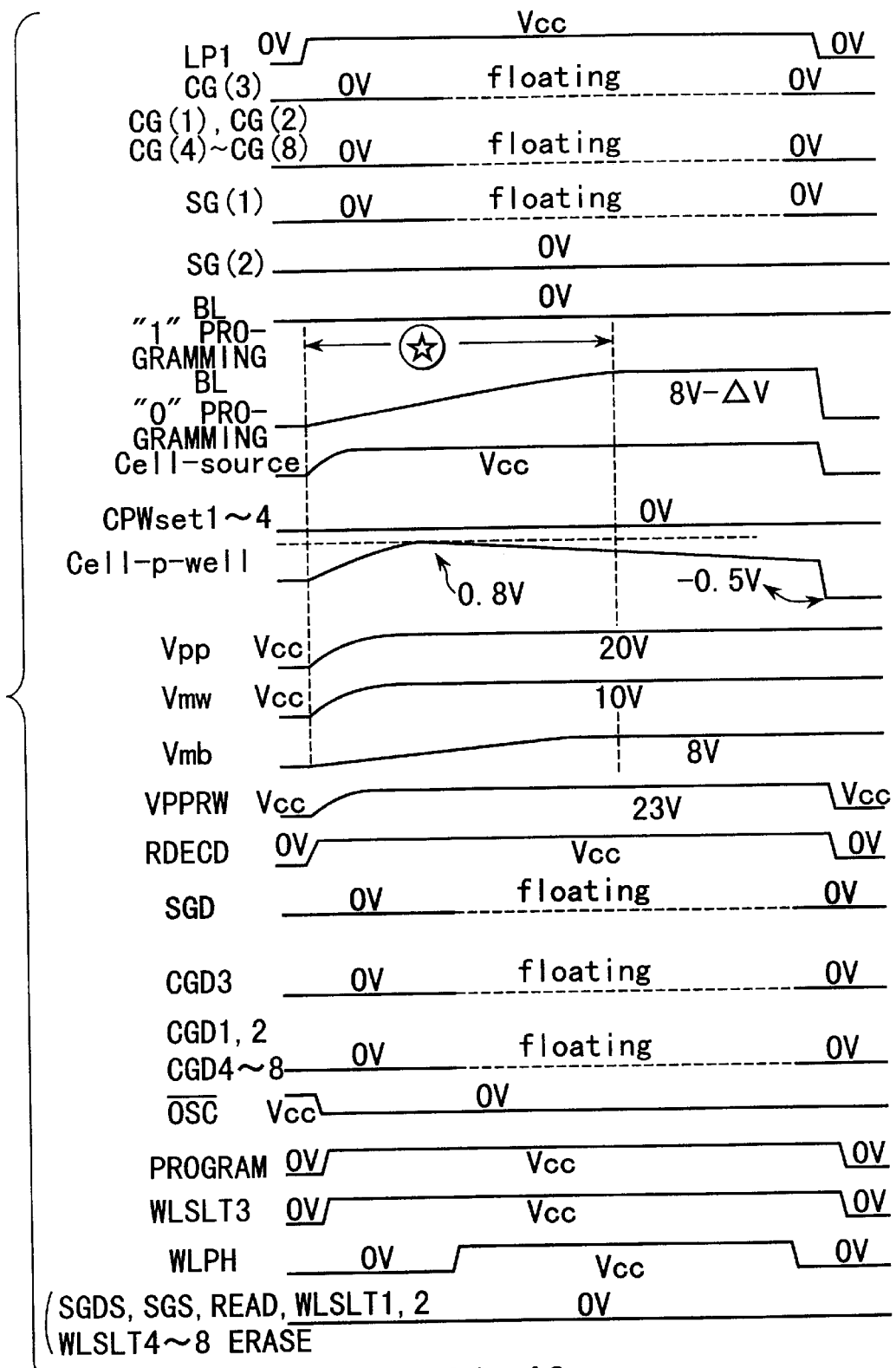
FIG. 40 shows the timing of the programming pulse application operation at a first loop according to the ninth embodiment.
Figure 41:
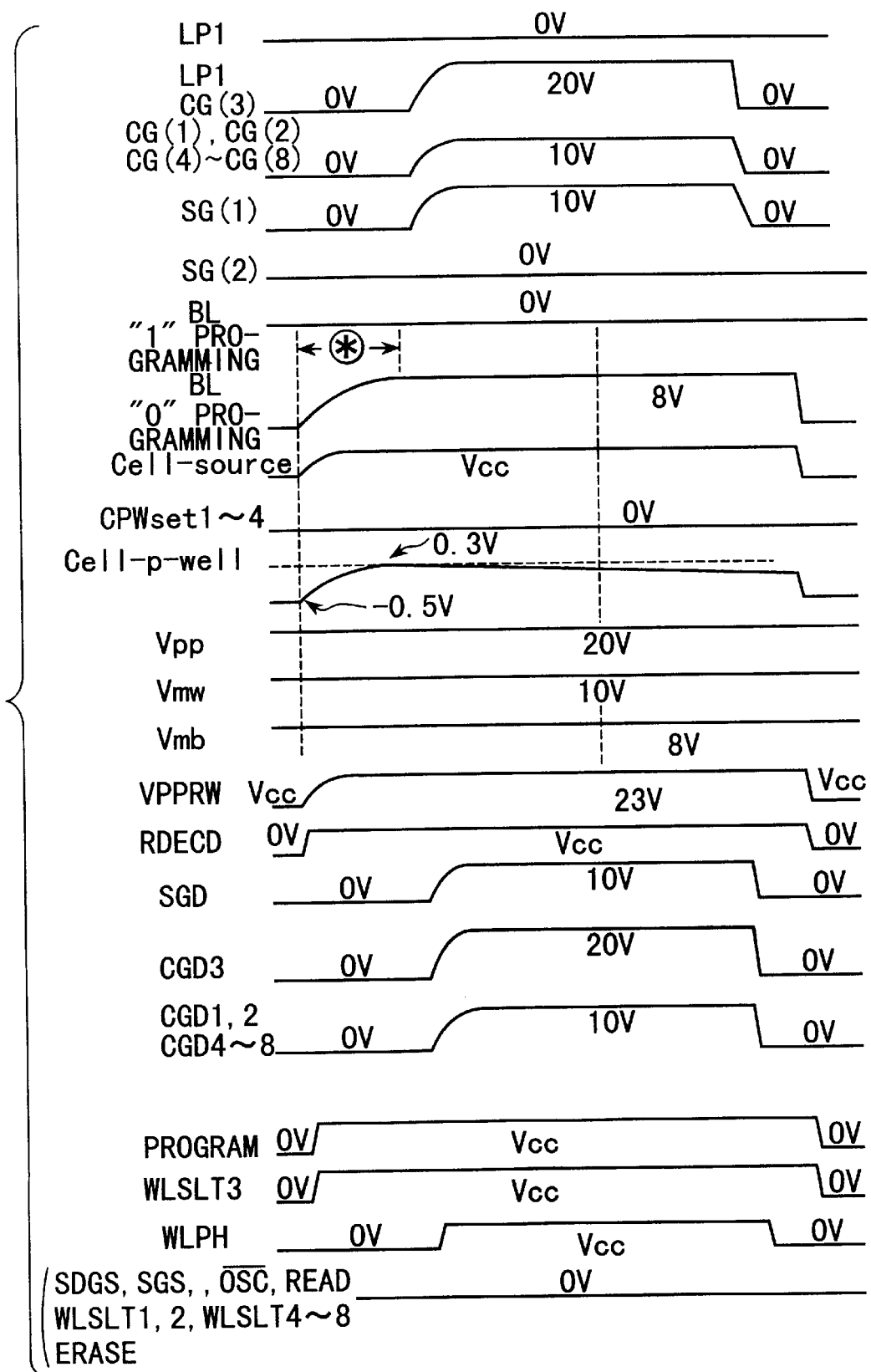
FIG. 41 shows the timing of the programming pulse application operation at second loop or later according to the ninth embodiment.
Figure 42:
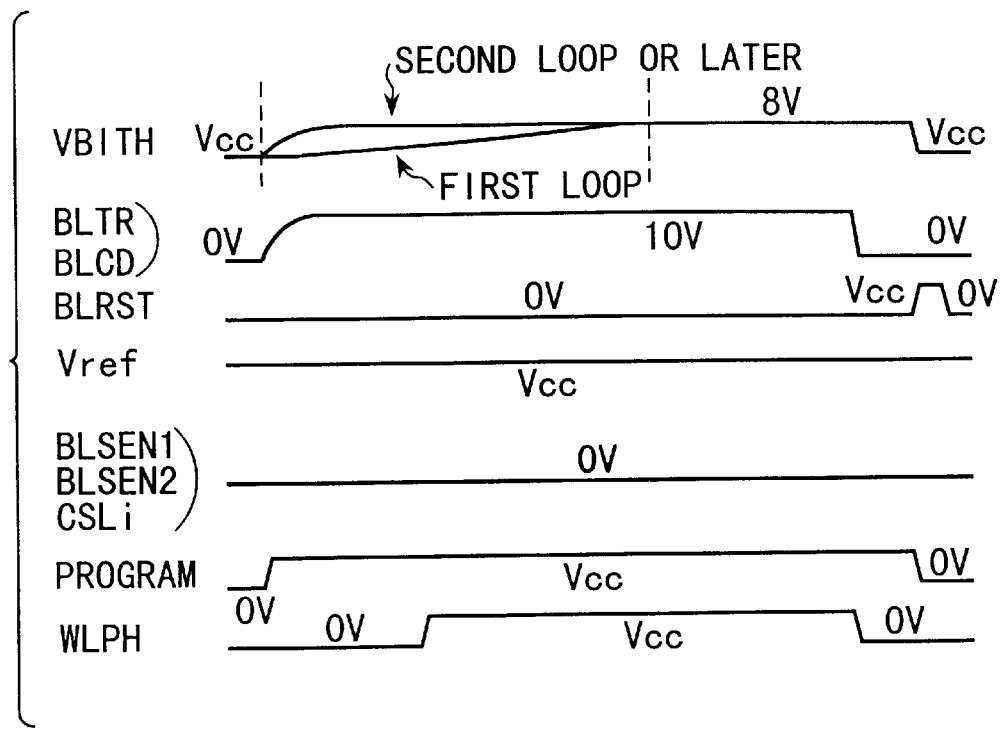
FIG. 42 shows the timing of the programming pulse application operation according to the ninth embodiment.
Figure 43:
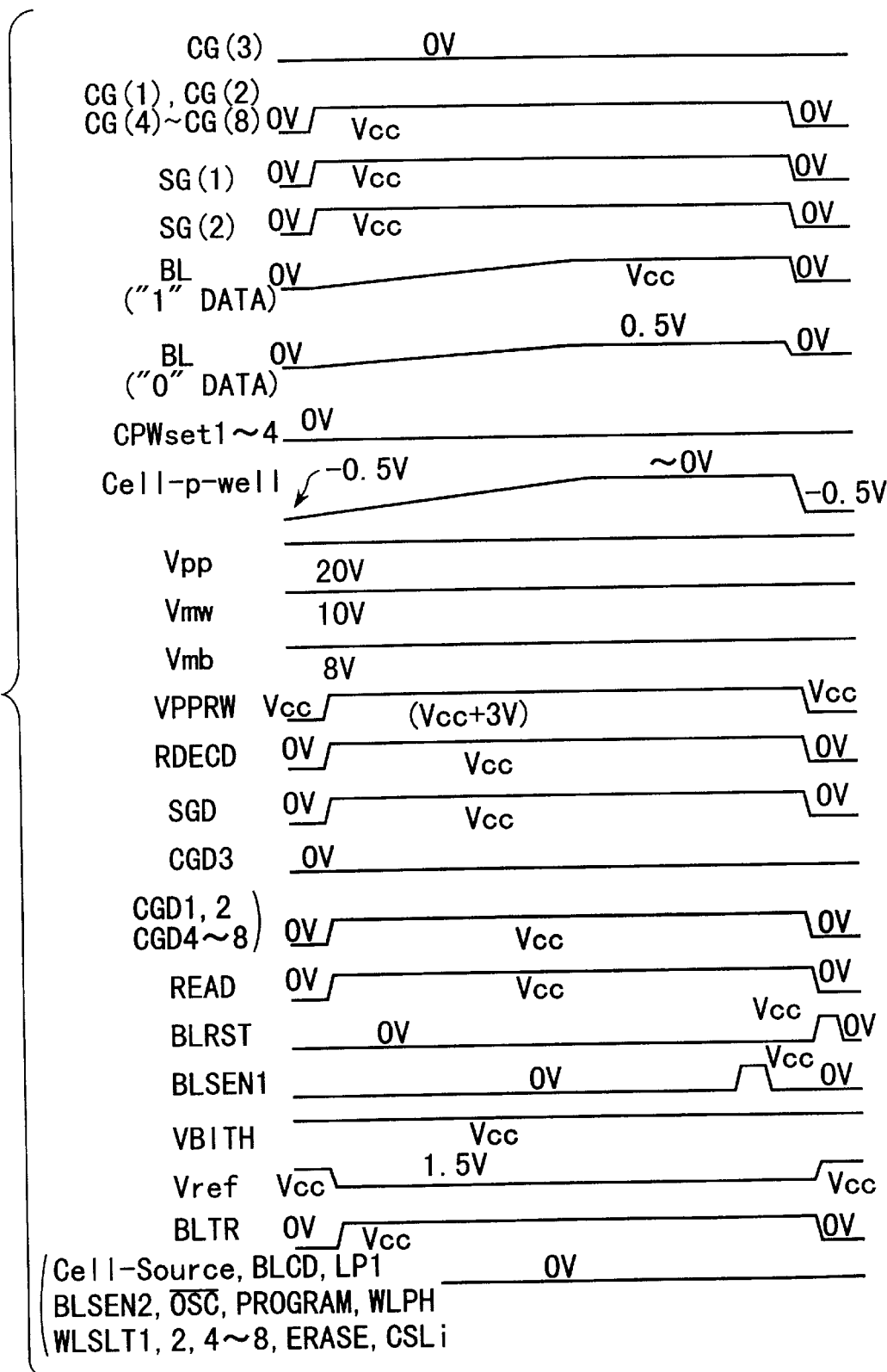
FIG. 43 shows the timing of the programming verify read operation according to the ninth embodiment.

FIG. 40 shows an operation timing chart of surroundings of the memory cell and the row decoder relating device at programming pulse application operation (first programming pulse application operation) of first programming loop. FIG. 41 also shows an operation timing chart of surroundings of the memory cell and the row decoder relating device at programming pulse application operation of second programming loop or later. Also, FIG. 42 shows an operation timing chart when reading the operation timing chart of the bitline control circuit relating device at programming pulse application and FIG. 43 shows an operation at programming verify read operation. SG(1), SG(2) and CG(1) to CG(8) of FIGS. 40 to 43 indicate select gate lines and control gate lines in the selected block.

Therefore, based on the circuit diagrams of FIGS. 33 to 37, an explanation of the programming pulse application operation at first programming loop will be described with reference to FIGS. 40 and 42. When an operation starts, a signal LP1 (signal which becomes "H" only in case of programming pulse application operation at the first loop), a signal PROGRAM (signal which becomes "H" during programming pulse application operation), a signal WLSLT3 (WLSLTi (i=1 to 8) is the signal which becomes "H" when CG(i) selection a PROGRAM or READ signal is in the "H" level), and a signal RDECD (row decoder starting signal) becomes from 0V to Vcc.

Vpp (High-voltage generating circuit output node for programming) set to Vcc before operation starting, Vmw (output node of intermediate voltage (10V) generating circuit in which the intermediate voltage is applied to the unselected word line in the selected block in case of programming pulse application operation), and Vmb (output node of intermediate voltage (8V) generating circuit in which the intermediate voltage is applied to the "0" data programming bitline in case of programming pulse application operation) are started to boost the voltage.

Since charging by from 0V to Vcc of the source line is started and charging from 0V to (8V–ΔV) of signals BLTR, BLCD is started, the connection of the bitline and the programmed data latch circuit in the bitline control circuit is started. Therefore, Vmb, VBITH and "0" data programming bitline are connected and charging by from 0V to 8V of "0" data programming bitline is started.

After keeping this state for a while, when signal WLPH becomes Vcc, then the voltage output from the word line control circuit suspends, CGD1 to CGD8 become a floating state keeping 0V, and SGD, also, becomes a floating state, thereby SG(1), CG(1) to CG(8), also, become a floating state keeping 0V. When WLPH becomes 0V after this state is kept for a while, CGD1 to CGD8, SG(1), and CG(1) to CG(8) are again fixed to 0V.

Thereafter, all bitlines become 0V and the programming pulse application operation terminated. In this case, since only for about 0V applied to the word line in the selected block, data programming into the memory cell is not performed. Also, the explanation of signal CPWset1 to CPWset4 and the level of the "0" data programming bitline, (8V–ΔV) and Cell-p-well becoming about 0.8V will be explained later with reference to FIGS. 44A and 44B.

Based on the circuit diagram of FIGS. 33 to 37, an explanation of the programming pulse application operation of second programming loop or later according to FIGS. 41 and 42. When the operation starts, a signal LP1 is as fixed to 0V and signal PROGRAM, signal WLSLT3, signal RDECD become from 0V to Vcc. Each high voltage and the intermediate voltage generating circuits continues the voltage generation operation including the programming verify read operation after data programming operation starting (see FIG. 43 and the explanation of the programming verify read operation described later in details), Vpp, Vmw, and Vmb are in 20V, 10V, and 8V, respectively from operation starting of the FIG. 41.

At this time, since charging from 0V to Vcc of the source line is started, and charging from 0V to 10V of signals BLTR, BLCD is started, a connection of the bitline and the programmed data latch circuit in the bitline control circuit is started, Vmb, VBITH and "0" data programming bitline are connected, and a charging from 0V to 8V of "0" data programming bitline is started.

When a signal WLPH becomes Vcc after keeping this state for a while, the word line control circuit outputs 20V to CGD3 and outputs 10V to CGD1, CGD2, and CGD4 to CGD8. SGD, also, becomes 10V, CG(3) becomes 20V, SG(1), CG(1), CG(2), and CG(4) to CG(8) become 10V. In this case, the row decoder power supply VPPRW is boosted to 20V+3V=23V by the circuit of FIG. 36 and also in case of threshold voltage Vth of the n-channel MOS transistor between CGD3 and CG(3)<3V, the voltage is transferred to CG(3) from CGD3 without voltage drop.

In this way, to apply the voltage higher than CGDi to the gate of the transistor among VPPRW, and CGDi (i=1 to 8) and CG(i) from the viewpoint to transfer the voltage to CG(i) from CGDi (i=1 to 8) without voltage drop, a booster circuit section 82 in FIG. 36 is provided. This state is kept for a while and data programming in the memory cell is performed. In other words, the threshold voltage of the selected memory cell in the NAND-cell connected to the "1" data programming bitline rises. Subsequently, when the WLPH becomes 0V, all bitlines become 0V and the programming pulse application operation terminates after discharging CGD1 to CGD8 and SG(1), CG(1) to CG(8) to 0V.

Figure 44A:
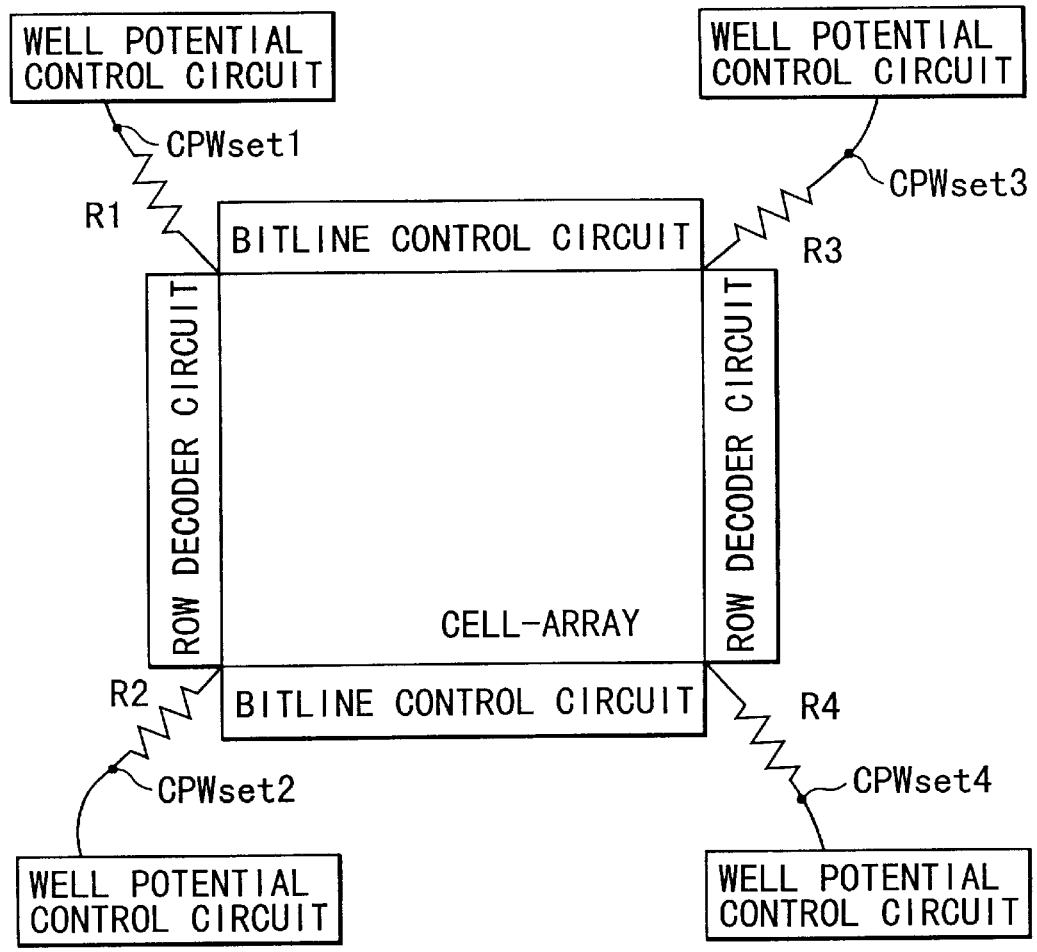
FIGS. 44A and 44B show an example of an arrangement and a structure of the well voltage control circuit according to the ninth embodiment.
Figure 44B:
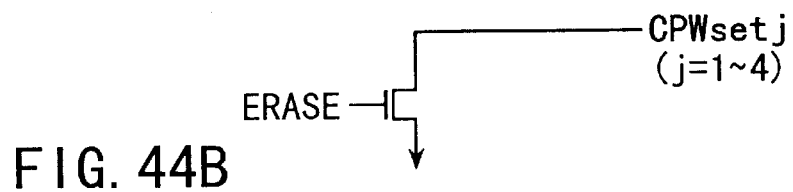

The explanation of signal CPWset1 to CPWset4 and a waveform of Cell-p-well will be explained later with reference to FIGS. 44A and 44B.

Based on the circuit diagram of FIGS. 33 to 37, a programming verify read operation will be explained according to FIG. 43. When the operation starts, a signal READ becomes "H" and the row decoder power supply VPPRW becomes from Vcc to Vcc+3V. At this time, SG(1), CG(1), CG(2), CG(4) to CG(8) are charges to Vcc and CG(3) is kept at 0V.

The p-channel MOS transistor Qp10 in FIG. 34 becomes an on state since Vref becomes from vcc to 1.5V and since a signal BLTR becomes Vcc, bitline charging through Qp10, Qd1 is started. But, at this time, since the difference between the gate voltage and the source voltage of Qp10 is small as Vcc−1.5V, the bitline charge current (hereinafter referred to as a reference current Iref), becomes a small value (e.g., about 3 $\mu$A).

This state is kept for a while. At this time, since seven unselected word lines CG(1) in the NAND cell, CG(2), CG(4) to CG(8) are Vcc, and CG(3) is 0V, at the NAND cell in which the selected memory cell is "0" data (threshold voltage is negative), the cell current is Icell=Iref at the time of the bitline voltage=0.5V (Iref>Icell at bitline voltage<0.5V, Icell>Iref, at bitline voltage>0.5V), then the bitline voltage is fixed to 0.5V. On the other hand, at the NAND-cell that the selected memory cell is "1" data (threshold voltage is positive), since Icell is extremely small, Iref>Icell when the bitline voltage is about Vcc and the bitline is charged at Vcc.

Next, the signal BLSENI becomes Vcc and bitline voltage sensed. Usually, the bitline voltage corresponding to the selected memory cell whose data is "0", "1" and the threshold voltage VthC of the sense amplifier circuit is set to 0.5V<VthC<Vcc sensed as "L", "H" level respectively. Since the signal BLRST becomes Vcc, all bitlines falls to 0V and the signal READ and the word line and so on become 0V, then a programming verify read operation is completed.

CPWset1 to CPWset4 and Cell-p-well in FIG. 43 will be also explained later with reference to FIGS. 44A and 44B. After completing programming verify read operation, whether or not the data programming has completed (In other words, the threshold voltage of all the memory cells are positive and are programmed sufficiently is checked to be programmed "1" data), if programming is completed, the operation is terminated. If not completed, the programming pulse application is performed once again.

Next, operations of CPWset1 to CPWset4 and Cell-p-well will be explained with reference to FIGS. 44A and 44B. FIG. 44A shows the arrangement of the cell array row decoder circuit, the bitline control circuit and the well voltage control circuit and FIG. 44B shows the structural example of the well voltage control circuit. Usually, a row decoder circuit and a bitline control circuit are provided adjacent to the cell array but the well voltage control circuit is arranged apart from a cell array a little. Therefore, resistance R1 to R4 exist between the cell array and the well voltage control circuit.

While data programming operation (containing programming pulse application operation, programming verify read operation), the setting voltage of the p-type well is fixed to 0V (in other words, the output nodes CPWset1 to CPWset4 of the well voltage control circuit is 0V). However, in the influence of resistance R1 to R4, in case of charging/discharging of the bitline and the source line, by the capacitive coupling between the bitline and source line and the p-type well, three Cell-p-wells are wandered. The change of the voltage by the influence is shown in the Cell-p-well waveform of FIGS. 40, 41, and 43.

In the programming pulse application operation at the first loop of FIG. 40, Cell-p-well which is fixed to 0V before operation starting rises simultaneously with starting a charge of the bitline and the source line and at a time of the peak, it reaches in 10.8V. Thereafter, the Cell-p-well voltage lowers with the well voltage control circuit and when discharging by the bitline and source line, Cell-p-well becomes (about −0.5V) negative. At the programming pulse application operation of second loop or later in FIG. 41, since Cell-p-well is in about −0.5V at operation starting, the peak level after the bitline and the source line charging also becomes about 0.3V, and the end of the operation, Cell-p-well becomes negative again.

The programming verify read operation of FIG. 43, in case of operation starting, Cell-p-well is in about −0.5V. After operation starting, Cell-p-well rises at about 0V with the influence of the current of the well voltage control circuit and the charging of the bitline, but in case of operation ending, by the discharge from 0.5V to 0V in the "0" data programming bitline and the discharge of from Vcc to 0V in the "1" data programming bitline, Cell-p-well lowers about −0.5V, too. Therefore, as shown in the FIG. 41, at programming pulse application operation starting at second loop or later, Cell-p-well becomes about −0.5V.

Figure 4A:
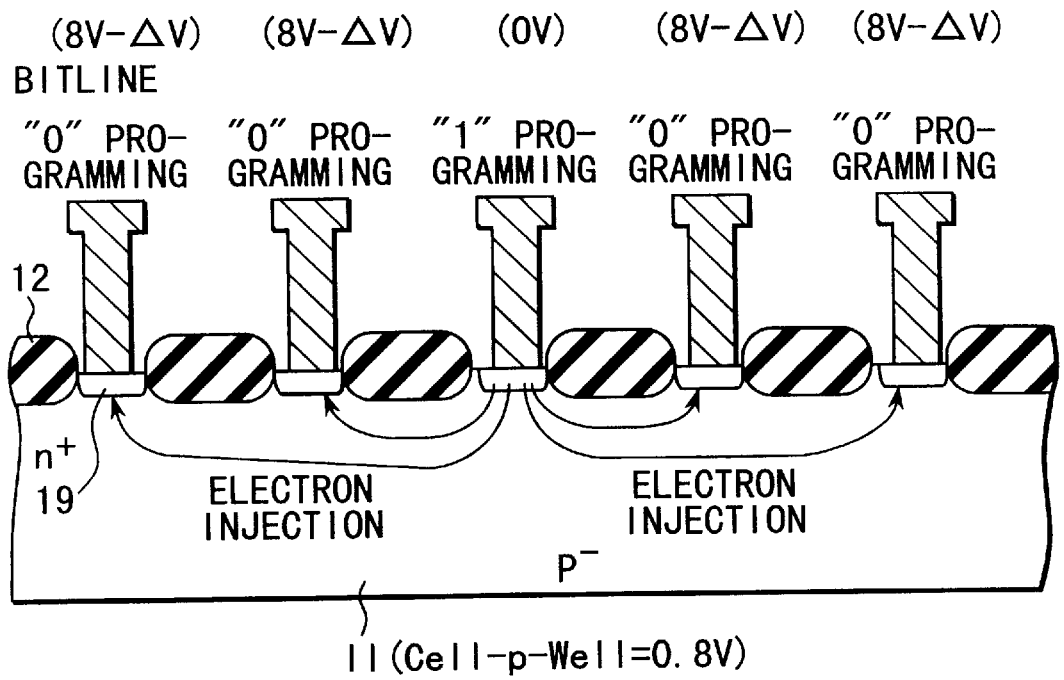
FIGS. 4A and 4B are figures for explaining a conventional disadvantage.

When the Cell-p-well voltage becomes about 0.8V (In case of programming pulse application operation at the first loop), a pn-junction composed of the bitline contact section of the "1" data programming bitline which is set to 0V (corresponding to 19 nodes in the left end in FIGS. 7A and 19 nodes in FIG. 4A), and the p-type well (11 nodes in FIGS. 7A and 4A) becomes a forward bias state. A great deal of electrons are injected from the bitline contact section into the p-type well (see FIG. 4A). Therefore, when a great deal of electrons flow into the "0" data programming bitline contact section, the bitline level falls to (8V−ΔV) from 8V.

Figure 4B:
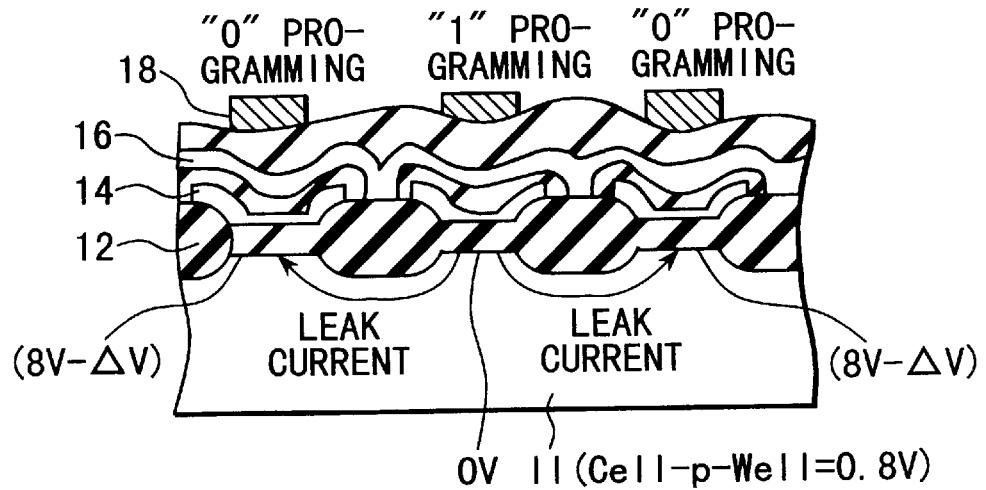

As a result, when applying to 20V to the selected word line during the programming pulse application operation at the first loop, the voltage difference between the word line and the source/drain of the "0" data programmed cell (cell which keeps a threshold voltage negative) increases from 20V−8V=12V to (12V+ΔV), then a disadvantage of the mis-programming (threshold voltage becomes positive) occurs. Since Cell-p-well is in 0.8V which is higher than in 0V of the setting voltage, the field inversion voltage in the cell array lowers, and the leak current (current flows among the channels of the common adjacent memory cell in which the word line is common) among the fields flows (see FIG. 4B). This the cause that the bitline level falls to (8V−ΔV) from 8V. The disadvantage of the mis-programming still occurs.

When the Cell-p-well voltage is about 0.3V (in case of second loop or later),the quantity of the electron injection very little compared with the 0.8V, and the leak current among the fields also lowers, then the bitline level lowers hardly from 8V. As a result, mis-programming does not occur. Therefore, the mis-programming at the first loop that Cell-p-well rises at about 0.8V is a very large disadvantage.

Figure 2:
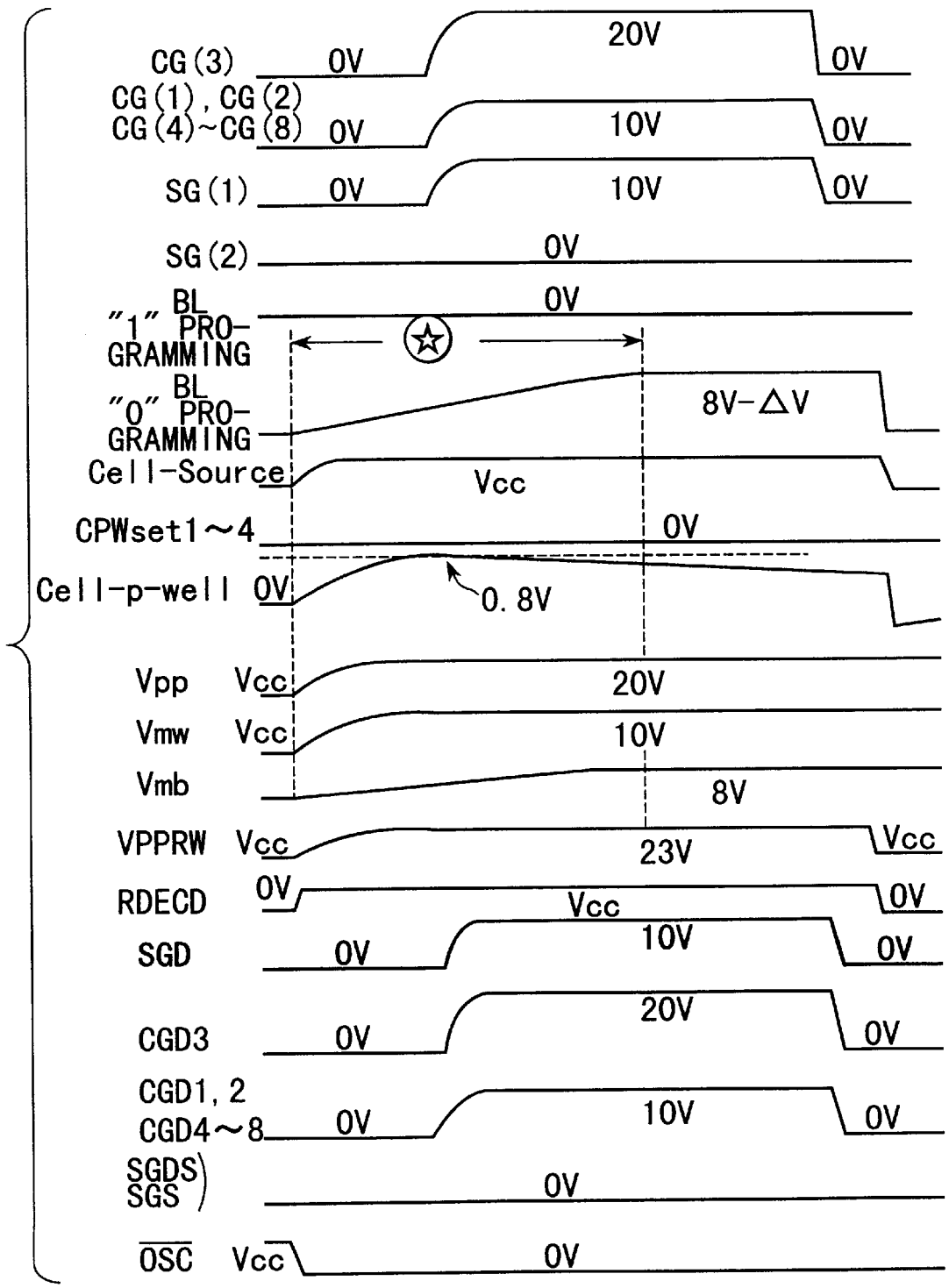
FIG. 2 is a timing chart showing a programming pulse application operation at a first loop according to the conventional art.
Figure 3:
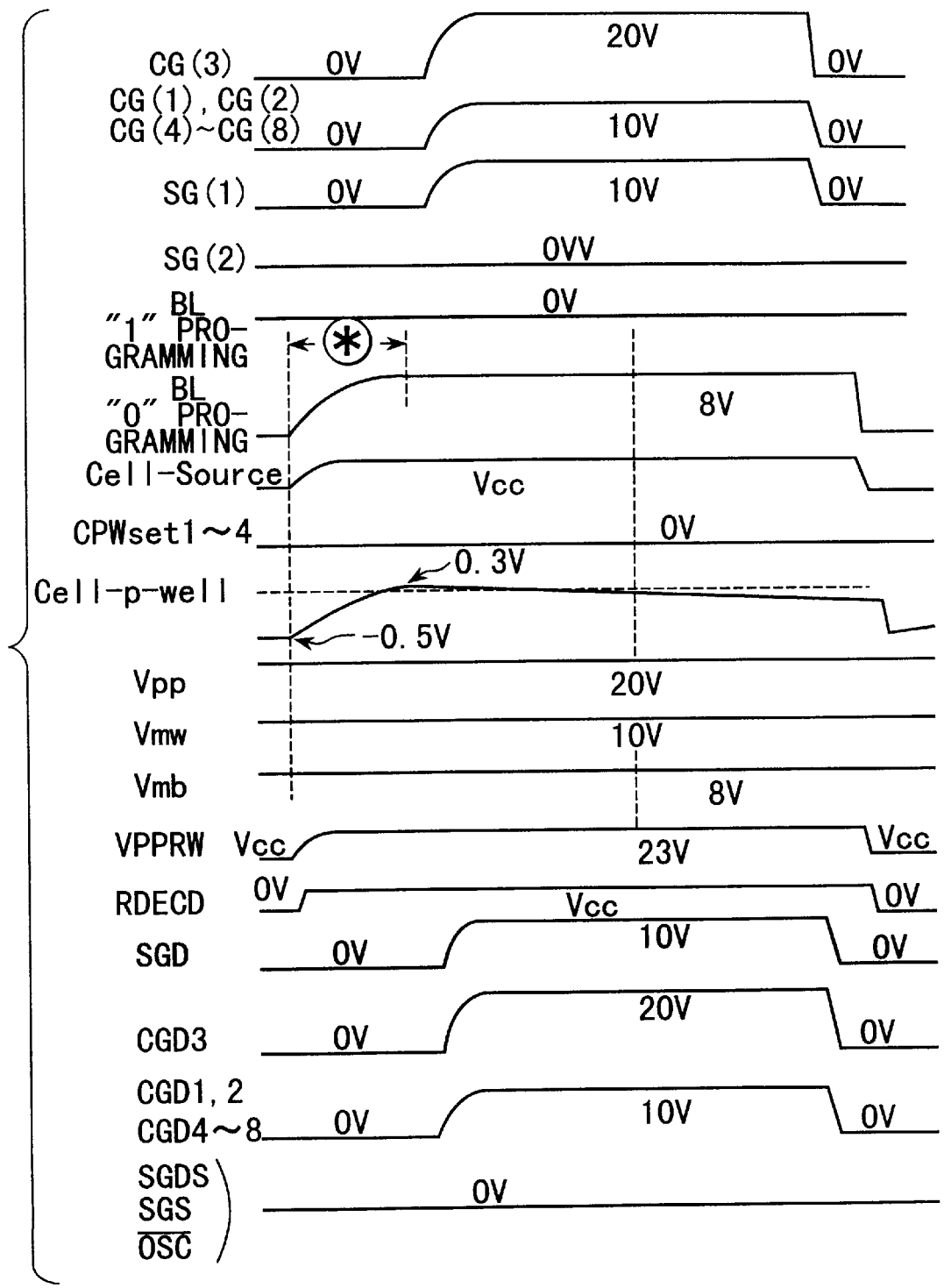
FIG. 3 is a timing chart showing a programming pulse application operation of a second loop or later according to the conventional art.

In the conventional art shown in FIGS. 2 and 3, since 20V is applied to the selected word line during programming pulse application operation at the first loop, the mis-programming at the first loop is a disadvantage. In the embodiment shown in FIG. 40, at the first loop, since 20V is not applied to the selected word line in the selected block and the word line is at about 0V, the mis-programming does not occur. At second loop or later, since Cell-p-well is equal to or less than 0.3V, it is no disadvantage even if data programming is performed by applying to 20V to the selected word line. Therefore, by using the above embodiment, the mis-programming at data programming can be prevented.

As apparent from FIGS. 40 and 41, the charging time of the "0" data programming bitline at the first loop becomes very long compared with of second loop or later. One of the reason is because electrons flow into the "0" data programming bitline by the leak current between the electron injection from the "1" data programming bitline to the p-type well and the field.

Also, another reason is as follows. The main load of 8V which is an intermediate voltage for programming includes a capacitor (corresponding to Cl-1 to Cl-n in FIG. 37) in the 8V generating circuit in addition to the "0" data programming bitline and VBITH. At operation starting at the first loop, since all of the "0" data programming bitlines, VBITH and the capacitors are Vcc or lower, it is necessary to charge all capacitance and therefore, the charging time becomes long (corresponding to (☆) in FIGS. 40 and 2).

When the data programming operation starts once, since the 8V generating circuit is in an on state until operation terminating, in case of second loop or later (FIG. 41), in addition to without the electron injection and a leak current between the field, the Vmb node is in 8V from the programming pulse application operation starting, therefore, the capacitor in the 8V generating circuit is in the charged state. Therefore, the load capacitance of the 8V charging lowers and therefore, the required time of the 8V charging to a bitline becomes short (corresponding to (*) in FIGS. 41 and 3).

In case of FIG. 2, since 10V, 20V chargings of the word line is performed at the first loop before the bitline charging is completed, in the period of (☆), and when the selected word line is at 20V, the level of the "0" data programming bitline is a level which is lower than (8V−ΔV). As a result, it is easy for the disadvantage of the above mis-programming to occur. On the other hand, since the high voltage is not applied to the word line at the first loop in case of FIG. 40 according to the embodiment, the disadvantage of the mis-programming does not occur. On the other hand, at second loop or later, since the 8V charging by the bitline has completed before the selected word line becomes 20V, the disadvantage of the mis-programming does not still occur.

Figure 45:
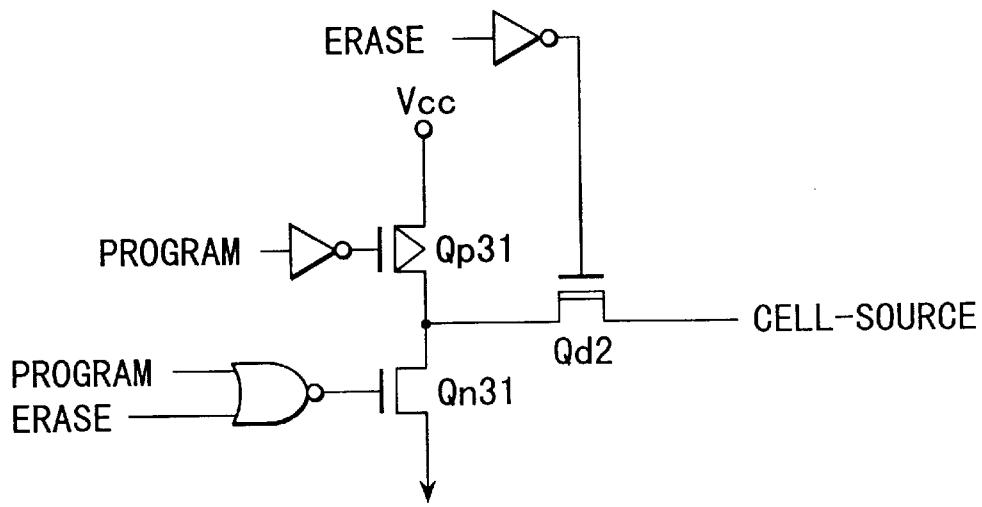
FIG. 45 shows a source line control circuit according to the ninth embodiment.

FIG. 45 shows a structural example of the source line control circuit. A p-channel MOS transistor Qp31 and an n-channel MOS transistor Qn31 are connected in series between Vcc and the ground. A signal PROGRAM is inputted to the gate of Qp31 through the inverter, and a signal PROGRAM and the output of the NOR gate inputting a signal ERASE are inputted to the gate of Qn31. Then, the output end of the inverter circuit which consists of Qp31 and Qn31 is connected to the source line through the MOS transistor Qd2 which inputs the signal ERASE through the inverter. To understood from FIG. 45, the source line voltage Cell-Source is fixed to Vcc during programming pulse application operation, and is fixed to 0V during a programming verify read operation.

Figure 46:
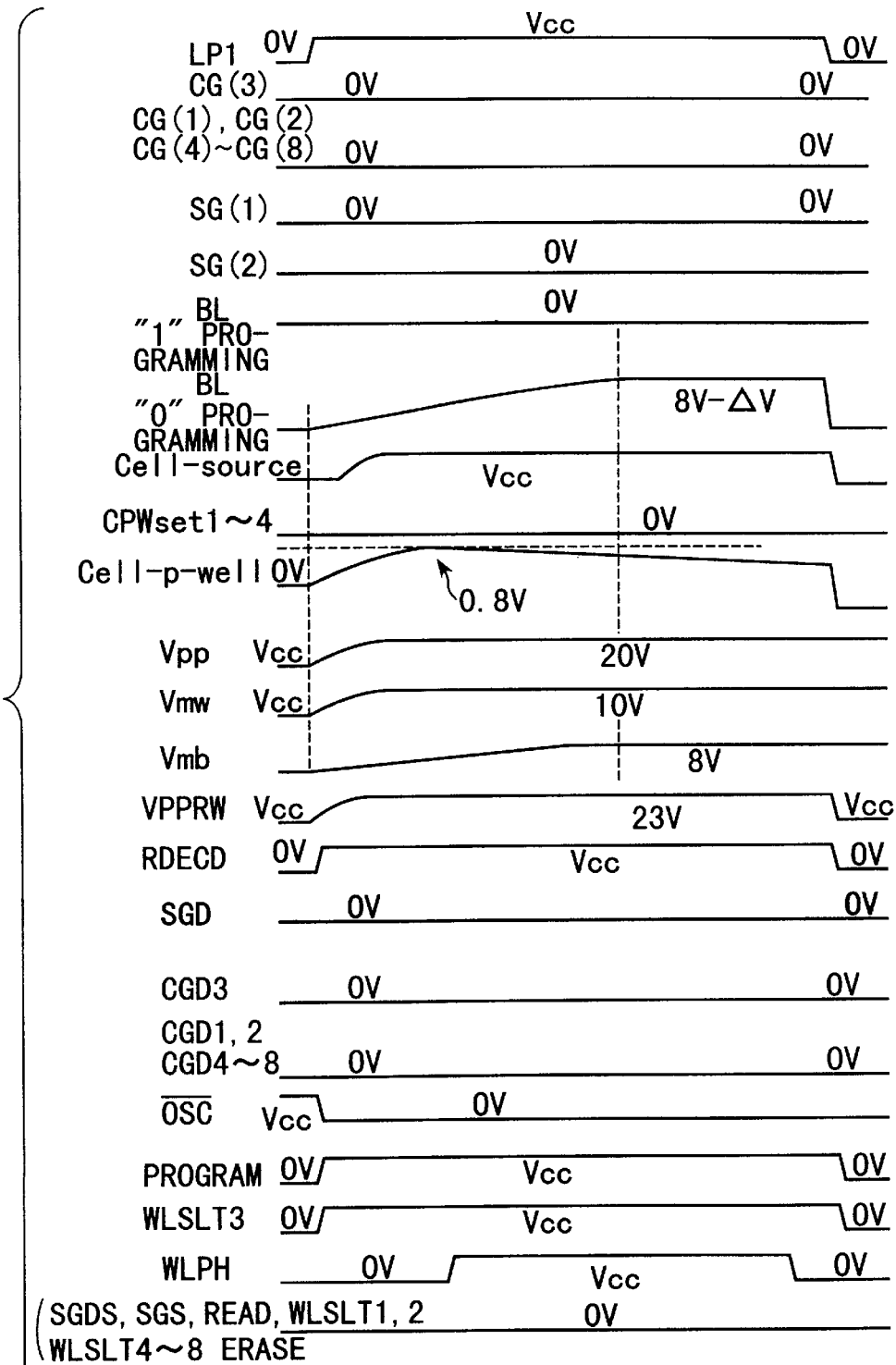
FIG. 46 shows a timing of the programming pulse application operation at a first loop according to the tenth embodiment.

FIG. 46 is a timing chart of the programming pulse application operation at the first loop according to tenth embodiment of the present invention.

In FIG. 40 in the ninth embodiment, the operation timing with reference to FIG. 35A as the word line control circuit is explained but the present invention is advantageous, for example, when using the circuit in which FIG. 35B is added to FIG. 35A. In this case, the programming pulse application operation at the first loop is shown in FIG. 46. The difference of FIG. 40 and FIG. 46 is that SGD, CGD1 to CGD8 are in the floating state (FIG. 40) during the period the signal WLPH is Vcc, or that they are fixed to 0V (FIG. 46). Therefore, in case of FIG. 46, SG(1), CG(1) to CG(8), also, become a fixed state of 0V. In this case, since high voltage is not applied to the word line, too, the mis-programming at the first loop can be prevented.

Figures 47A, 47B:
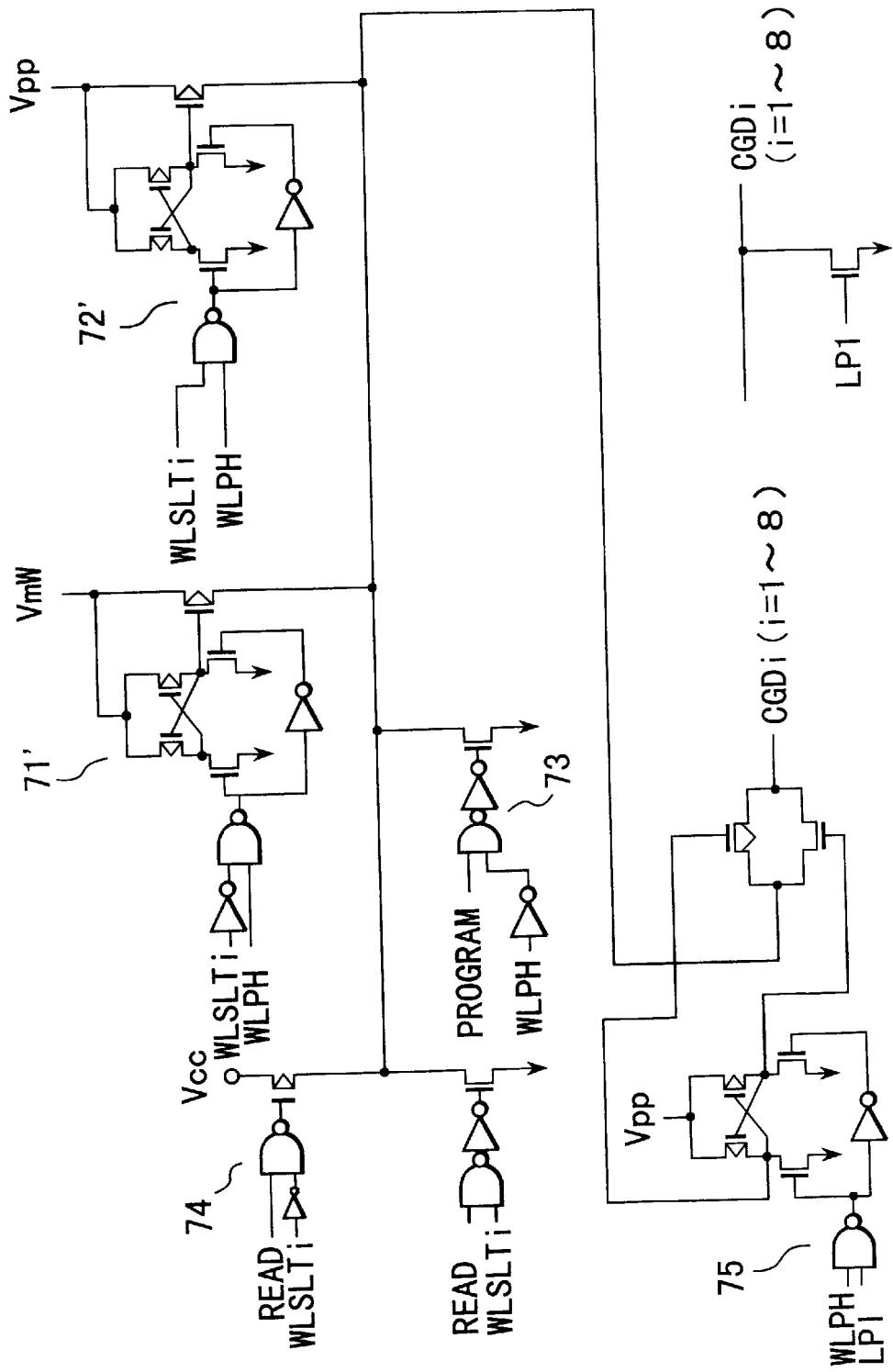
FIGS. 47A and 47B show another structural example of the word line control circuit according to the first and tenth embodiments.

In the ninth embodiment and tenth embodiment, the explanation of the present invention, for the example. in the case to realize the operation of FIG. 40, FIG. 46 with reference to FIGS. 35A and 35B as the word line control circuit, but the operation of FIG. 40, FIG. 46 can be realized even if using the circuit of FIGS. 47A and 47B respectively instead of FIGS. 35A and 35B. The circuit of FIGS. 47A and 47B omits the input of a signal LP1 in the circuit 71 which gives Vmw and the circuit 72 which gives Vpp in the circuit of FIGS. 35A and 35B, and the circuit 75 for turning on/off connection between the output stage and CGD by the input of signals WLPH, LPl are provided at the output stage of the circuit of FIGS. 35A and 35B.

Figures 48, 49:
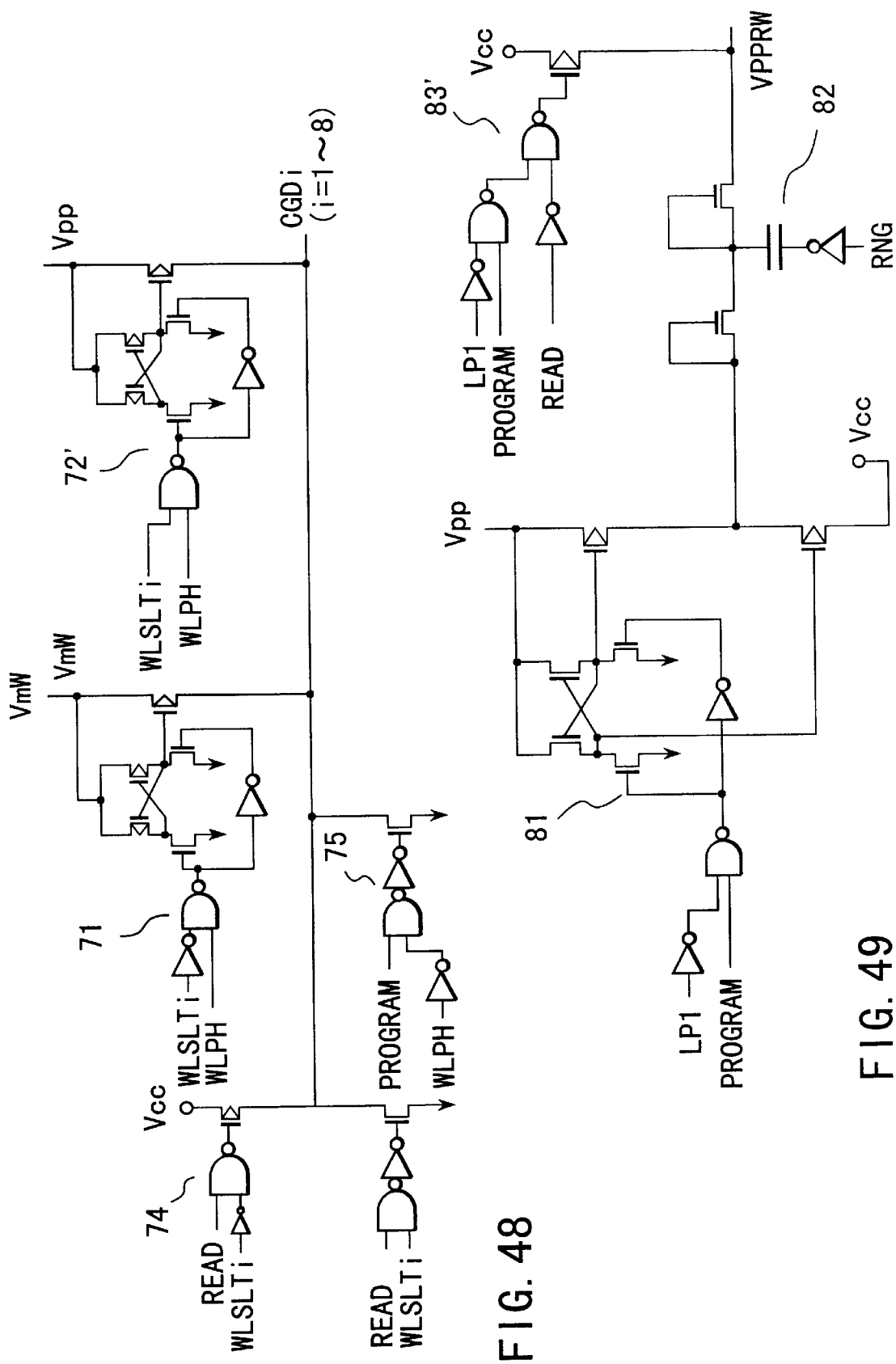
FIG. 48 shows a word line control circuit according to the eleventh embodiment.
FIG. 49 shows a row decoder power supply control circuit according to an eleventh embodiment.

FIGS. 48 and 49 are figures explaining eleventh embodiment of the present invention. FIG. 48 shows a word line control circuit, and FIG. 49 shows a row decoder power supply control circuit.

In this embodiment, as the row decoder power supply control circuit, a circuit of FIG. 49 is used instead of FIG. 36 and the same circuit as the conventional ones shown in FIG. 48 as the word line control circuit. In FIG. 49, circuit 83' which gives Vcc to VPPRW with signals PROGRAM, READ, LP1 is provided instead of the circuit 83 which gives Vcc to VPPRW with signals PROGRAM, READ in FIG. 36.

Figure 50:
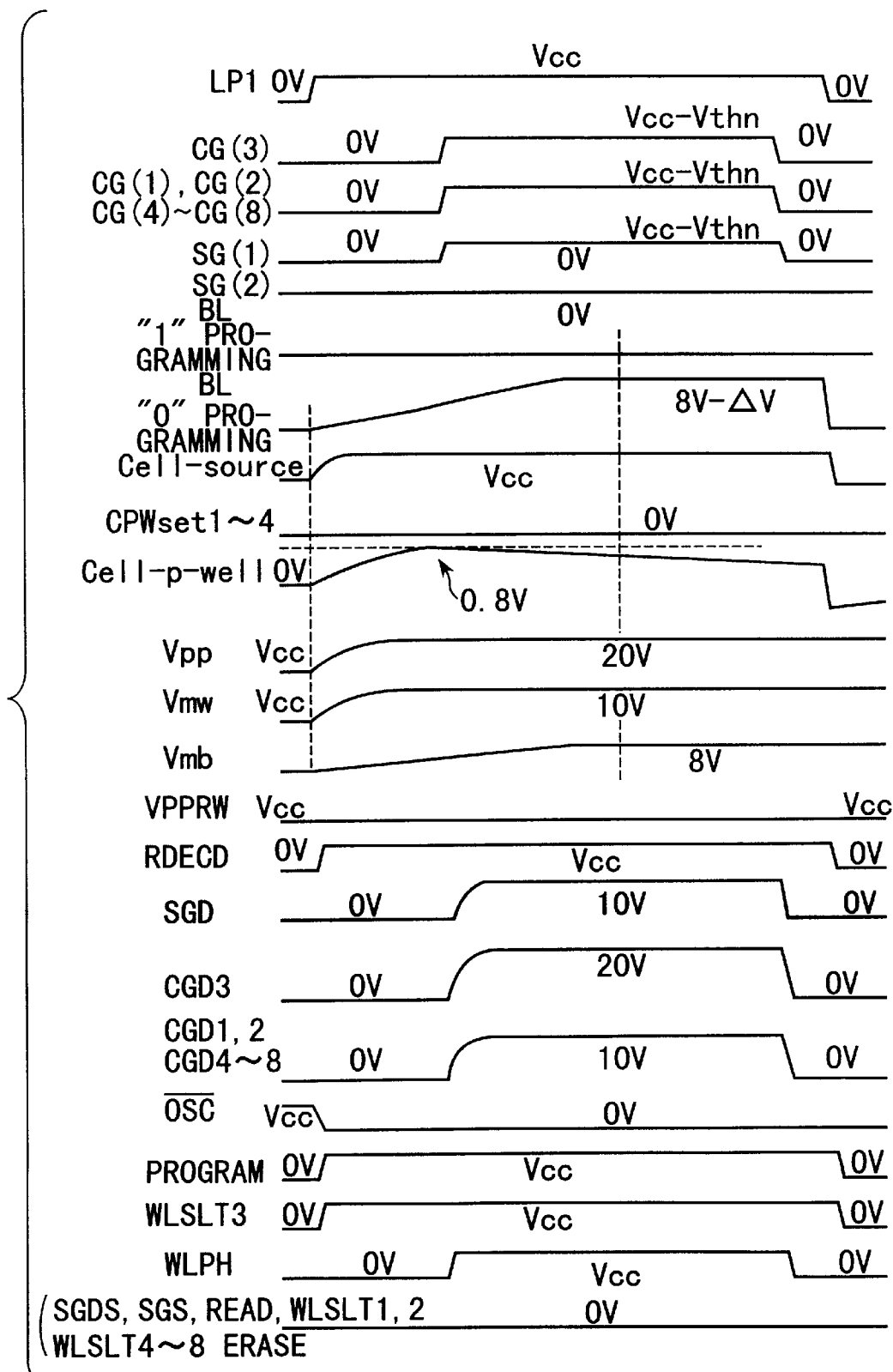
FIG. 50 shows a timing of the programming pulse application operation at a first loop according to the eleventh embodiment.

FIG. 50 shows a timing of the programming pulse application operation at the first loop according to the embodiment. In the method of FIG. 50, 10V and 20V output to the output node CGD1 to CGD8 of the word line control circuit at the first loop in addition to second loop. However, since VPPRW is only in the Vcc level, the gate voltage of the transistor which connects CGDi and CG(i), also, becomes Vcc at the first loop and only Vcc−Vthn (Vthn is the threshold voltage of the transistor which connects CGDi and CG(i) (see FIG. 33)) is transferred to word line CG(1) to CG(8).

In this case, even if the "0" data programming bitline voltage lowers from 8V at the first loop, since the gate voltage of the selected memory cell is (Vcc−Vthn). The voltage difference between the gate and the source/drain of the memory cell becomes much smaller than 10V, therefore the mis-programming does not occur (Usually, Vcc=3 to 5V). Therefore, the mis-programming at the first loop can be prevented. The mis-programming does not occur since the programming pulse application operation of second loop or later is the same as the operation of FIG. 41 and Cell-p-well is equal to or less than 0.3V.

Figure 51:
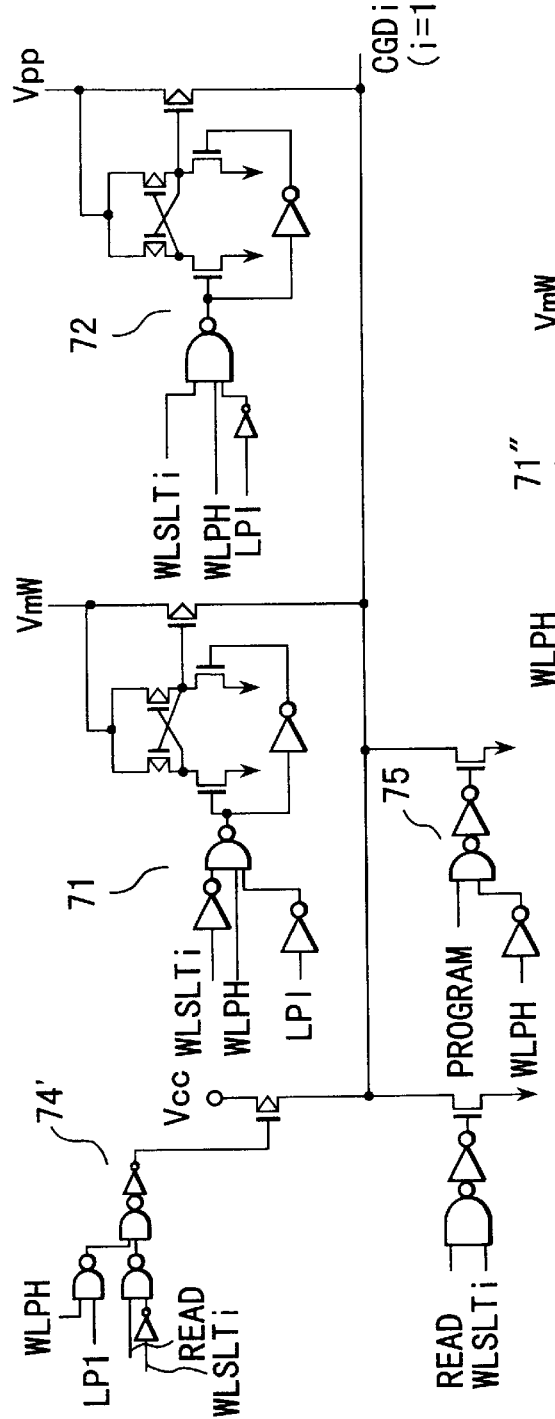
FIG. 51 shows a word line control circuit according to a twelfth embodiment.

FIG. 51 shows the word line control circuit according to twelfth embodiment of the present invention. In FIG. 51, signals LP1, WLPH are input to the circuit to give Vcc in the circuit 74 which gives Vcc or ground voltage to CGDi by signals READ, WLSLTi in FIGS. 35A and 35B in addition to signals READ, WLSLTi, and Vcc is output at the first loop. The row decoder power supply control circuit in this case is the same as FIG. 36.

Figure 52:
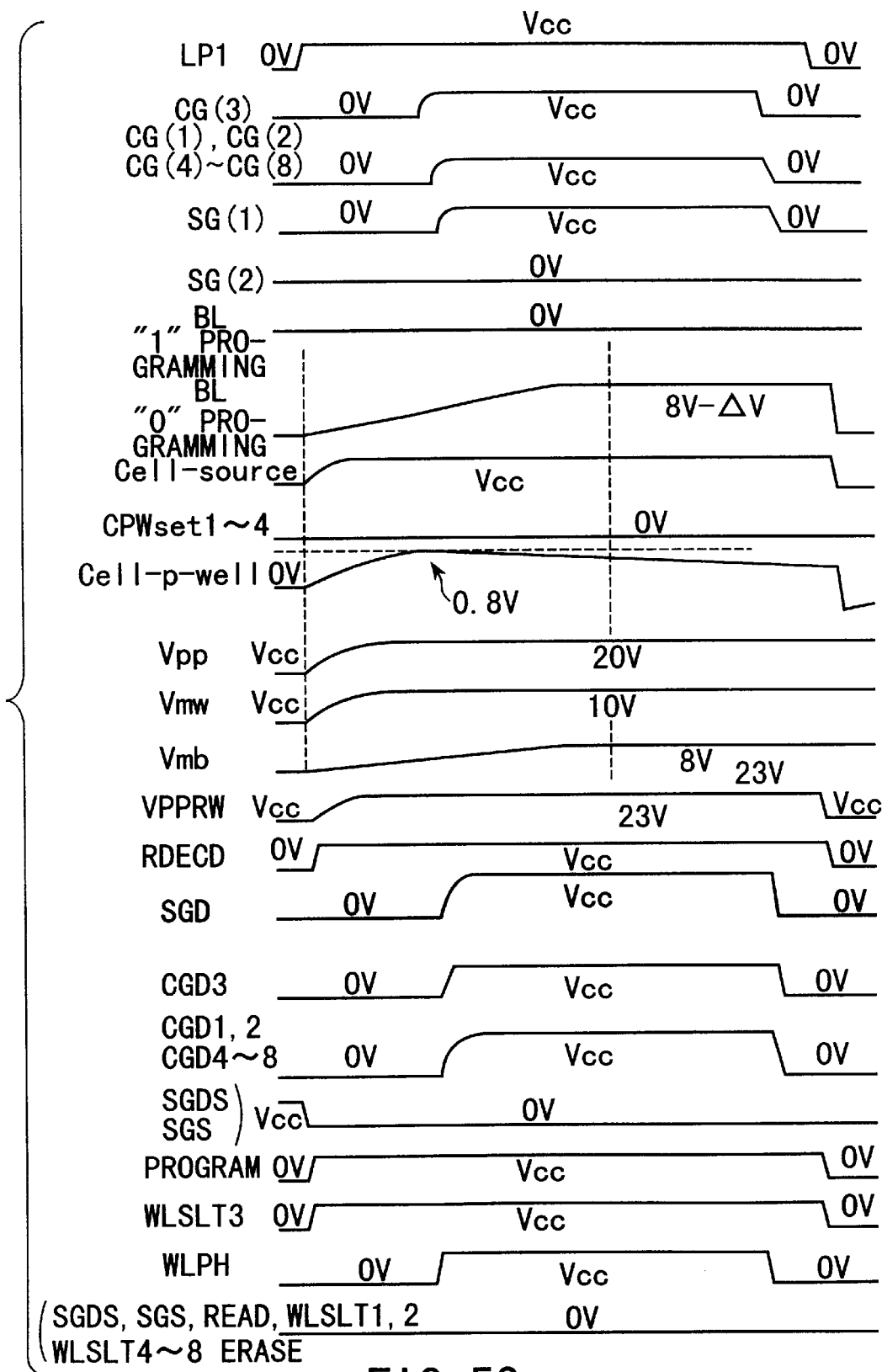
FIG. 52 shows a timing of the programming pulse application operation at a first loop according to the twelfth embodiment.

FIG. 52 shows a timing of the programming pulse application operation at the first loop according to the embodiment. In case of this method, at the first loop, CGD1 to CGD8 are at Vcc during the period which the signal WLPH is Vcc and the second loop or later (same operation FIG. 41), is charged at 10V and 20V. In this case, even if the "0" data programming bitline voltage lowers from 8V at the first loop, since the gate voltage of the selected memory cell is Vcc, the voltage difference between the gate and the source/drain of the memory cell becomes much smaller than 10V, the mis-programming does not occur.

Figure 53:
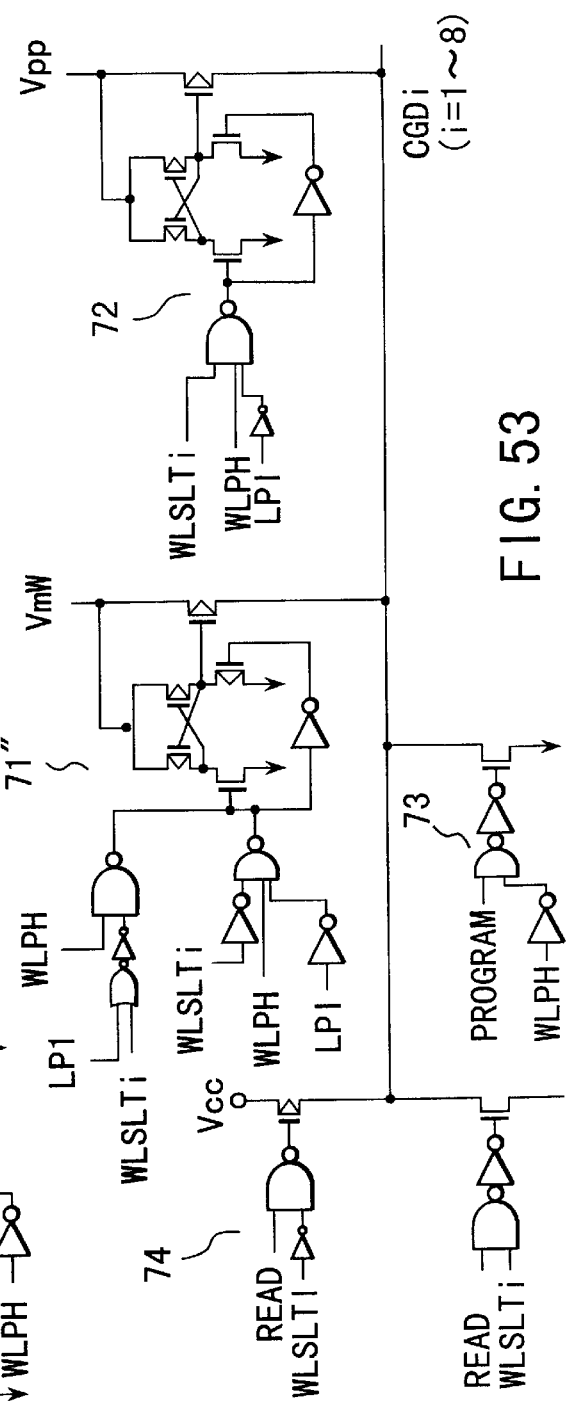
FIG. 53 shows a word line control circuit according to the thirteenth embodiment.

FIG. 53 shows the word line control circuit according to thirteenth embodiment of the present invention. FIG. 53 is a circuit improving a method of giving an input signal in the circuit 71 which gives Vmw to CGDi (i=1 to 8) with the signals WLSLTi, WLPH, LP1 of FIGS. 35A and 35B. The row decoder power supply control circuit in this case is the same as FIG. 36.

Figure 54:
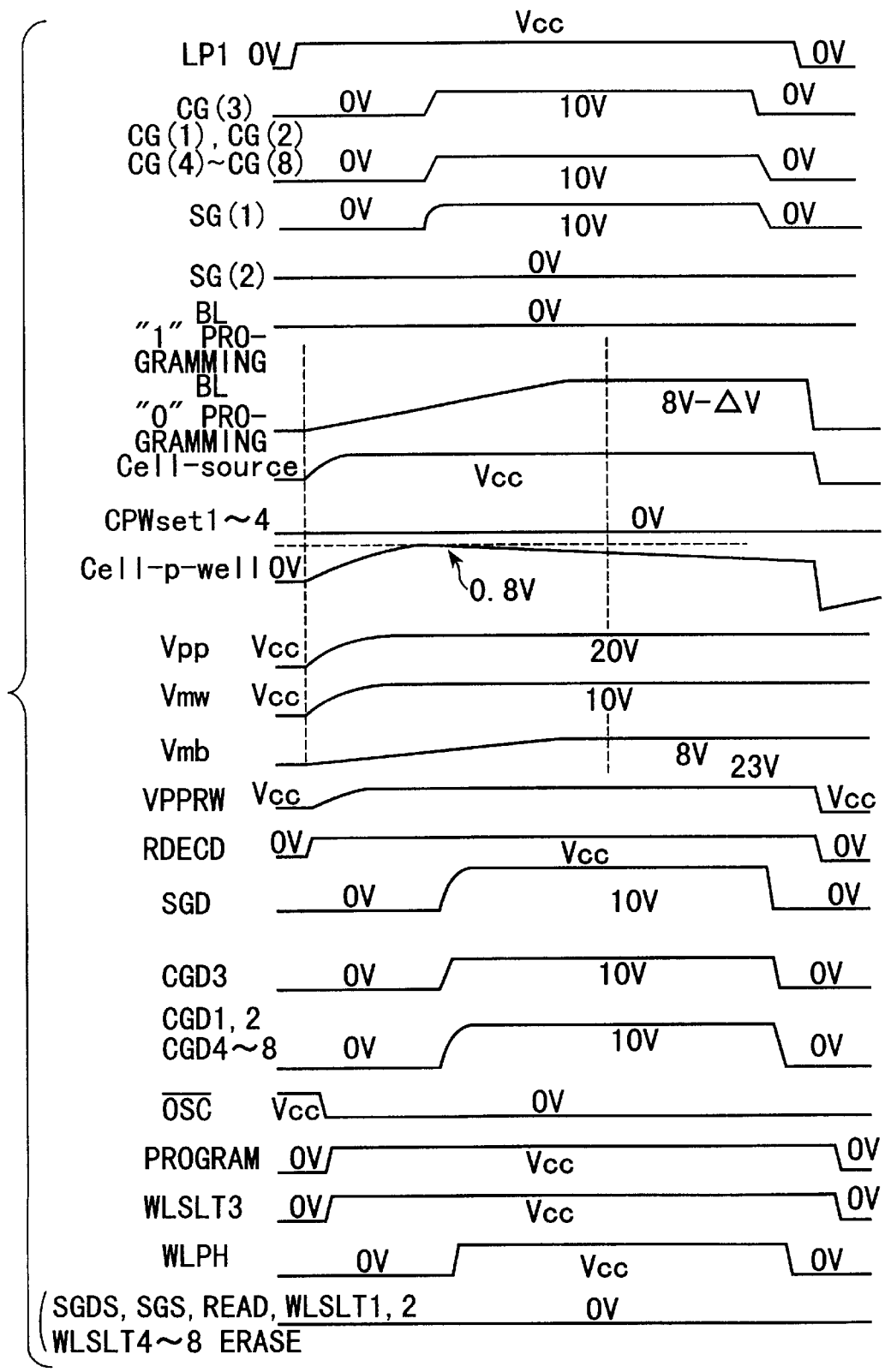
FIG. 54 shows a timing of the programming pulse application operation at a first loop according to the thirteenth embodiment.

FIG. 54 shows a timing of the programming pulse application operation at the first loop according to the embodiment. According to the method, at the first loop, all of CGD1 to CGD8 are about at 10V during the period when signal WLPH is Vcc. At second loop or later (same operation as FIG. 41), a selected word line is charged at 20V, an unselected word line in the selected block is charge at 10V. In this case, since the gate voltage of the selected memory cell is 10V even if the "0" data programming bitline voltage lowers from 8V, the voltage difference between the gate and the source/drain of the memory cell is small with less than 10V and the mis-programming does not occur at the first loop.

As described above, the feature of the present invention is to prevent mis-programming by giving the lower voltage at the first loop than at the second loop or later as the selected word line voltage during the programming pulse application operation at data programming operation. Usually, the selected word line voltage during programming pulse application operation at the first loop is a maximum voltage (10V in above embodiment) of unselected word line voltage (in above embodiment, 10V in the selected block, floating in the unselected block (usually, about 0V)) during data programming operation, is set to the level below the power supply voltage, more preferredly, the mis-programming can be avoided.

Figure 55:
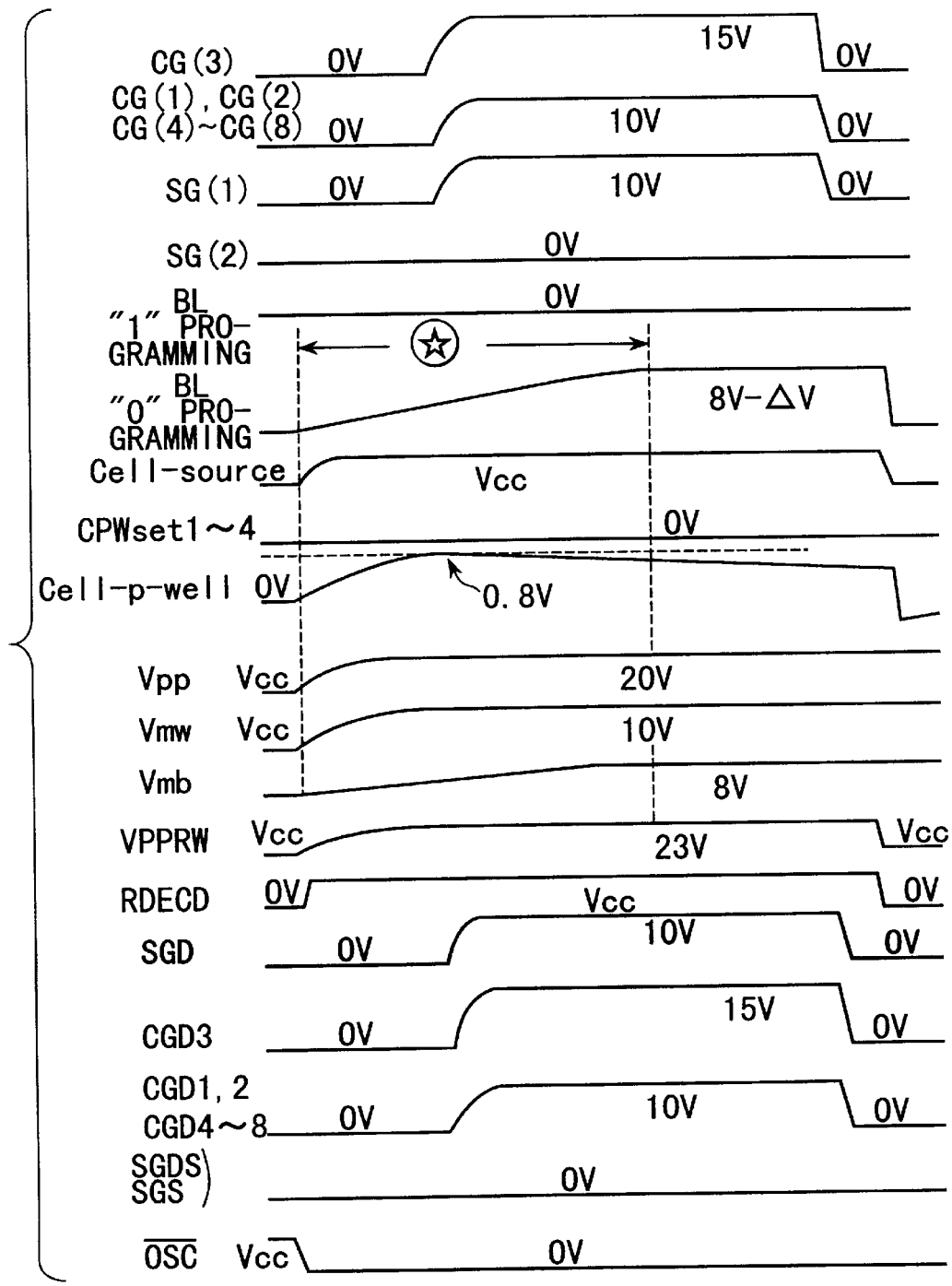
FIG. 55 shows a timing of the programming pulse application operation at a first loop according to the fourteenth embodiment.

However, the selected word line voltage is always not necessary to make lower to this voltage, for example, when using the operation shown in FIG. 55 as fourteenth embodiment for the programming pulse application operation at the first loop, even if a method of making the selected word line voltage in the selected block at 15V and only at the first loop making 20V at the second loop or later is used. The mis-programming margin can be largely improved by lowering the selected word line voltage at the first loop by 5V and the present invention is advantageous.

A waveform of selected word line voltage in each embodiment will be explained.

Figure 56A:
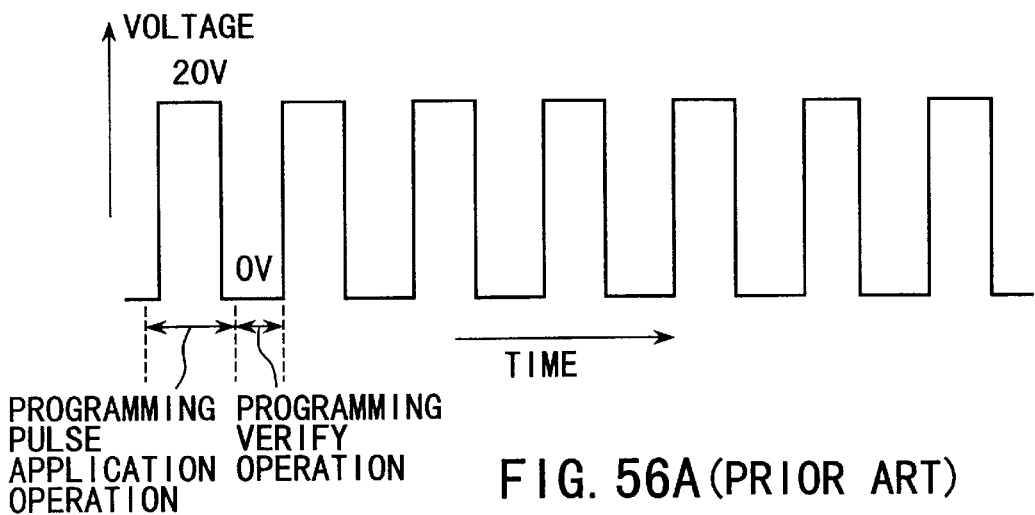
FIGS. 56A to 56N show the selected word line voltage waveform according to each embodiment at data programming operation.
Figure 56B:
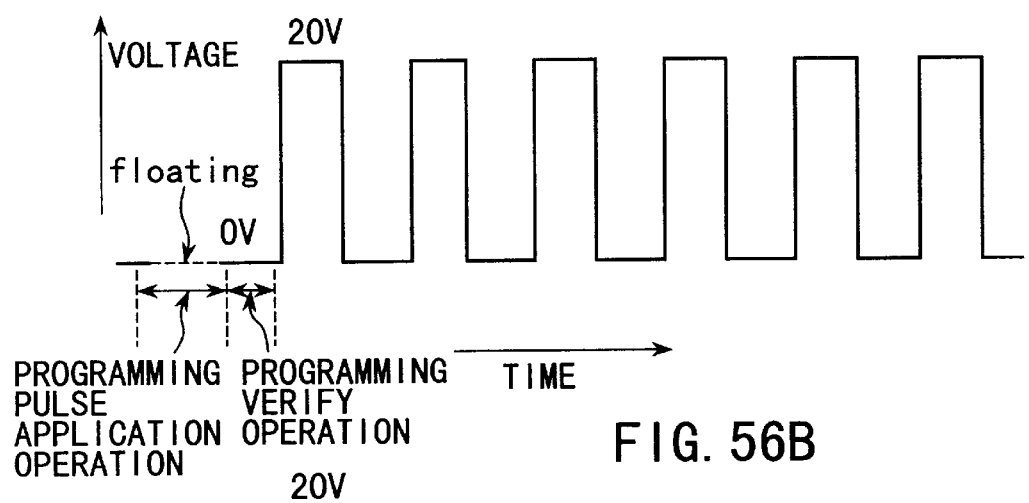
Figure 56C:
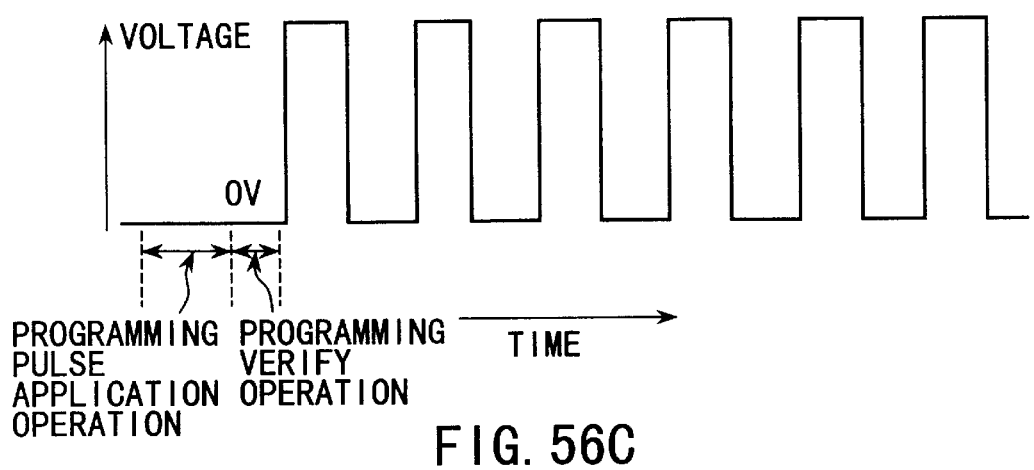
Figure 56D:
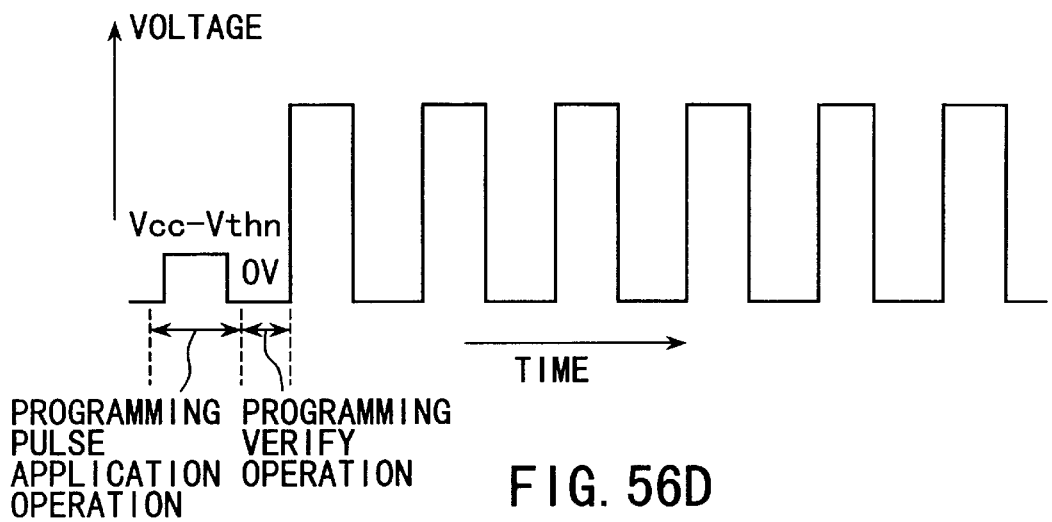
Figure 56E:
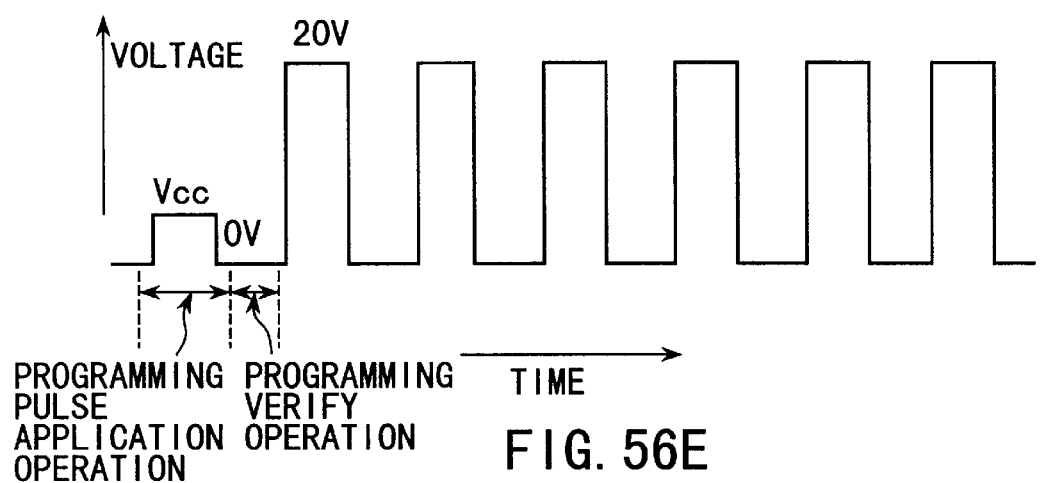
Figure 56F:
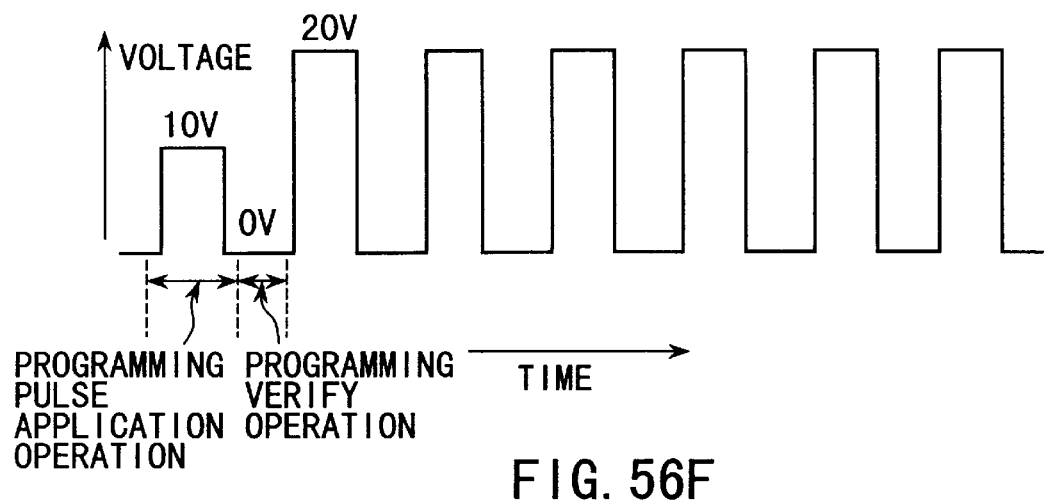

In each of the above embodiments, the present invention is explained by an example in which the voltage applied to the selected word line does not depend on the number of loops at programming pulse application operation and did the example the explanation of the present invention substantially constant (=20V). FIGS. 56A to 56N show the selected word line voltage waveform during data programming operation when using the above embodiment. FIG. 56A corresponds to the waveform when using a method in the conventional ones of FIGS. 2 and 3. Similarly, FIGS. 56B to 56F corresponds to the waveform when using the embodiments of FIGS. 40, 46, 50, 52, and 54, respectively.

Figure 56G:
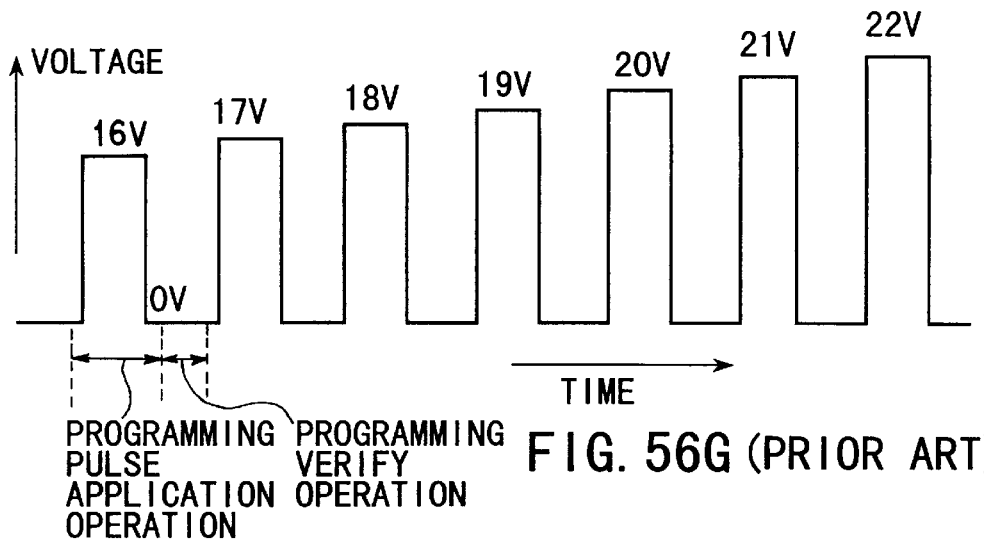
Figure 56H:
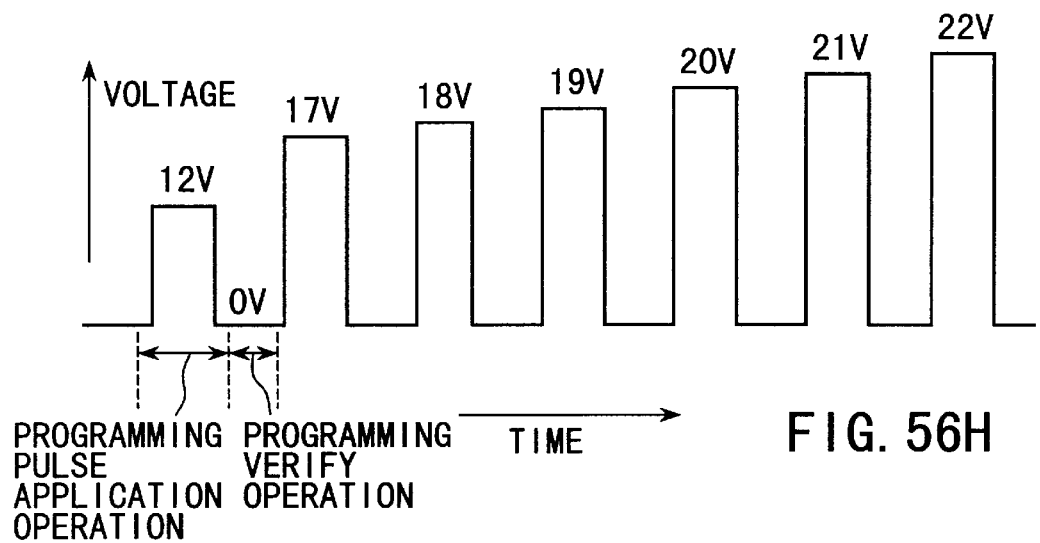
Figure 56I:
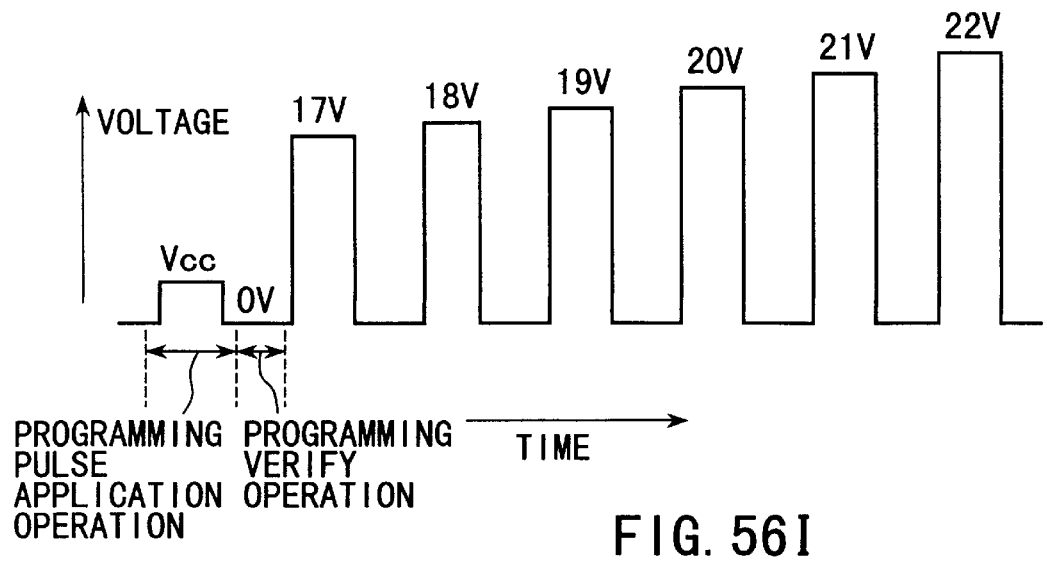
Figure 56J:
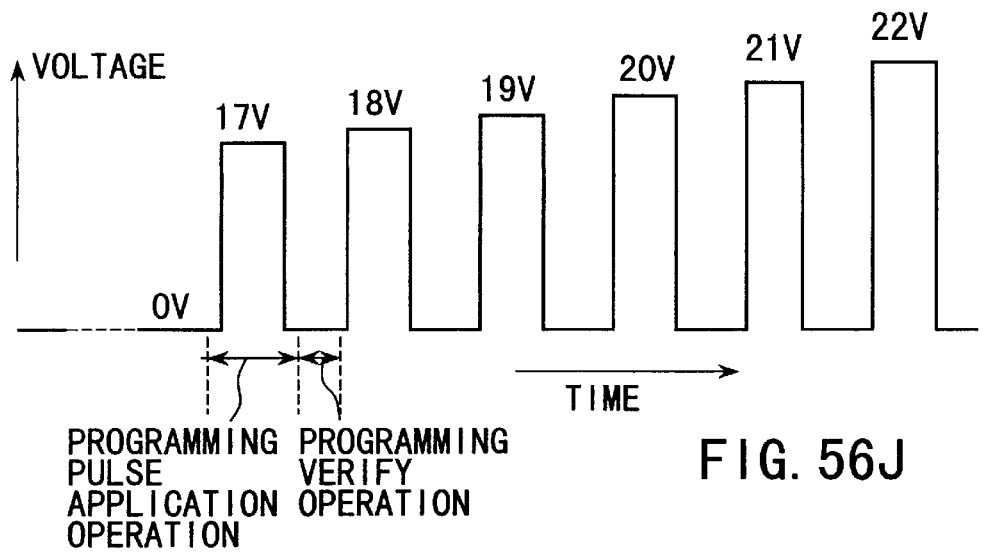

A method of increasing the selected word line voltage during the data programming operation with increasing the number of loops (programming voltage step-up method) is used in the conventional art in addition to the above conventional arts and the embodiments, and a waveforms FIG. 56G corresponds to the operation. The present invention can also be applied to this method, too, and FIGS. 56H, 56I, 56J are the examples like FIG. 56E, even if the increment of first to second loop large compared with increment (=1V) with voltage every loop of second loop or later, in other words, using the method which makes the selected word line voltage at the first loop especially low, difference of the gate and the source/drain voltage of the selected cell at the first loop can be small and the mis-programming can be prevented. FIG. 56I is an combination of a method of FIG. 52 and a programming voltage step up method and FIG. 56J is a combination of a method of FIG. 40 and a programming voltage step up method.

Even if a method except the above embodiment is used, the mis-programming at the first loop can be prevented. For example, as shown in FIG. 56M, a method of specially shortening high voltage application time to the selected word line at the first loop instead of lowering the selected word line voltage at the first loop. When using this method, by shortening the high voltage application time to the gate, even if the voltage difference between the gate and the source/drain of the selected memory cell becomes large at the first loop, the time of the large voltage difference can be extremely shortened. Therefore, a rise of the selected memory cell threshold voltage can be prevented and the mis-programming can be prevented.

Since by lowering the high-voltage charging speed at the first loop, a effective time of the high voltage application to the gate of the selected memory cell at the first loop largely as shown in FIG. 56N can be lowered, and the mis-programming can be prevented. FIGS. 57A and 57B show a structural example of the word line control circuit which realizes the method of lowering the high-voltage charging speed at the first loop. This circuit is a circuit juxtaposing an output circuit 76 which consists of an element with a large time constant in the output stage of the circuits shown in FIGS. 47A and 47B. The output circuit 76 in FIG. 5A is constructed by n transistors connected in series to obtain high resistance, but a resistance element can be used like FIG. 57B.

Figure 56K:
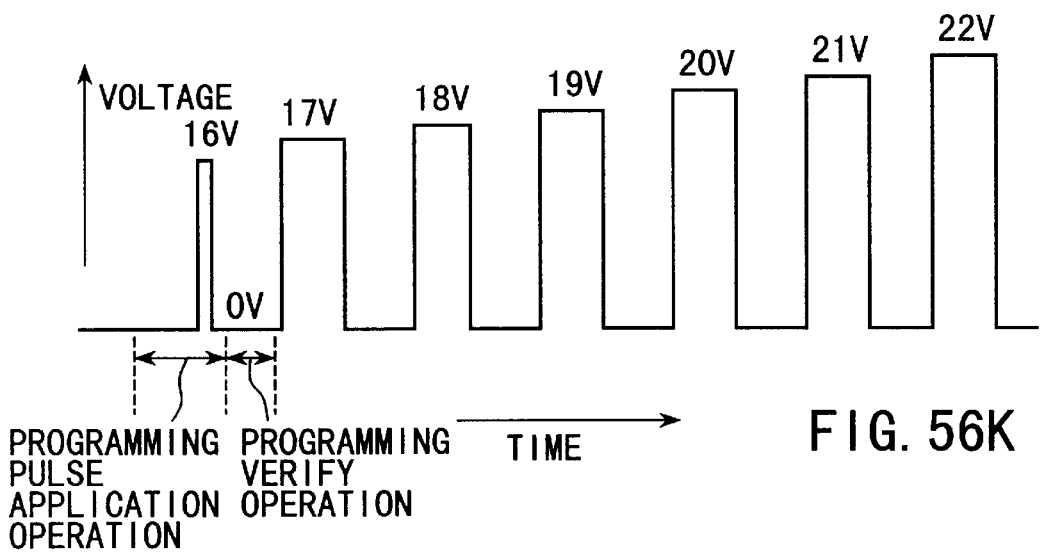
Figure 56L:
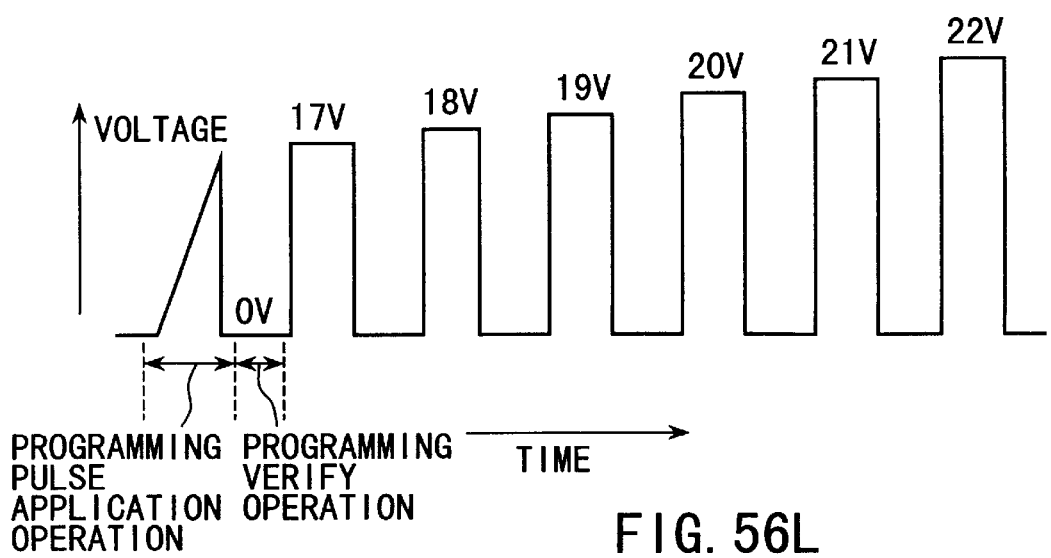
Figure 56M:
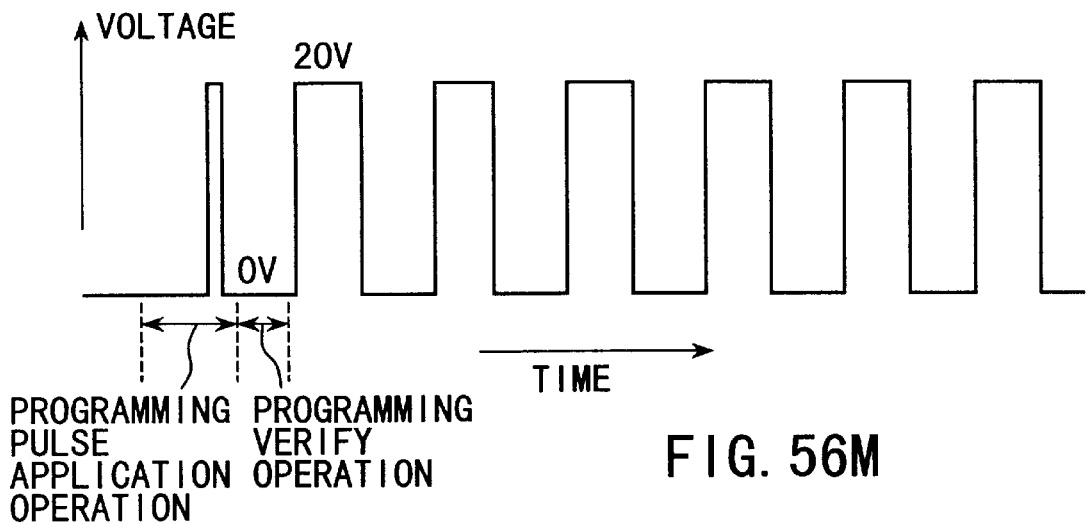
Figure 56N:
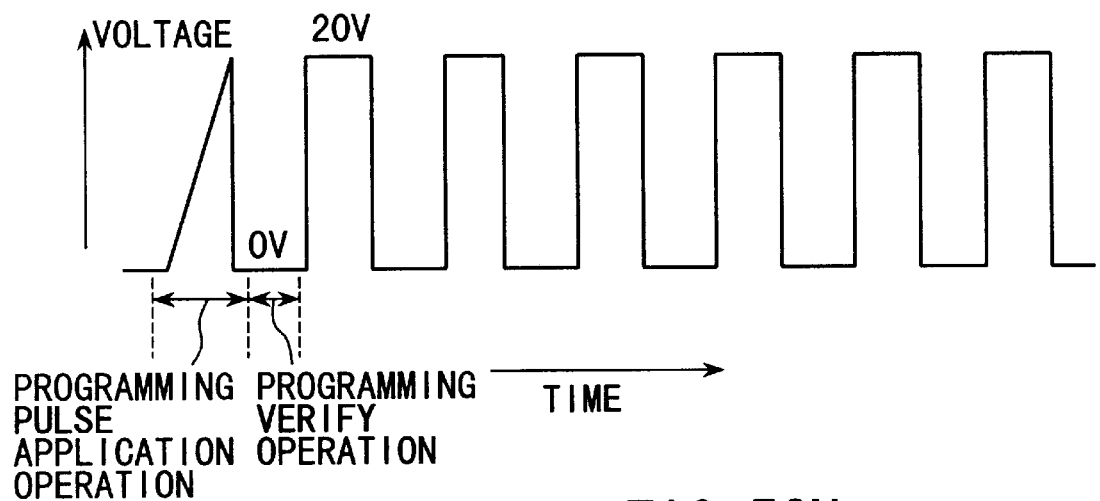
Figures 57A, 57B:
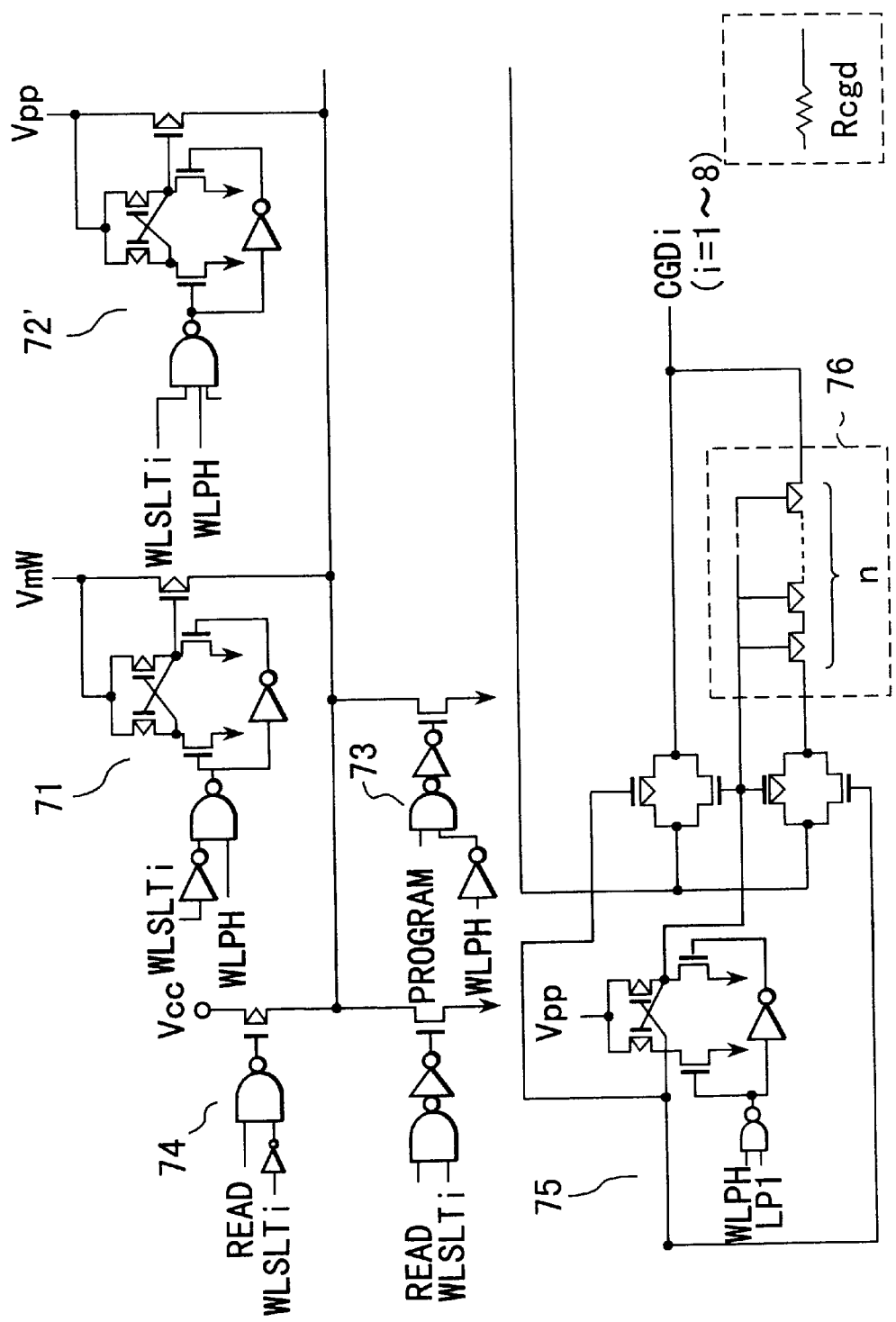
FIGS. 57A and 57B show the structural example of the word line control circuit which realizes the method of lowering the high-voltage charging speed at the first loop.

A method of combining FIGS. 56M, 56N and a programming voltage step up method, i.e., a method using FIG. 56K, FIG. 56L are also advantageous.

The present invention is not limited to each above mentioned embodiment. An explanation is made in the case the present invention is applied to the data programming operation in the embodiments, but the present invention can be applied to, for example, the data erase operation, too.

In the embodiments, a case that the number of the memory cells which are connected in series in one NAND cell is eight is explained, the present invention can be applied to a case that the number of the memory cells connected in series is not eight, e.g., 2, 4, 16, 32, 64 and so on, too. An explanation is made by NAND cell type EEPROM as an example in the embodiment, the present invention can be applied to the other devices, for example, cell type EEPROM (see FIG. 28), NOR cell type EEPROM with the select transistor (see FIG. 29), DINOR cell type EEPROM (see FIG. 30), and AND cell type EEPROM (see FIG. 31), and so on.

In the embodiments, an explanation is made to the electrically programmable and erasable nonvolatile semiconductor memory device, the present invention can be applied to the other device, e.g., the device of the other semiconductor memory devices such as EPROM.

In short, the present invention is applicable to various modifications which does not change a view point.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory device comprising:

a memory cell array in which memory cell units having one or more reprogrammable nonvolatile memory cells are arranged in an array;

a word line commonly connected to a same row of said one or more memory cells of said memory cell array;

a data line commonly connected to a same column of said memory cell units of said memory cell array;

a sequence control circuit for controlling a sequence operation which reprogram data of one or more selected memory cells by a first operation for applying a first voltage to reprogram data of said selected memory cells, and a second operation for verifying reprogrammed state of data to said selected memory cells to which said first voltage is applied;

a voltage application circuit for applying said first voltage higher than a power supply voltage to a selected word line corresponding to a memory cell to be data reprogrammed in a first period which corresponds to at least partial period during a period of said first operation; and high voltage generating circuit for generating said first voltage which is supplied to an output node of said high voltage generating circuit and applied to said selected word line by connecting said output node to said selected word line, wherein both in said first period and in said second period corresponding to at least a part in periods which exclude said first period during said sequence operation, said high voltage generating circuit supplies said first voltage higher than a power supply voltage to said output node, and in a second period, said output node is not connected to said word line, and a setting voltage of a voltage level of said first voltage which is equal to a voltage level of said output node is set to a voltage different from a setting voltage of a voltage level in said first period.

2. A nonvolatile semiconductor memory device of claim 1, said setting voltage of a voltage level of said first voltage in said second period is set lower than said setting voltage of a voltage level thereof in said first period.

3. A nonvolatile semiconductor memory device of claim 1, wherein said sequence control means reprograms data of the selected memory cell by alternately repeating said first operation and said second operation.

4. A nonvolatile semiconductor memory device of claim 2, wherein said sequence control means reprograms data of the selected memory cell by alternately repeating said first operation and said second operation.

5. A nonvolatile semiconductor memory device of any one of claims 1 to 4 wherein said second period includes a period of said second operation.

6. A nonvolatile semiconductor memory device of any one of claims 1 to 4 wherein said second period is a period excluding said first period during said sequence operation.

7. A nonvolatile semiconductor memory device of any one of claims 1 to 4 wherein during said sequence operation which repeats said first operation and said second operation, a voltage level of said first voltage in said first period becomes higher with an increase of repeating times of said first operation, and said setting voltage of said voltage level of said first voltage in said first period is set to a higher voltage than said setting voltage of said voltage level of said first voltage in said second period at second loop or later.

8. A nonvolatile semiconductor memory device of claim 7, wherein said setting voltage of said voltage level of said first voltage in said first period of first loop is the same as said setting voltage of said voltage level of said first voltage in a second period of a first loop in said sequence operation.

9. A nonvolatile semiconductor memory device of any one of claims 1 to 4 wherein said setting voltage of said voltage level of said first voltage in said first period of a first loop in said sequence operation is set to a higher voltage than said setting voltage of said voltage level of said first voltage in said second period at a first loop.

10. A nonvolatile semiconductor memory device of claim 7, wherein said setting voltage of said voltage level of said first voltage in said first period of a first loop in said sequence operation is set to a higher voltage than said setting voltage of said voltage level of said first voltage in said second period at a first loop.

11. A nonvolatile semiconductor memory device of any one of claims 1 to 4, wherein said setting voltage of said voltage level of said first voltage in said second period becomes higher with increase of repeating times of said first operation.

12. A nonvolatile semiconductor memory device of claim 7, wherein said setting voltage of said voltage level of said first voltage in said second period becomes higher with increase of repeating times of said first operation.

13. A nonvolatile semiconductor memory device of any one of claims 1 to 4 wherein said first period is substantially constant and does not depend on the number of times of said first operation.

14. A nonvolatile semiconductor memory device of any one of claims 1 to 4 wherein said first period becomes long with an increase of repeating times of said first operation.

15. A nonvolatile semiconductor memory device of any one of claims 1 to 4 wherein said high voltage generating circuit includes and voltage level setting circuit, and, said booster circuit for obtaining a high voltage by boosting power supply voltage and said voltage level setting circuit connected to an output end of said booster circuit for limiting an output voltage of said booster circuit to the optional voltage according to an input control signal.

16. A nonvolatile semiconductor memory device of claim 15, wherein said voltage level setting circuit comprises a voltage generating circuit section and a voltage comparing circuit section, and said voltage generating circuit section comprises a plurality of resistors for voltage division connected in series between an output node and a reference voltage of said booster circuit, and a plurality of MOS switching elements, in which each one end is connected to the connected point of the at least part of resistors in said plurality of resistors for voltage division are controlled by different input control signals, respectively, and a setting voltage of said first voltage level is controlled by said control signal input.

17. A nonvolatile semiconductor memory device of claim 16, wherein said voltage comparing circuit section comprises a differential amplification circuit for inputting a voltage generated at said voltage generating circuit section to the gate of one transistor in driving MOS transistors constituting a differential pair and from inputting a reference voltage to a gate of another MOS transistor.

18. A nonvolatile semiconductor memory device of claim 16, wherein, a timing of the input control signal of said voltage generating circuit section is controlled by said sequence control means.

19. A nonvolatile semiconductor memory device of claim 17, wherein, a timing of the input control signal of said voltage generating circuit section is controlled by said sequence control means.

20. A nonvolatile semiconductor memory device of any one of claims 1 to 4 wherein said memory cell unit is a NAND-type cell formed by a plurality of memory cells connected in series.

21. A nonvolatile semiconductor memory device comprising:
a memory cell array in which a plurality of nonvolatile memory cells or memory cell units in which the plurality of memory cells are connected, said memory cell array being arranged in an array; and
a word line select circuit for selecting a word line in the memory cell array, wherein
data reprogramming is performed by repeatedly performing loops each having a first operation and a second operation,
a selected word line to which the selected memory cell is connected, is maintained to a floating state in a predetermined period in said first operation at a first loop and is applied to a first voltage for reprogrammed in said first operation at a second loop or later, and
a reprogrammed state of the selected memory cell is checked in said second operation at first loop or later.

22. A nonvolatile semiconductor memory device comprising:
a memory cell array in which a plurality of nonvolatile memory cells or memory cell units in which the plurality of memory cells are connected, said memory cell array being arranged in an array; and
a word line select circuit for selecting a word line in the memory cell array, wherein
data reprogramming is performed by repeatedly performing loops each having a first operation for applying a first voltage for reprogrammed data to a selected word line connected to a selected memory cell and a second operation for checking a reprogrammed state of the selected memory cell, and
as variations of said first voltage for every loop in the data reprogramming operation, a variation thereof from loop to second loop is larger than variations from Nth loop to (N+1)th loop, where N is natural number and N≧2.

23. A nonvolatile semiconductor memory device according to claim 21, wherein
said first voltage is substantially constant in said first operation of a second loop or later in the data reprogramming operation, and
said first voltage to the word line of the selected memory cell in said first operation at a first loop is set to lower than said first voltage in said first operation of the second loop or later.

24. A nonvolatile semiconductor memory device according to claim 21, wherein said first voltage to the word line of the selected memory cell increases with an increase of the number of loops in said first operation in the data reprogramming operation, and an increment from a first loop to a second loop is largest in the increments of the applied voltage for every loops.

25. A nonvolatile semiconductor memory device comprising:
a memory cell array in which a plurality of nonvolatile memory cells or memory cell units in which the plurality of memory cells are connected, said memory cell array being arranged in an array; and
a word line select circuit for selecting a word line in the memory cell array, wherein
data reprogramming is performed by repeatedly performing loops each having a first operation for applying a first voltage for reprogrammed data to a selected word line connected to a selected memory cell and a second operation for checking a reprogrammed state of the selected memory cell, and
a time for applying said first voltage to the word line of said selected memory cell is substantially constant in said first operation of a second loop or later in said data reprogramming operation, and a time for applying said first voltage to the word line of said selected memory cell in said first operation of a first loop is set to shorter than in said first operation of the second loop or later.

26. A nonvolatile semiconductor memory device comprising:
a memory cell array in which a plurality of nonvolatile memory cells or memory cell units in which the plurality of memory cells are connected, said memory cell array being arranged in an array; and
a word line select circuit for selecting a word line in the memory cell array, wherein
data reprogramming is performed by repeatedly performing loops each having a first operation for applying a first voltage for reprogrammed data to a selected word line connected to a selected memory cell and a second operation for checking a reprogrammed state of the selected memory cell, and
a charging speed of said first to the word line of said selected memory cell is substantially constant in said first operation in second loop or later in said data reprogramming operation, and a charging speed in first loop is set to slower than in said second loop or later.

27. A nonvolatile semiconductor memory device of any one of claims 21 to 26, wherein said first voltage applied to the word line of said selected memory cell in the first operation at said first loop is the same or lower than a voltage level of a maximum voltage of word line of unselected memory cell in said first operation in the data reprogramming operation.

28. A nonvolatile semiconductor memory device of any one of claims 21 to 26, wherein said first voltage applied to the word line of said selected memory cell in said first operation of a first loop is the same or lower than a voltage level of the power supply voltage in the data reprogramming operation.

29. A nonvolatile semiconductor memory device of any one of claims 21 to 26, wherein said memory cell unit is a NAND-type cell formed by a plurality of memory cells connected in series.

* * * * *